(12) United States Patent
Ooishi

(10) Patent No.: US 6,349,065 B1
(45) Date of Patent: *Feb. 19, 2002

(54) SEMICONDUCTOR MEMORY DEVICE ALLOWING ACCELERATION TESTING, AND A SEMI-FINISHED PRODUCT FOR AN INTEGRATED SEMICONDUCTOR DEVICE THAT ALLOWS ACCELERATION TESTING

(75) Inventor: Tsukasa Ooishi, Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/300,853

(22) Filed: Apr. 28, 1999

Related U.S. Application Data

(60) Continuation of application No. 08/937,188, filed on Sep. 25, 1997, now Pat. No. 5,953,271, which is a division of application No. 08/601,750, filed on Feb. 15, 1996, now Pat. No. 5,706,233.

(30) Foreign Application Priority Data

Jun. 27, 1995 (JP) .............................................. 7-160394

(51) Int. Cl.$^7$ ................................................. G11C 7/00
(52) U.S. Cl. .................... 365/201; 365/189.02; 365/149
(58) Field of Search ................................ 365/201, 203, 365/230.06, 149, 189.02, 189.11

(56) References Cited

U.S. PATENT DOCUMENTS

| | | | |
|---|---|---|---|
| 4,703,436 A | 10/1987 | Varshney | 365/201 |
| 5,047,983 A | 9/1991 | Iwai et al. | 365/200 |
| 5,233,565 A | 8/1993 | Wang | 365/230.06 |
| 5,258,954 A | * 11/1993 | Furuyama | 365/201 |
| 5,265,057 A | * 11/1993 | Furuyama et al. | 365/230.06 |
| 5,270,980 A | 12/1993 | Pathak et al. | 365/185.12 |
| 5,287,312 A | * 2/1994 | Okamura et al. | 365/201 |
| 5,289,429 A | 2/1994 | Watanabe | 365/230.06 |
| 5,293,340 A | * 3/1994 | Fujita | 365/230.06 |
| 5,294,776 A | 3/1994 | Furuyama | 365/201 |
| 5,303,193 A | * 4/1994 | Ogihara | 365/201 |
| 5,331,594 A | 7/1994 | Hotta | 365/201 |
| 5,367,655 A | 11/1994 | Grossman et al. | 365/230.06 |
| 5,432,744 A | * 7/1995 | Nagata | 365/230.06 |
| 5,471,480 A | 11/1995 | You | 365/201 |
| 5,557,573 A | 9/1996 | McClure | 365/201 |
| 5,604,711 A | 2/1997 | Cheung | 365/230.06 |
| 5,706,233 A | * 1/1998 | Ooishi | 365/203 |
| 5,808,947 A | 9/1998 | McClure | 365/201 |

OTHER PUBLICATIONS

"Wafer Burn–In (WBI) Technology for RAM's" by T. Furuyama et al., *IEDM '93 Digest*, IEEE, 1993.

"A 256M DRAM with Simplified Register Control for Low Power Self Refresh and Rapid Burn–in", by Seung–Moon Yeo et al., 1994 Symposium on VLSI Circuits Digest of Technical Papers, IEEE, 1994.

\* cited by examiner

*Primary Examiner*—Tan T. Nguyen
(74) *Attorney, Agent, or Firm*—McDermott, Will & Emery

(57) ABSTRACT

A DRAM includes a row predecoder responsive to an multi-selection signal for activating all predecode signals independent of a row address signal, and a row decoder unit responsive to the multi-selection signal for activating all decode signals independent of the row address signal. As a result, all word drivers are activated in an acceleration test independent of the row address signal, and all the word lines are driven simultaneously.

15 Claims, 42 Drawing Sheets

12 : ROW DECODER

SEMICONDUCTOR MEMORY DEVICE ALLOWING ACCELERATION TESTING, AND A SEMI-FINISHED PRODUCT FOR AN INTEGRATED SEMICONDUCTOR DEVICE THAT ALLOWS ACCELERATION TESTING

This application is a continuation of application Ser. No. 08/937,188 filed Sep. 25, 1997, now U.S. Pat. No. 5,953,271 which is a division of application Ser. No. 08/601,750 on Feb. 15, 1996, now U.S. Pat. No. 5,706,233.

BACKGROUND OF THE INVENTION

1. Field of the Invention

The present invention relates to a semiconductor memory device and a semi-finished product for an integrated semiconductor device. More particularly, the present invention relates to a semiconductor memory device that allows an acceleration test such as a burn-in test, and a semi-finished product for an integrated semiconductor device that allows such testing in a wafer state prior to dicing.

2. Description of the Background Art

FIG. 39 is a block diagram schematically showing a structure of a memory cell and a row decoder widely used in a dynamic random access memory device (referred to as DRAM hereinafter). Referring to FIG. 39, a memory cell 111 includes an access transistor 112 and a cell capacitor 113, connected to a corresponding word line WL and a bit line BL. A row decoder selecting one word line in response to a row address signal includes a row predecoder 121a, a predecode signal line 122, and a plurality of word drivers. One word driver is provided corresponding to each word line WL. In FIG. 39, only one word driver WD is typically shown. Row predecoder 121a predecodes row address signals RA1–RA4 and complementary row address signals /RA1–/RA4 to generate predecode signals X1–X8 which are supplied to predecode signal line 122. Each word driver is activated in response to one of predecode signals X1–X4 and one of predecode signals X5–X8. When the word driver is rendered active, a boosted potential VPP higher than the power potential VPP higher than the power supply potential is supplied to a corresponding word line.

Word driver WD includes N channel MOS transistors 124 and 125 connected in series between a precharge node NX and a ground node, P channel MOS transistors 126 and 127 connected in parallel between a boosting node to which boosted potential VPP is supplied and precharge node NX, and a P channel MOS transistor 128 and an N channel MOS transistor 129 forming a CMOS inverter. During an inactive period of the DRAM (chip), a precharge signal PR of an L level (logical low) is applied to the gate electrode of transistor 126. In response, precharge node NX is precharged to an H level (logical high). Therefore, all the word lines are fixed to an L level when the chip is inactive. When the chip is activated, precharge signal PR is pulled up to an H level from an L level, whereby the precharge operation of node NX by transistor 126 is suppressed. However, word line WL maintains its L level since node NX is held at the H level. This is because the potential of word line WL is fed back to the gate electrode of transistor 127, whereby transistor 127 continuously supplies charge to node NX. Therefore, the charge of node NX must be discharged towards the ground node in order to render word line WL active. This word driver WD has both transistors 124 and 125 turned on when one predecode signal DECA out of predecode signals X1–X4 attains an H level and one predecode signal DECB out of predecode signals X5–X8 attains an H level. As a result, the potential of node NX is pulled down towards the L level, whereby transistors 128 and 129 are turned on and off, respectively. Thus, word line WL is activated, so that the potential thereof is boosted to the level of the boosted potential VPP.

FIG. 40 is a circuit diagram showing a structure of row predecoder 121a shown in FIG. 39. Referring to FIG. 40, row predecoder 121a includes NOR gates 1211–1218, inverters 1221a–1228a and 1231–1238. Each of NOR gates 1211–1214 receives either row address signal RA1 or a complementary row address signal /RA1, and either row address signal RA2 or a complementary row address signal /RA2. Each of NOR gates 1215–1218 receives either a row address signal RA3 or a complementary row address signal RA3, and either a row address signal RA4 or a complementary row address signal /RA4. Each of NOR gates 1211–1218 has its output signal provided to a word driver as a predecode signal via two inverters. For example, NOR gate 1211 receives row address signals /RA1 and /RA2 to provide predecode signal X1 to the word driver via two inverters 1221a–1231. Therefore, one of predecode signals X1–X4 attains an H level according to four combinations of row address signals RA1, /RA1, RA2, and /RA2. For example, predecode signal X1 attains an L level when row address signals /RA1 and /RA2 both attain an L level. Furthermore according to the four combinations of row address signals RA3, /RA3, RA4 and /RA4, one of predecode signals X5–X8 attains an H level. For example, when row address signals /RA3 and /RA4 both attain an L level, predecode signal X5 is pulled up to an H level.

In order to carry out a stress test on word line WL and access transistor 112 in the above-described DRAM, boosted potential VPP must be supplied to word line WL only during a predetermined time period. However, the testing is time-consuming according to increase in the capacity of a memory, resulting in increase in the cost required for testing. For example, a reliability test called "burn-in" that applies acceleration stress on a memory cell had a problem that the testing time period becomes longer as the number of memory cells becomes greater. The stress testing on a gate oxide film in access transistor 112 and on a dielectric film in cell capacitor 113 are extremely important. However, the number of word lines n that can be activated at one time is limited in a normal operation. Therefore, the testing must be carried for N (total number of word lines) /n times in order to evaluate all the word lines. The time required for testing becomes longer in accordance with a higher integration density of a chip.

A method of increasing the number of word lines that are activated simultaneously is considered as one way of reducing the testing time. An example of an DRAM that allows testing by such a method is shown in FIG. 41. FIG. 41 is substantially identical to FIG. 3 in pp. 639–642 of "IEDM93, DIGEST". Referring to FIG. 41, the DRAM includes a memory cell array 11 having a plurality of word lines WL and bit lines (not shown) crossing thereto, a row decoder 12 selecting one of word lines WL, a column decoder 13 selecting one bit line, and a plurality of N channel MOS transistors 1 connected corresponding to word lines WL. Row decoder 12 includes a plurality of word drivers WD, each driving a corresponding word line WL. All transistors 1 are turned on in response to one multi-selection signal MLT, whereby boosted test potential VST is supplied to all word lines WL. Therefore, stress can be applied to all the access transistors simultaneously since all the word lines are activated in a burn-in mode. Thus, the testing time can be shortened.

FIG. 42 shows a semiconductor (silicon) wafer 70 not yet subjected to a dicing process. A plurality of semiconductor chips 71 are formed on silicon wafer 70. A probe card 2 as shown in FIG. 43 is used in carrying out an acceleration test such as burn-in on the wafer shown in FIG. 42. Probe card 2 includes an opening 3 corresponding to a plurality of chips 71 aligned in one row in the vertical direction (three in FIG. 42) in wafer 70. A plurality of probes 4 are provided corresponding to the three chips 71 at the periphery of opening 3. This probe card 2 is set on wafer 70 to carry out a burn-in test in a wafer state. Probes 4 are brought into contact with the pads (not shown) of the three chips 71, so that power supply and a signal for testing can be applied simultaneously to the three chips 71. In order to test all the chips 71 in wafer 70, the setting position of probe card 2 must be shifted 5 times.

Since boosted test potential VST is supplied to word line WL via transistor 1 in the DRAM of FIG. 41, boosted test potential VST must be higher than boosted potential VPP by the threshold voltage of transistor 1 in order to supply a boosted potential VPP higher than the power supply potential to word line WL. Therefore, a great stress is applied on transistor 1 controlled by multi-selection signal MLT which is greater than that on the access transistor that should actually receive the greater stress. As a result, there is a possibility that these transistors 1 become defective. Furthermore, since one transistor 1 must be provided corresponding to each word line WL, reduction in the pitch between word lines WL due to miniaturization of the chip is attributed to the difficulty of forming a transistor with such small pitches. As a result, there is a possibility that these transistors 1 become defective.

When silicon wafer 70 as shown in FIG. 42 is to be tested using probe card 2 shown in FIG. 43, the setting position of probe card 2 must be changed 5 times with respect to wafer 70. There was a problem that the entire testing of wafer 70 was time consuming.

SUMMARY OF THE INVENTION

In view of the foregoing, one object of the present invention is to provide a semiconductor memory device of a simple structure that allows acceleration testing by activating a plurality of word lines simultaneously.

Another object of the present invention is to provide a semi-finished product for an integrated semiconductor device that allows acceleration testing in a wafer state at a short time period.

According to an aspect of the present invention, a semiconductor memory device can be operated in a normal mode and a test mode. The semiconductor memory device includes a plurality of word lines, a plurality of bit lines, a plurality of memory cells, a plurality of drive circuits, and an activation circuit. The plurality of bit lines cross the word lines. The plurality of memory cells are provided corresponding to respective crossings of a word line and a bit line. Each memory cell is connected to a corresponding word line and bit line. The plurality of drive circuits are provided corresponding to the word lines. Each drive circuit drives a corresponding word line. The activation circuit selectively activates one drive circuit in response to an externally applied row address signal when in a normal mode, and activates at least two drive circuits in response to a predetermined multi-selection signal and independent of a row address signal in a test mode.

The above semiconductor memory device has one drive circuit selectively activated in response to an externally applied row address signal in a normal mode, whereby a corresponding word line is driven. In a test mode, at least two drive circuits are activated in response to a predetermined multi-selection signal and independent of a row address signal in a test mode, whereby at least two word lines are driven. Thus, the testing time is shortened.

According to another aspect of the present invention, a semiconductor memory device can be operated in a normal mode and a test mode. The semiconductor memory device includes a plurality of word line groups, a plurality of bit lines, a plurality of memory cells, a plurality of drive circuits, and an activation signal. Each word line group includes a plurality of word lines. The plurality of word lines cross a word line. The plurality of memory cells are provided corresponding to respective crossings of a word line and a bit line. Each memory cell is connected to a corresponding word line and a bit line. The plurality of drive circuits are provided corresponding to the word lines. Each drive circuit drives a corresponding word line. The activation circuit selectively activates one drive circuit in response to an externally applied row address signal when in a normal mode, and activates all the drive circuits corresponding to one word line group in response to a plurality of multi-selection signals supplied corresponding to a word line group when in a test mode.

The above-described semiconductor memory device has one drive circuit selectively activated in response to an externally applied row address signal when in a normal mode, whereby a corresponding one word line is driven. When in a test mode, all the word lines in one word line group are driven in response to multi-selection signals in a test mode. Therefore, a testing in which word lines are driven in a divisional manner can be carried out.

According to a further aspect of the present invention, a semiconductor memory device includes a semiconductor substrate, a plurality of word lines, plurality of bit lines, a plurality of memory cells, a plurality of drive circuits, an activation circuit, a substrate potential supply circuit, a cell plate potential generation circuit, and a cell plate potential supply circuit. The plurality of word lines are formed on a semiconductor substrate. The plurality of bit lines are formed on the semiconductor substrate crossing the word lines. The plurality of memory cells are provided corresponding to respective crossings of a word line and a bit line. Each memory cell includes a cell capacitor and an access transistor. The cell capacitor is formed on the semiconductor substrate, and includes a cell plate and a storage node to store data. The access transistor includes a gate electrode, and one and the other source/drain regions. The gate electrode is formed on the semiconductor substrate, and is connected to a corresponding word line. One source/drain region is formed in the semiconductor substrate, and is connected to a corresponding bit line. The other source/drain region is formed in the semiconductor substrate, and is connected to the storage node of a cell capacitor. The plurality of drive circuits are provided corresponding to the word lines. Each drive circuit drives a corresponding word line. The activation circuit selectively activates one drive circuit in response to an externally applied row address signal when in a normal mode, and activates at least two drive circuits in response to a predetermined multi-selection signal regardless of a row address signal when in a test mode. The substrate potential supply circuit responds to multi-selection signal to selectively supply a predetermined substrate potential and a predetermined first test potential to the semiconductor substrate. The cell plate potential generation circuit generates a cell plate potential for a cell plate.

The cell plate potential supply circuit selectively supplies a cell plate potential from the cell plate potential generation circuit and a predetermined second test potential to the cell plate in response to the multi-selection signal.

According to still another aspect of a semiconductor memory device of the present invention, one word line is activated and a predetermined substrate potential is supplied to a semiconductor substrate in response to an externally applied row address signal when in a normal mode, whereby a cell plate potential from a cell plate potential generation circuit is supplied to a cell plate. In a test mode, a first test potential is supplied to the semiconductor substrate, and the second test potential is supplied to the cell plate. The first test potential is supplied to a storage node via the other source/drain region of the access transistor. Therefore, a predetermined voltage can be applied to the cell capacitor of a memory cell.

According to a still further aspect of the present invention, a nonvolatile semiconductor memory device can be operated in a normal mode and a data erasure mode. The nonvolatile semiconductor memory device includes a plurality of word lines, a plurality of source lines, a plurality of floating gate type memory cells, a plurality of drive circuits, and an activation circuit. The plurality of source lines cross the word lines. The plurality of floating gate type memory cells are provided corresponding to respective crossings of a word line and a source line. Each floating gate type memory cell is connected to a corresponding word line and a source line. The plurality of drive circuits are provided corresponding to the word lines. Each drive circuit drives a corresponding word line. The activation circuit selectively activates one drive circuit in response to an externally applied row address signal when in a normal mode, and activates at least two drive circuits in response to a predetermined multi-selection signal and independent of an address signal in a data erasure mode.

The above-described nonvolatile semiconductor memory device has one drive circuit activated in response to an externally applied row address signal in a normal mode, whereby a corresponding one word line is driven. In a test mode, at least two drive circuits are activated in response to a multi-selection signal, whereby at least two word lines are activated. Therefore, data written in floating gate type memory cells can partially be erased.

According to yet another aspect of the present invention, a semi-finished product for an integrated semiconductor device includes a semiconductor wafer, a plurality of semiconductor chips, and a first test interconnection. The plurality of semiconductor chips are formed on the semiconductor wafer to attain a test mode in response to an external test signal provided from the outside world. The first test interconnection is provided on the semiconductor wafer and formed in a region other than the region where the plurality of semiconductor chips are located. The first test interconnection is connected in common to the plurality of semiconductor chips, and receives an external test signal.

In the above-described semi-finished product for an integrated semiconductor device, the first test interconnection is formed on a dicing region of a semiconductor wafer in which a plurality of semiconductor chips are formed. An external test signal is applied to all the semiconductor chips via the first test interconnection. Since all the semiconductor chips attain a test mode, the testing time under a wafer state can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
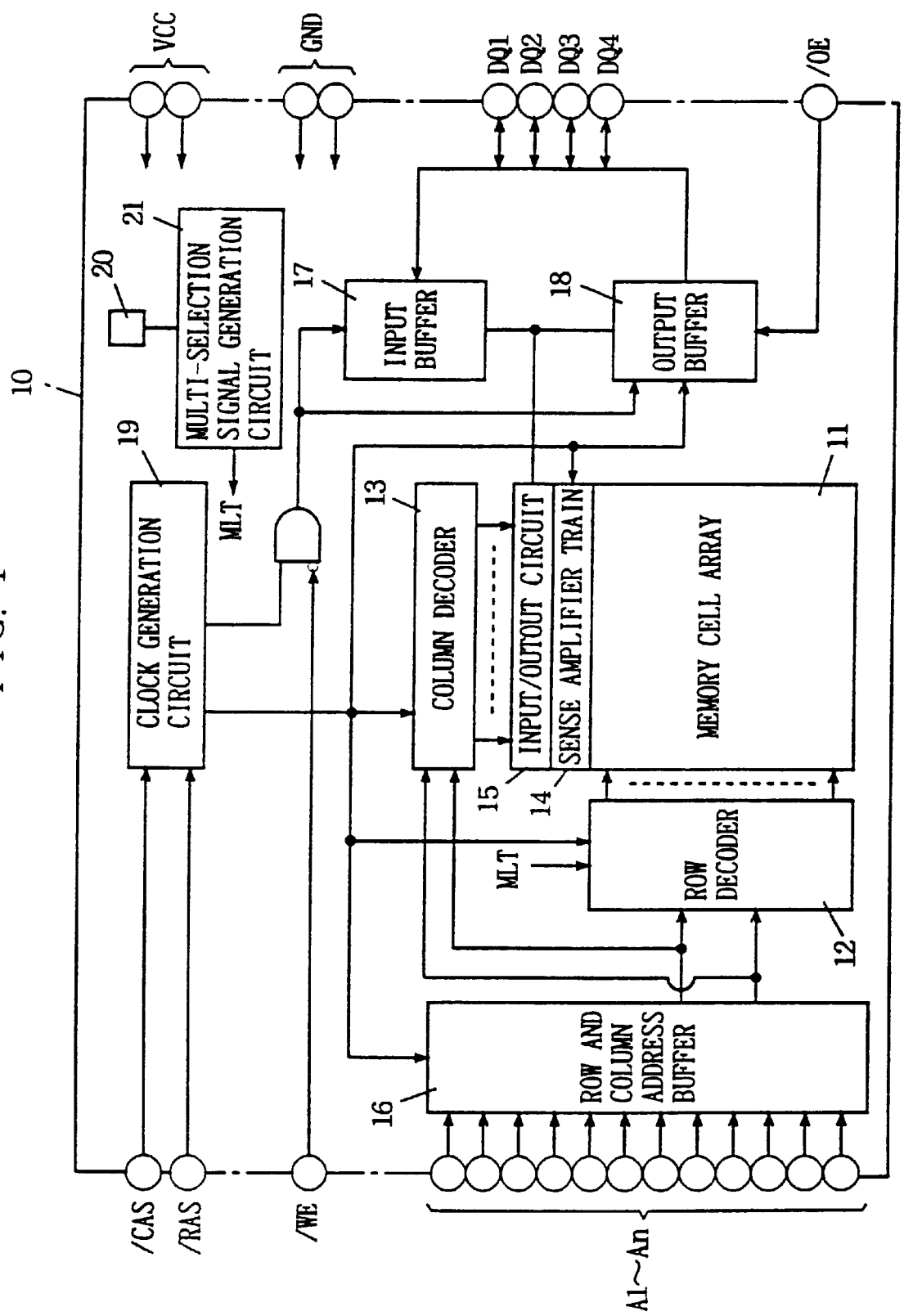
FIG. 1 is a block diagram showing an entire structure of a DRAM according to a first embodiment of the present invention.

Embodiments of the present invention will be described in detail hereinafter with reference to the drawings. In the drawings, corresponding components have the same or likewise reference characters allotted.

First Embodiment

Referring to FIG. 1, a DRAM of a first embodiment includes a memory cell array 11, a row decoder 12, a column decoder 13, a sense amplifier train 14, an input/output circuit 15, a row and column address buffer 16, an input buffer 17, an output buffer 18, a clock generation circuit 19, a multi-selection pad 20, and a multi-selection signal generation circuit 21. All the above circuit elements are formed on one semiconductor substrate 10.

Figure 2:
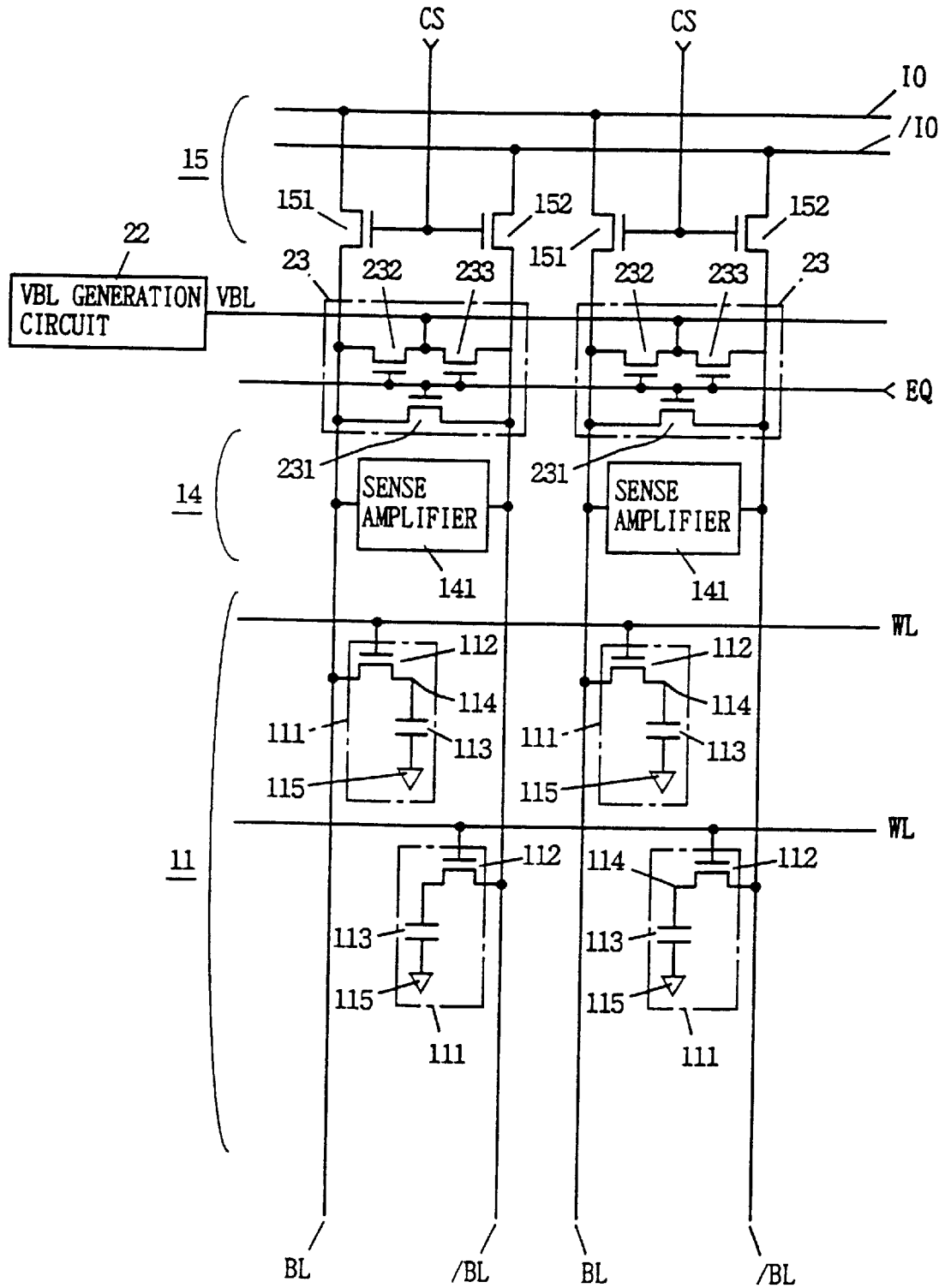
FIG. 2 is a block diagram specifically showing a memory cell array, a sense amplifier train, and an input/output circuit of FIG. 1.
Figure 3:
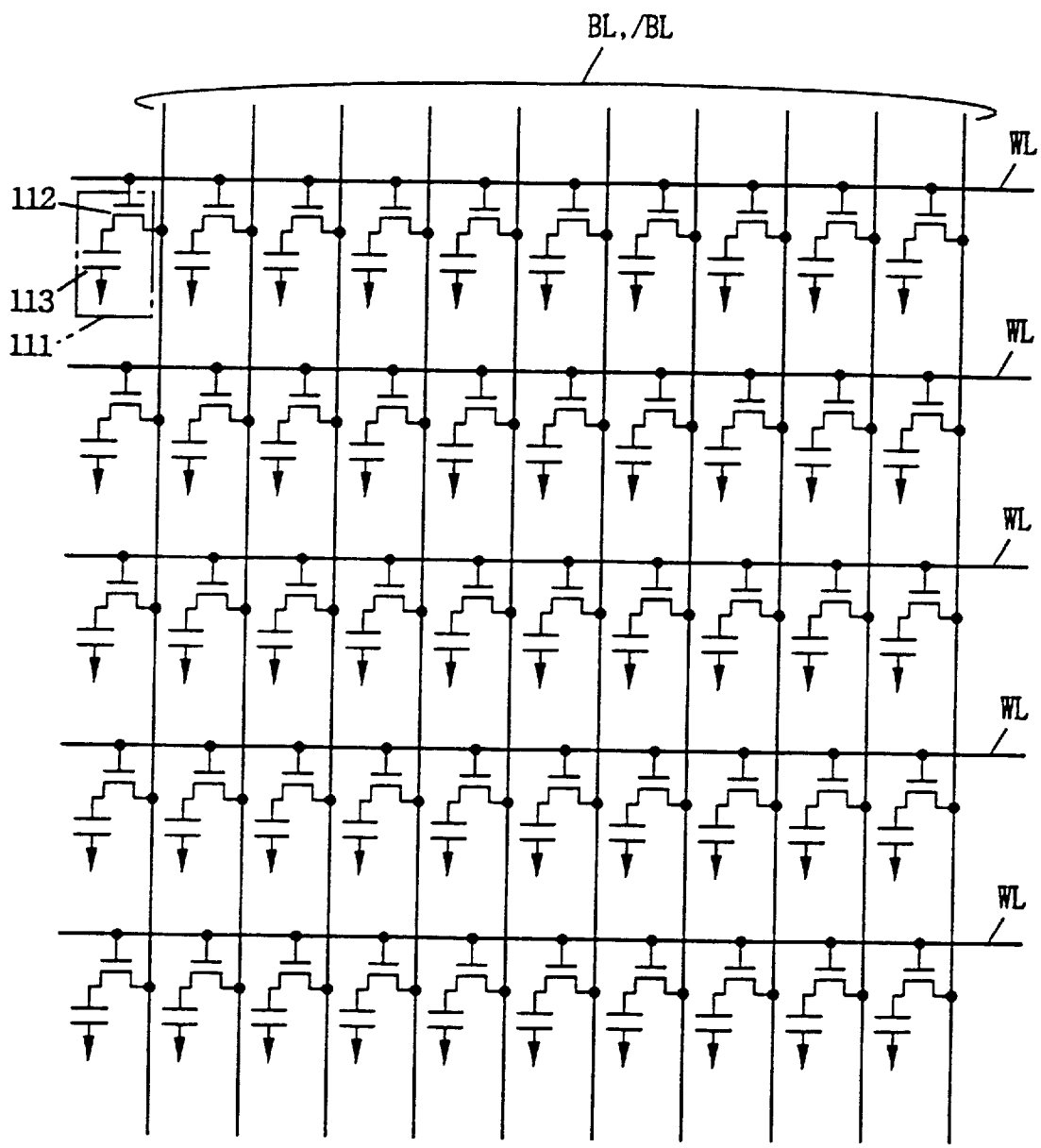
FIG. 3 is a circuit diagram showing a specific structure of memory cell array of FIG. 1.

FIG. 2 shows a partial structure of memory cell array 11, sense amplifier train 14, and input/output circuit 15. Memory cell array 11 includes a plurality of word lines WL arranged in a row direction, a plurality of bit line pairs BL and /BL arranged in a column direction, and a plurality of dynamic memory cells 111 provided corresponding to respective crossings of word line WL and a bit line pair BL and /BL. A bit line pair is formed of a bit line BL and a complementary bit line /BL. FIG. 3 is a circuit diagram of memory cell array 11 in a simplified manner wherein the pair of bit line BL and /BL are indicated by one line.

Figure 4:
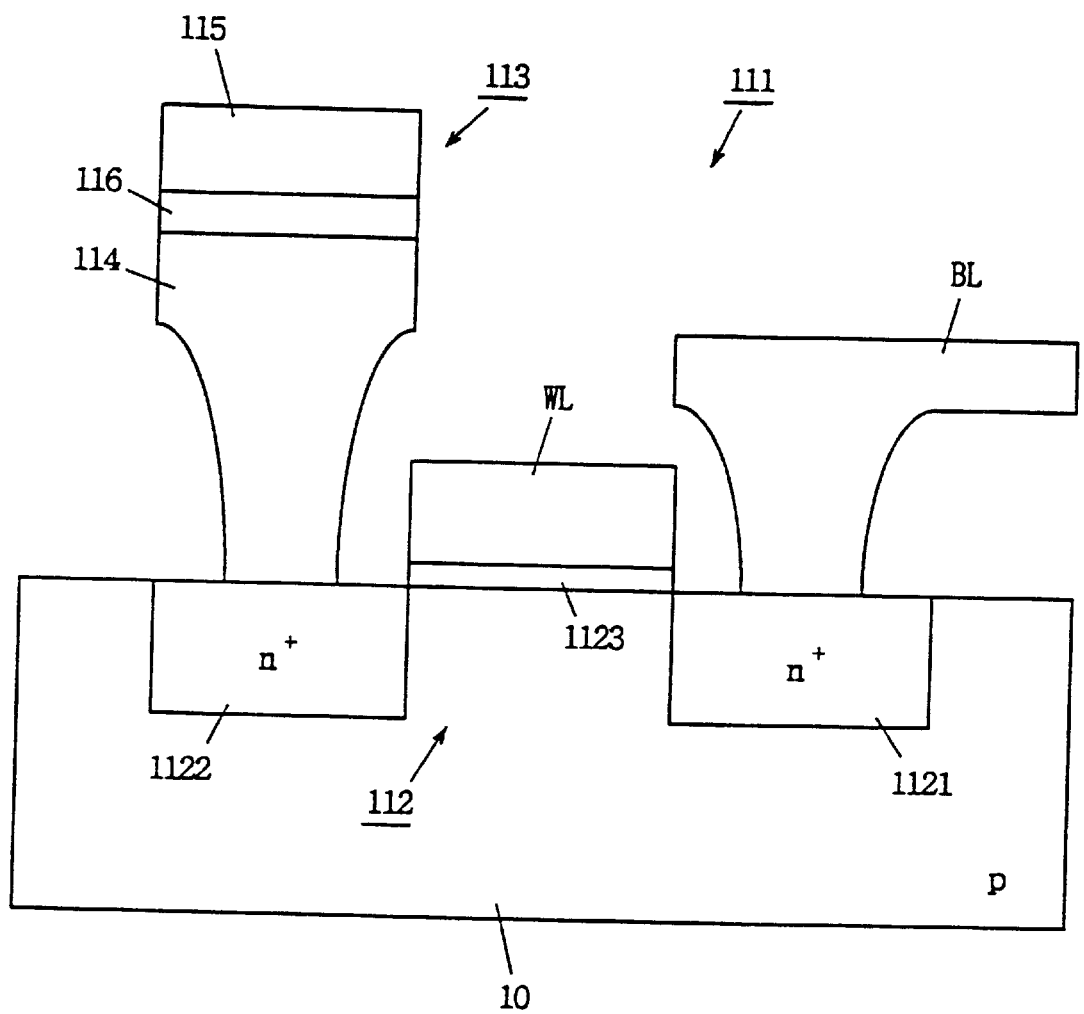
FIG. 4 is a sectional view of one memory cell shown in FIGS. 2 and 3.

FIG. 4 is a sectional view of one dynamic memory cell 111 formed on a p type semiconductor substrate 10. Referring to FIGS. 2–4, dynamic memory cell 111 includes one access transistor 112 and one cell capacitor 113. Access transistor 112 is connected between a corresponding bit line BL or /BL and capacitor 113. Access transistor 112 has its gate electrode connected to a corresponding word line. As shown in FIG. 4, access transistor 112 includes $n^+$ source/drain regions 1121 and 1122 formed on p type semiconductor substrate 10, and a gate electrode forming word line WL on semiconductor substrate 10 with gate oxide film 1123 therebetween. Bit line BL is in contact with one source/drain region 1121 of access transistor 112. Cell capacitor 113 includes a storage node 114, and a cell plate 115 formed on storage node 114 with a dielectric film 116 therebetween. Storage node 114 forms contact with the other source/drain region 1122 of access transistor 112.

Referring to FIG. 2 again, sense amplifier train 14 of FIG. 1 includes a plurality of sense amplifiers 141. Sense amplifiers 141 are provided corresponding to bit line pairs BL and /BL. Each sense amplifier 141 is connected to a corresponding bit line pair to amplify the potential differential of the bit lines BL and /BL.

The DRAM further includes a bit line precharge potential generator 22 for generating a predetermined bit line precharge potential VBL, and a plurality of bit line equalize circuits 23. Bit line equalize circuits 23 are provided corresponding to bit line pairs BL and /BL. Each bit line equalize circuit 23 is connected to a corresponding bit line pair to equalize the potential of the relevant bit lines BL and /BL, and supplies bit line precharge potential VBL from bit line precharge potential generator 22 to the corresponding bit lines BL and /BL. A potential of ½ the power supply potential VCC, for example (referred to as "intermediate potential VCC/2" hereinafter) is used as bit line precharge potential VBL. Each bit line equalize circuit 23 includes an N equalize channel MOS transistor 231 connected between corresponding bit lines BL and /BL, and precharge N channel MOS transistors 232 and 233, each connected between bit line precharge potential generator 22 and respective bit lines BL and /BL. Transistors 231–233 are turned on simultaneously in response to an equalize signal EQ provided at a predetermined timing. Therefore, bit lines BL and /BL are equalized by transistor 231, and precharged to the level of bit line precharge potential VBL by transistors 232 and 233.

Input/output circuit 15 includes a pair of input/output lines IO and /IO and a plurality of column select gates 151 and 152. Column select gates 151 and 152 are provided corresponding to bit line pairs BL and /BL. Each column select gate 151 is connected between a corresponding bit line BL and one input/output line IO. Each column select gate 152 is connected between a corresponding bit line /BL and the other input/output line /IO. Column select gates 151 and 152 are turned on in response to a column select signal CS applied from column decoder 13 shown in FIG. 1.

Referring to FIG. 1 again, clock generation circuit 19 responds to externally applied external row address strobe signal /RAS and external column address strobe signal /CAS to generate a control signal such as an internal row address strobe signal and an internal column address strobe signal. Row and column address buffer 16 responds to an internal row address strobe signal from clock generation circuit 19 to allow entry of address signals A1–An to provide a row address signal and a complementary row address signal to row decoder 12. Row and column address buffer 16 further responds to an internal column address strobe signal from clock generation circuit 19 to allow entry of address signals A1–An to provide a column address signal and a complementary column address signal to column decoder 13.

This DRAM includes a normal mode and a test mode. In a normal mode, no potential is applied to multi-selection pad 20. Therefore, multi-selection pad 20 attains an electrically floating state. Multi-selection signal generation circuit 21 generates a multi-selection signal MLT of an L level when multi-selection pad 20 attains a floating state. In a test mode, ground potential GND, for example, is supplied to multi-selection pad 20. Multi-selection signal generation circuit 21 generates a multi-selection signal MLT of an H level when the potential of multi-selection pad 20 attains the level of ground potential GND. Thus, multi-selection signal MLT attains an L level in a normal mode and at H level in a test mode.

Multi-selection signal MLT is applied to row decoder 12. When a multi-selection signal MLT of an L level is provided, row decoder 12 carries out a normal operation identical to that of a general case. More specifically, row decoder 12 responds to a row address signal to selectively drive one word line in memory cell array 11. As a result, data is readout to bit line pair BL and /BL from all the memory cells 111 connected to the driven word line WL in a readout operation. Data readout causes the potential difference between bit lines BL and /BL to be amplified by sense amplifier 141, whereby the potential of one of bit lines BL and /BL is amplified to an H level, and the potential of the other bit line /BL or BL is amplified to the L level. Column decoder 13 responds to a column address signal to select one bit line pair BL and /BL. More specifically, one column select signal CS attains an H level, whereby corresponding column select gates 151 and 152 are turned on. Therefore, the amplified data on corresponding bit lines BL and /BL is applied to input buffer 18 via input/output data line pair IO and /IO. Output buffer 18 responds to output enable signal /OE to provide the data as input/output data DQ1–DQ4. In a writing operation, input buffer 17 responds to a write enable signal /WE to supply input/output data DQ1–DQ4 to input/output circuit 15.

When a multi-selection signal MLT of an H level is provided, row decoder 12 selectively drives all word lines WL in memory cell array 11. Therefore, all the word lines WL are activated in a test mode, whereby a test-stress is applied to access transistor 112 in all memory cells 111.

The structure of multi-selection signal generation circuit 21 and row decoder 12 characteristic of the first embodiment will be described in detail hereinafter.

Figure 5:
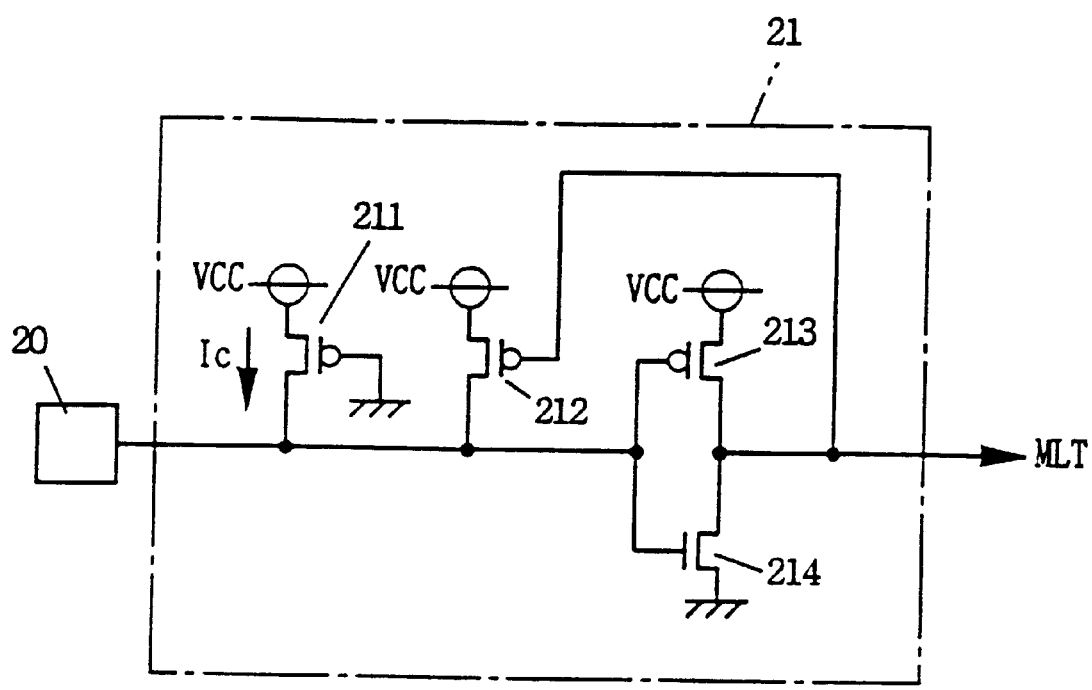
FIG. 5 is a circuit diagram showing a specific structure of a multi-selection pad and a multi-selection signal generation circuit of FIG. 1.

Referring to FIG. 5, multi-selection signal generation circuit 21 includes P channel MOS transistors 211 and 212 connected in parallel between a power supply node to which power supply potential VCC is applied and multi-selection pad 20, and a P channel MOS transistor 213 and an N channel MOS transistor 214 forming an CMOS inverter. Since transistor 211 has its gate electrode supplied with ground potential, transistor 211 supplies a slight current Ic for compensating for the potential of the node of multi-selection pad 20. The inverter formed of transistors 213 and 214 inverts the logic level of the signal of multi-selection pad 20 to supply multi-selection signal MLT. Multi-selection signal MLT is fed back to the gate electrode of transistor 212.

Although no potential is supplied to multi-selection pad 20 in a normal mode, the node of multi-selection pad 20 is slightly pulled up to an H level since a slight current Ic is supplied thereto by transistor 211. A potential of an L level is applied to the gate electrode of transistor 212, whereby transistor 212 is turned on. As a result, the node of multi-selection pad 20 is strongly pulled up to an H level. Thus, multi-selection signal MLT generated by multi-selection signal generation circuit 21 is fixed at an L level.

In a test mode, ground potential GND is applied to multi-selection pad 20, so that transistor 212 is turned on. Therefore, multi-selection signal MLT attains an H level.

Figure 6:
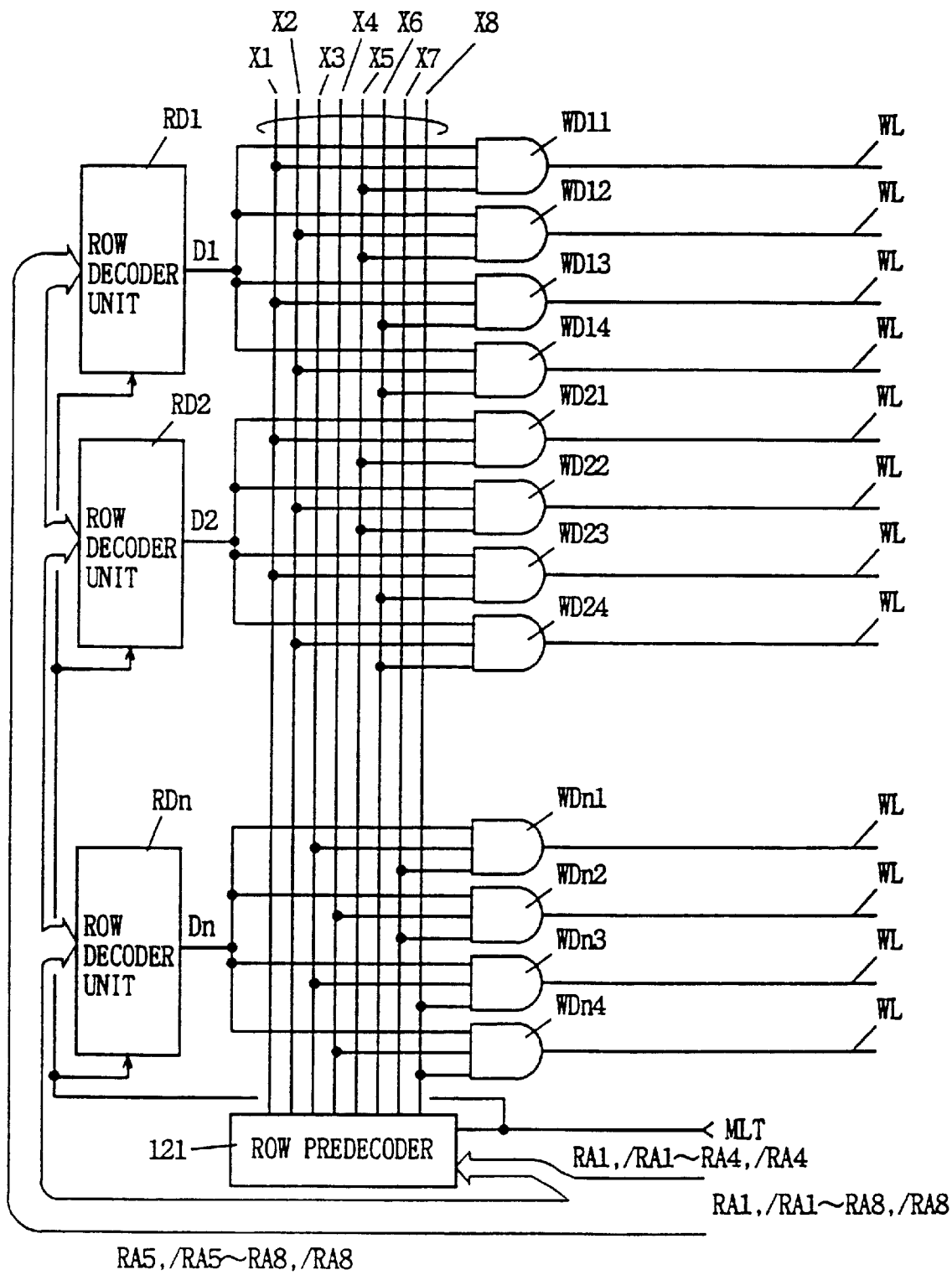
FIG. 6 is a block diagram showing a specific structure of a row decoder 12 of FIG. 1.

Referring to FIG. 6, row decoder 12 includes a row predecoder 121 responsive to row address signals RA1, /RA1–RA4, /RA4 for generating predecode signals X1–X8, a predecode signal line 122 supplied with predecode signals X1–X8, a plurality of row decoder units RD1–RDn responsive to row address signals RA5, /RA5–RA8, /RA8 for generating decode signals D1–Dn, and a plurality of word drivers WD11–WD14, WD21–WD24, and Wdn1–Wdn4 responsive to predecode signals X1–X8 and decode signals D1–Dn to drive word line WL. Each word driver is formed of a 3-input AND gate to drive a corresponding word line WL in response to one of decode signals D1–Dn, one of predecode signals X1–X4, and one of predecode signals X5–X8.

In a normal mode, a multi-selection signal MLT of an L level is provided to row predecoder 121. In this case, row predecoder 121 responds to row address signals RA1, /RA1, RA2, /RA2 to activate one of predecode signals X1–X4 to an H level, and responds to row address signals RA3, /RA3, RA4, /RA4 to activate one of predecode signals X5–X8 to an H level. In a test mode, a multi-selection signal MLT of an H level is supplied to row predecoder 121. In this case, row predecoder 121 activates all predecode signals X1–X8 to an H level independent of row address signals RA1, /RA1–RA4, /RA4.

Each of row decoder units RD1–RDn is provided corresponding to four of word drivers WD11–WD14, WF21–WD24, and Wdn1–Wdn4. For example, row decoder unit RD1 is provided corresponding to word drivers WD11–WD14. Row decoder unit RD2 is provided corresponding to word drivers WD21–WD24. Row decoder unit RDn is provided corresponding to word drivers WDn1–WDn4.

In a normal mode, a multi-selection signal MLT of an L level is provided to row decoder units RD1–RDn. In this case, row decoder units RD1–RDn respond to row address signals RA5, /RA5–RA8, /RA8 to activate any of decode signals D1–Dn to an H level. For example, when row address signals /RA5 and /RA6 both attain an H level, row decoder unit RD1 activates corresponding decode signal D1 to an H level. Row decoder unit RD2 is maintained at an L level. Therefore, only word drivers WD11–WD14 that receive a decode signal D1 of an H level attains an active state. Furthermore, when only predecode signals X1 and X5 are activated to an H level, only word driver WD11 is activated, and only a corresponding word line WL is driven. Although predecode signals X1 and X5 of an H level are applied to word driver WD21, word driver WD21 is not activated since a corresponding decode signals D2 attains an L level.

In a test mode, multi-selection signal MLT of an H level is applied to row decoder unit RD1–RDn. In this case, row decoder units RD1–RDn activate all decode signals D1–Dn to an H level. Since decode signals D1–Dn of an H level are applied to all word drivers WD11–WD14, WD21–WD24, and WDn1–Wdn4, all word drivers attain a state that allow a activation. Since all predecode signals X1–X8 are activated to an H level in a test mode, all word drivers are activated. Therefore, all the word lines WL are driven.

Figure 7:
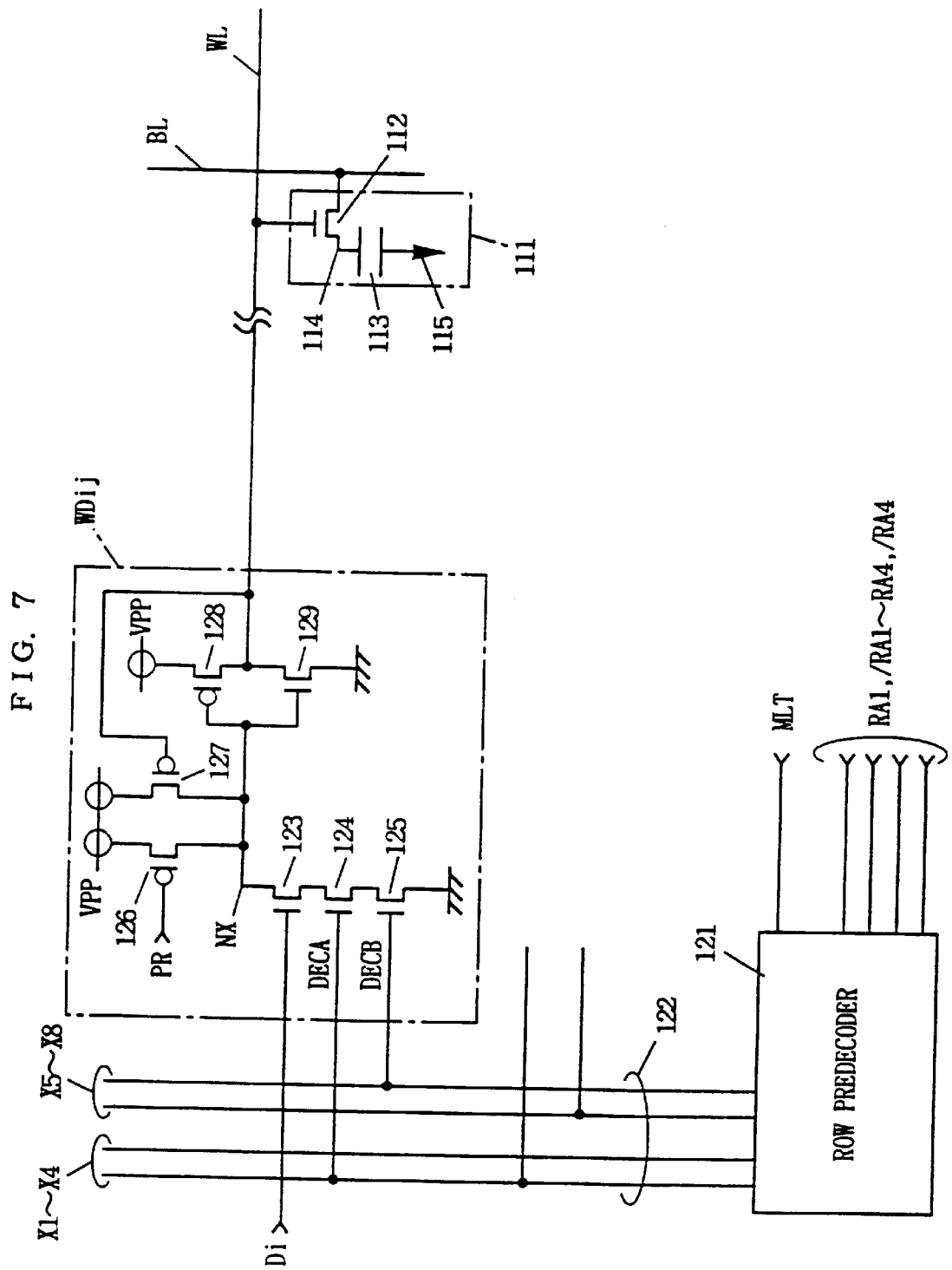
FIG. 7 is a block diagram showing a structure of the row predecoder and one word driver of FIG. 6.
Figure 39:
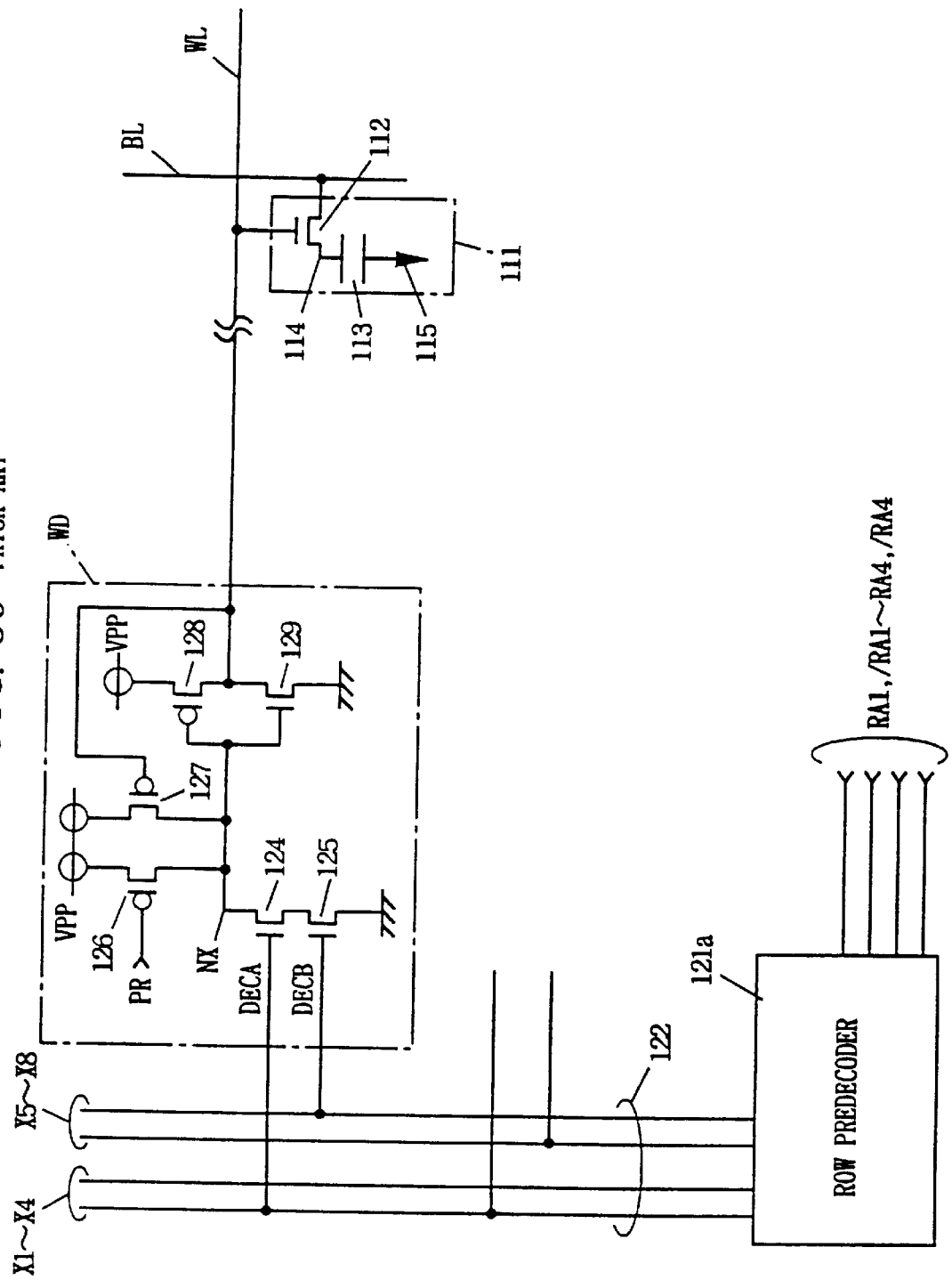
FIG. 39 is a block diagram showing a structure of a row predecoder, a word driver, and a memory cell in a conventional DRAM.

FIG. 7 is a block diagram showing a specific structure of row predecoder 121, predecode signal lines 122 and one word driver WDij together with corresponding word line WL and memory cell 111. Word driver WDij of FIG. 7 has a structure substantially identical to the conventional word driver WD shown in FIG. 39. The decode system for selecting word driver WDij has a structure substantially equal to the conventional one in FIG. 39. More specifically, word driver WDij includes N channel MOS transistors 123–125 connected in series between a precharge node NX and a ground node, a P channel MOS transistors 126 and 127 connected in parallel between a boosted power supply node to which a boosted potential VPP is supplied and a precharge node NX, and a P channel MOS transistor 128 and N channel MOS transistor 129 forming an CMOS inverter. N channel MOS transistor 123 has its gate electrode supplied with a decode signal Di from a corresponding row decode unit. N channel MOS transistor 124 has its gate electrode supplied with one of predecode signals X1–X4 as a predecode signal DECA. N channel MOS transistor 125 has its gate electrode supplied with one of predecode signals X5–X8 as a predecode signal DECB. P channel MOS transistor 126 responds to a precharge signal PR to be turned on or off. The output signal of an inverter formed of transistors 128 and 129 is supplied to the gate electrode of P channel MOS transistor 127. Word driver WDij responds to decode signal Di and predecode signals DECA and DECB to be selectively activated. In an inactive state, precharge signal PR of an L level is applied to the gate electrode of transistor 126. Therefore, the potential of precharge node NX is weakly pulled up to the level of boosted potential VPP by transistor 126. Therefore, the inverter formed of transistors 128 and 129 supplies an output signal of an L level to the gate electrode of transistor 127, whereby the potential of precharge node NX is strongly pulled up to the level of boosted potential VPP. Therefore, the potential of a corresponding word line WL is fixed to an L level. When decode signal Di and predecode signals DECA and DECB all attain an H level, transistors 123–125 are all turned on, whereby the potential of precharge node NX is discharged to the level of ground potential. Transistor 129 is turned off and transistor 128 is turned on, whereby boosted potential VPP is supplied to a corresponding word line WL.

Figure 8:
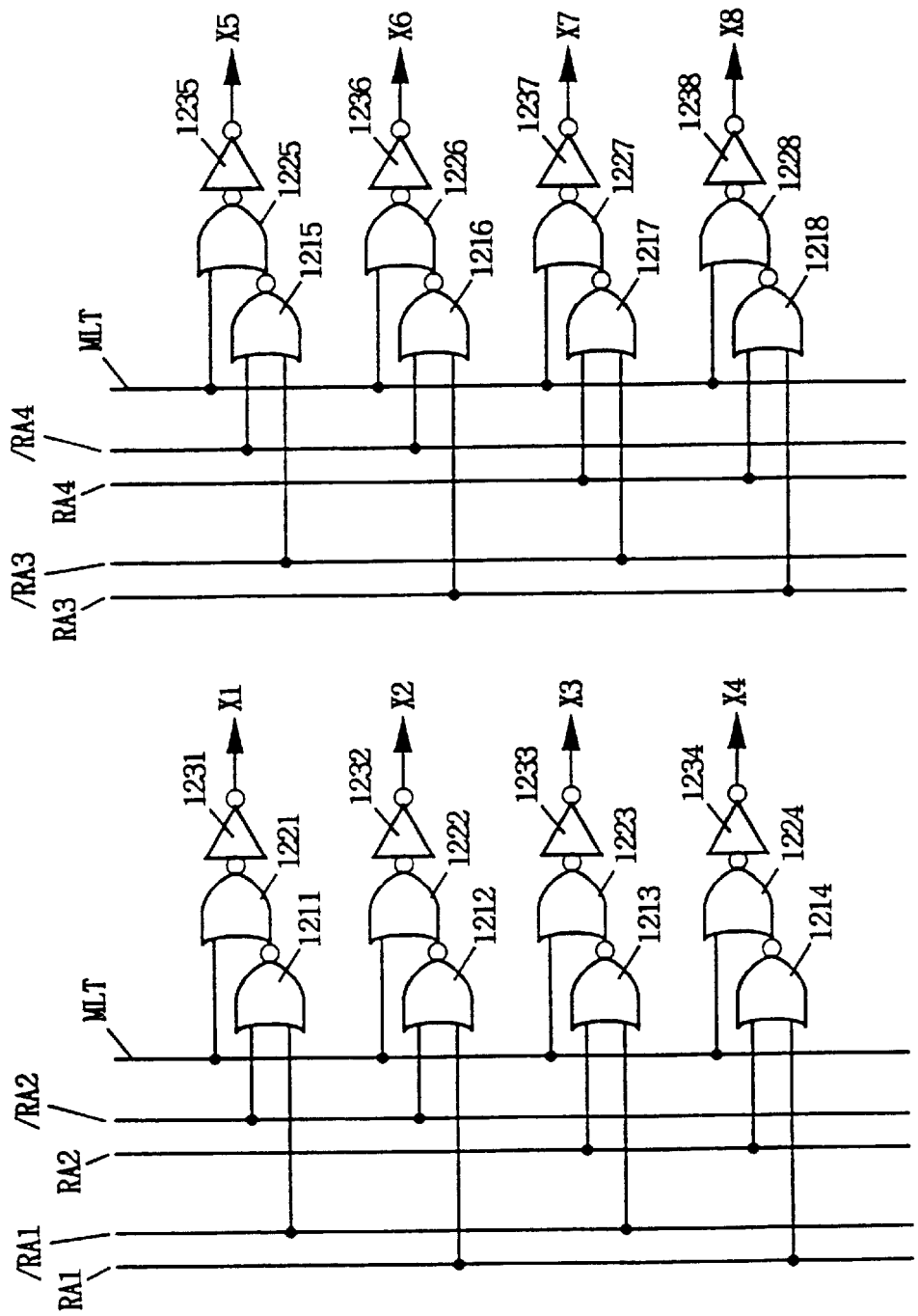
FIG. 8 is a circuit diagram showing a specific structure of the row predecoder of FIGS. 6 and 7.
Figure 40:
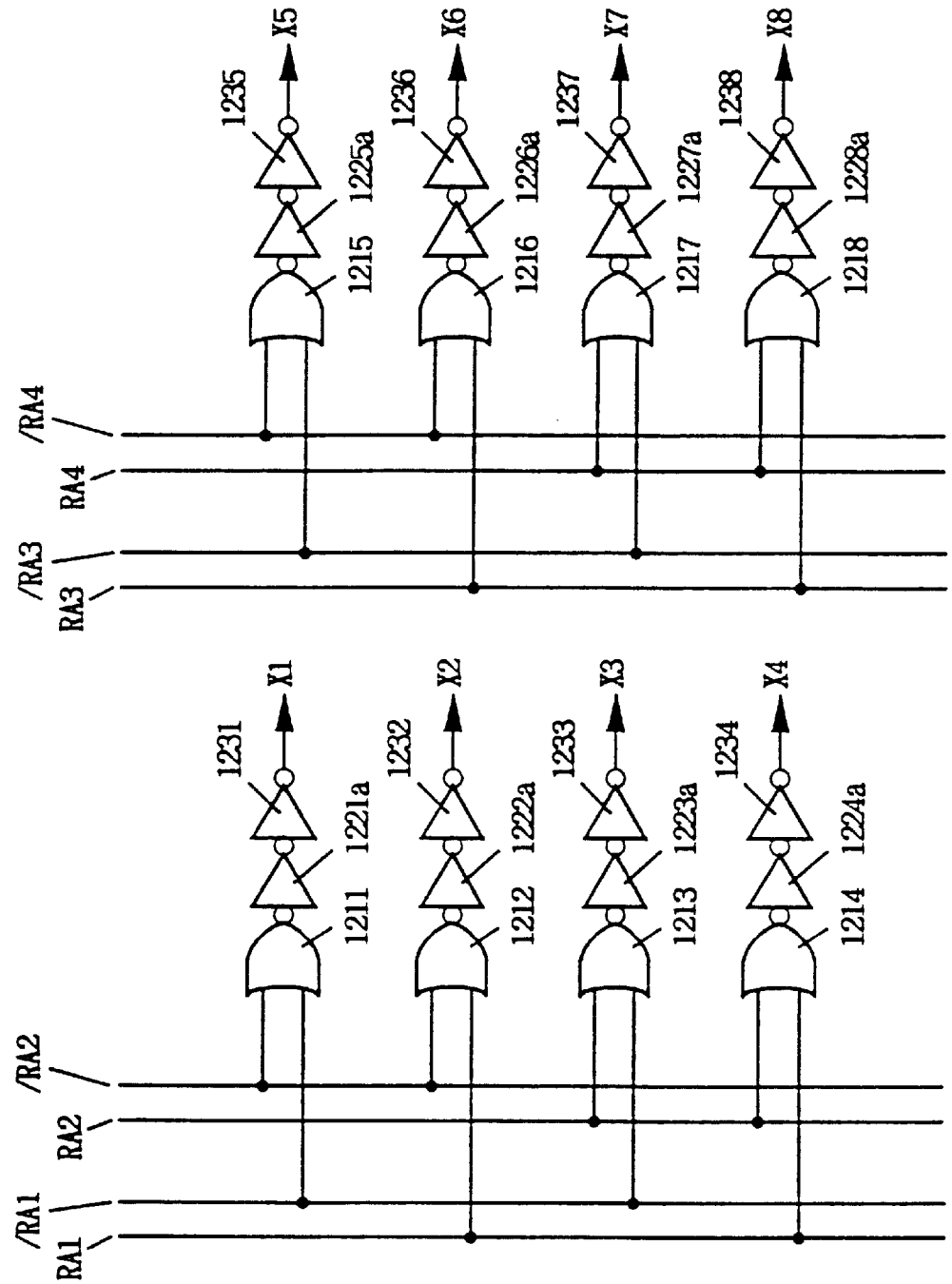
FIG. 40 is a circuit diagram showing a specific structure of the row predecoder of FIG. 39.

Referring to FIG. 8, row predecoder 121 includes a plurality of NOR gates 1211–1218 and 1221–1228, and a plurality of inverters 1231–1238. Each of NOR gates 1211–1214 receives a row address signal RA1 or /RA1 and a row address signal RA2 or /RA2. For example, NOR gate 1211 receives row address signals /RA1 and /RA2. Each of NOR gates 1215–1218 receives a row address signal RA3 or /RA3, and a row address signal RA4 or /RA4. For example, NOR gate 1215 receives row address signals /RA3 and /RA4. Each of NOR gates 1221–1224 receives multi-selection signal MLT and an output signal of a corresponding NOR gate. For example, NOR gate 1221 receives multi-selection signal MLT and an output signal of NOR gate 1211. Each of NOR gate 1225–1228 receives a multi-selection signal MLT and an output signal of a corresponding NOR gate. For example, NOR gate 1225 receives multi-selection signal MLT and an output signal of NOR gate 1215. Inverters 1231–1238 invert respective output signals of NOR gates 1221–1228 to generate predecode signals X1–X8. Row predecoder 121 has a structure basically similar to that of the conventional row predecoder 121a shown in FIG. 40 provided that NOR gates 1221–1228 are provided instead of inverters 1221a–1228a. NOR gates 1221a–1228 receive one common multi-selection MLT. Since a common multi-selection signal MLT of an L level is supplied to NOR gates 1221–1228 in a normal mode, NOR gates 1221–1228 function as an inverter. Therefore, row predecoder 121 operates in a conventional manner. In a test mode, multi-selection signal MLT of an H level is supplied to NOR gates 1221–1228, so that each of NOR gates 1221–1228 generates output signal of an L level independent of row address signals RA1, /RA1–RA4, /RA4. In this case, all predecoder signals X1–X8 are activated to an H level independent of row address signals RA1, /RA1–RA4, /RA4.

Figure 9:
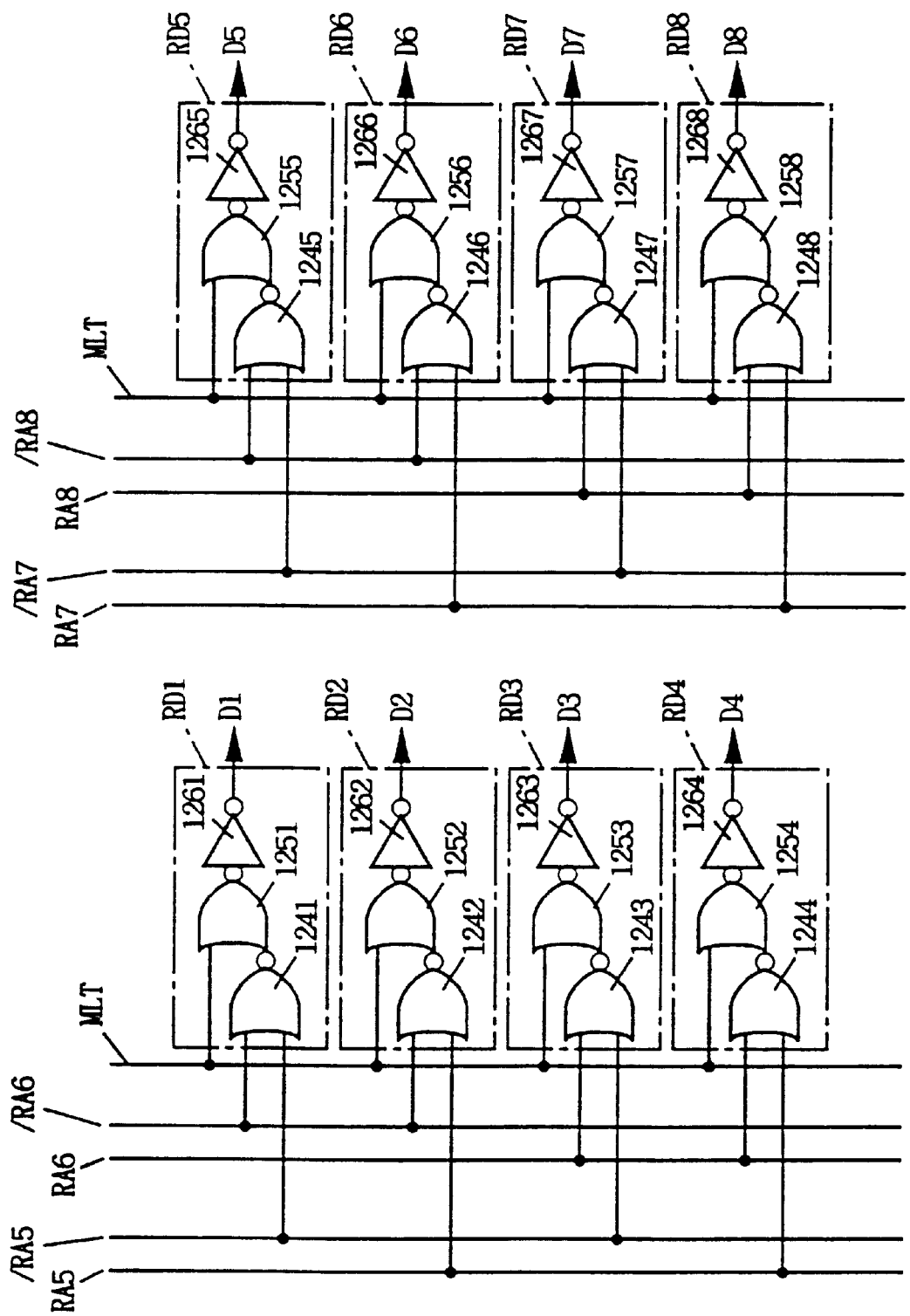
FIG. 9 is a circuit diagram showing a specific structure of a plurality of row decoder units in FIG. 6.

Referring to FIG. 9, each of row decode units RD1–RD8 includes two NOR gates (1241–1248, 1251–1258) and one inverter (1261–1268). For example, row decoder unit RD1 includes NOR gates 1241, 1251 and an inverter 1261. Each of NOR gates 1241–1244 receives a row address signal RA5 or /RA5, and a row address signal RA6 or /RA6. Each of NOR gates 1251–1258 receives multi-selection signal MLT and an output signal of a corresponding NOR gate. For example, NOR gate 1251 receives multi-selection signal MLT and an output signal of NOR gate 1241. Therefore, NOR gates 1251–1258 receive in common one multi-selection signal MLT. Each of inverters 1261–1268 inverts an output signal of NOR gates 1251–1258 to generate a corresponding decode signal. For example, inverter 1261 inverts an output signal of NOR gate 1251 to generate a corresponding decode signal D1.

Since multi-selection signal MLT of an L level is applied to NOR gates 1251–1258 in a normal mode, NOR gates 1251–1258 function as inverters. Therefore, only the row decoder unit to which row address signals of both the L level are supplied generates a decode signal of an H level. For example, when row address signals /RA5 and /RA6 both attain an H level, row decoder unit RD1 generates a decode signal D1 of an H level, and other row decoder units RD2–RD4 generate respective decode signals D2–D4 of an L level. When row address signals /RA7 and /RA8 both attain an L level, row decoder unit RD5 generates a decode signal D5 of an H level, and other row decoder units RD6–RD8 generate respective decode signals D6–D8 of an L level. In a test mode, multi-selection signal MLT of an H level is supplied to NOR gates 1251–1258, so that row decoder units RD1–RD8 all generate respective decode signals D1–D8 of an H level independent of row address signals RA5, /RA5–RA8, /RA8.

Figure 10:
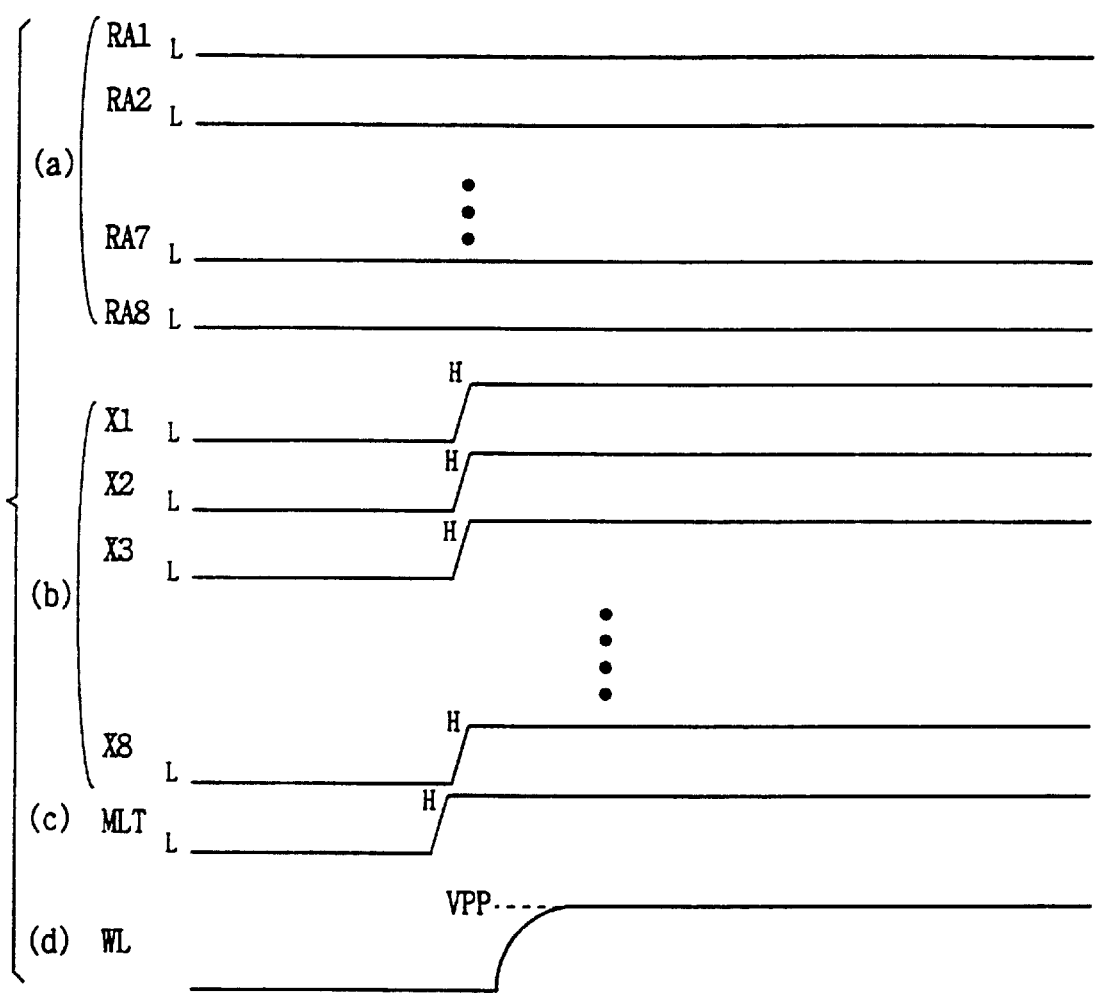
FIG. 10 is a timing chart showing an operation of the DRAM shown in FIGS. 1–9.

An operation of the DRAM of the above-described structure will be described hereinafter with reference to the timing chart of FIG. 10.

(1) Operation in Normal Mode

Since no potential is supplied to multi-selection pad 20 shown in FIG. 1 in a normal mode, multi-selection signal generation circuit 21 generates multi-selection signal MLT of an L level. This multi-selection signal MLT is supplied to row predecoder 121 and row decoder units RD–RDn in row decoder 12. The provision of a multi-selection signal MLT of an L level causes row predecoder 121 and row decoder units RD1–RDn to operate in a general manner. More specifically, row predecoder 121 responds to row address signals RA1, /RA1, RA2 and /RA2 to activate any of predecode signals X1–X4 to an H level. Row predecoder 121 also responds to row address signals RA3, /RA3, RA4, and /RA4 to activate any of predecode signals X5–X8 to an H level.

In row decoder units RD1–RD8, any of decode signals D1–D8 is activated to an H level in response to row address signals RA5, /RA5–RA8, /RA8. As a result, four of word drivers WD11–WD14, WD21–WD24, and WDn1–Wdn4 to attain a state that allows activation. Among these four word drivers, only the word driver receiving predecode signals of an H level is activated. Therefore, only one word line WL in memory cell array 11 is driven.

(2) Operation of Test Mode

In a test mode, ground potential GND is supplied to multi-selection pad 20, whereby multi-selection signal generation circuit 21 provides a multi-selection signal MLT of an H level. This multi-selection signal MLT is applied to row predecoder 121 and row decoder units RD1–RDn in row decoder 12. In response to multi-selection signal MLT of an H level, row predecoder 121 activates all predecode signals X1–X8 to an H level irrespective of row address signals RA1, /RA1–RA4, /RA4. In response to multi-selection signal MLT of an H level, row decoder units RD1–RDn activate all decode signals D1–Dn to an H level irrespective of row address signals RA5, /RA5–RA8, /RA8. Therefore, all word drivers WD11–WD14, WD21–WD24, and WDn1–WDn4 are activated, whereby all word lines WL are driven.

The transition of multi-selection signal MLT to an H level from an L level shown in FIG. 10(c) causes all predecode signals X1–X8 to be pulled up to an H level from an L level as shown in FIG. 10(b) independent of row address signals RA1–RA8 shown in FIG. 10(a). The potential of all word lines is boosted to the level of boosted potential VPP as shown in FIG. 10(d). Therefore, a high voltage is applied to gate oxide film 1123 of access transistor 112 shown in FIG. 4, whereby a stress is applied on access transistor 112.

According to the first embodiment, all the word lines are activated at the same time in a test mode. Therefore, the acceleration testing with respect to an access transistor can be carried out in a short time period. Furthermore, the above-described word line multi-selection can be implemented with a simple structure since one multi-selection signal MLT is supplied to a row decoder 12 which drives all word lines WL in a test mode. More specifically, NOR gates 1221–1228 receiving one multi-selection signal MLT in common are provided in row predecoder 121, and NOR gates 1251–1258 receiving one multi-selection signal MLT in common are provided in row decoder units RD1–RD8. Thus, word line multi-selection is possible in a test mode by slightly modifying the structure of a conventional implement.

Figure 41:
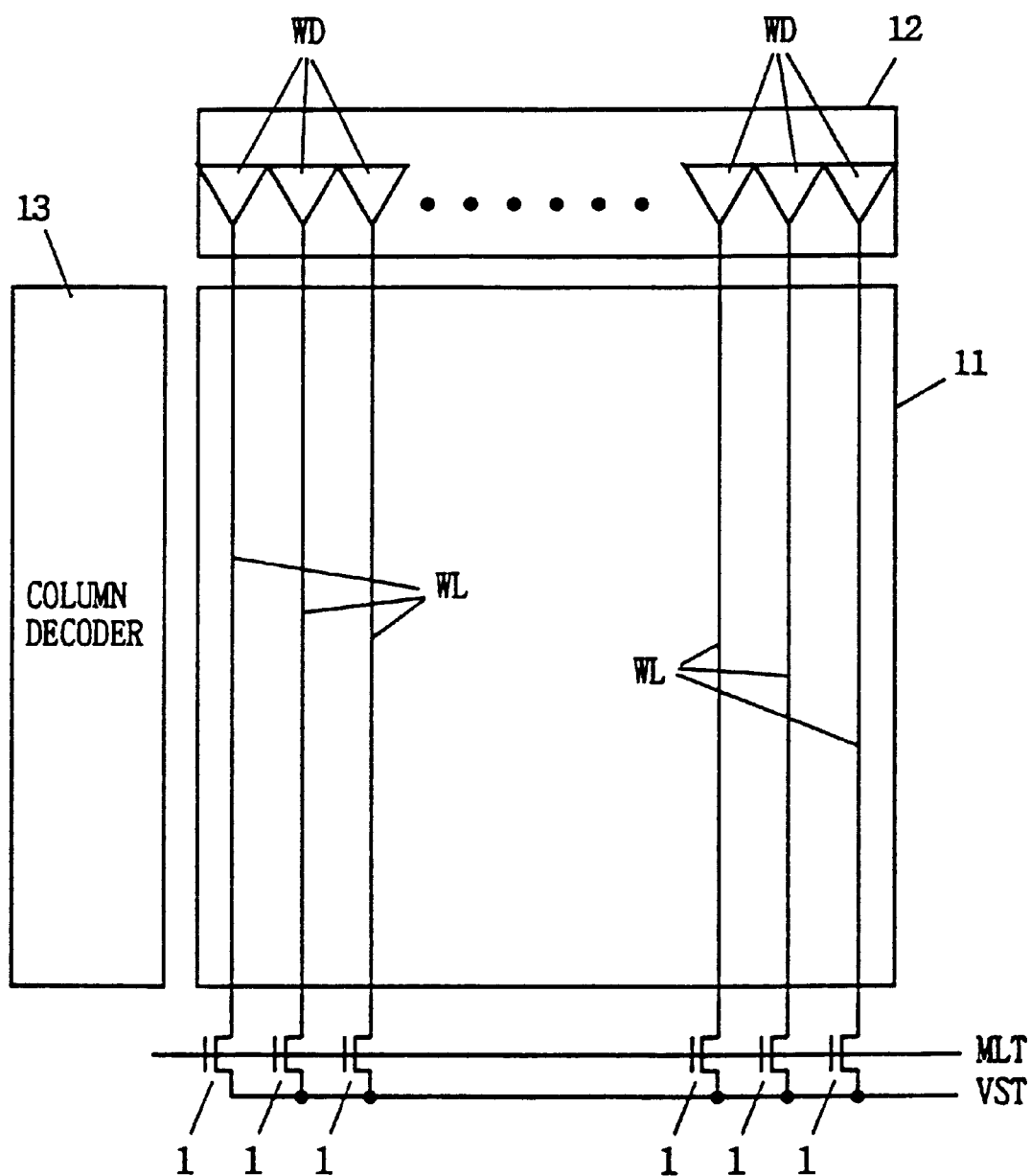
FIG. 41 is a block diagram showing a structure of an DRAM shown in FIG. 3 in "IEDM93, DIGEST" pp. 639–642.
Figure 42:
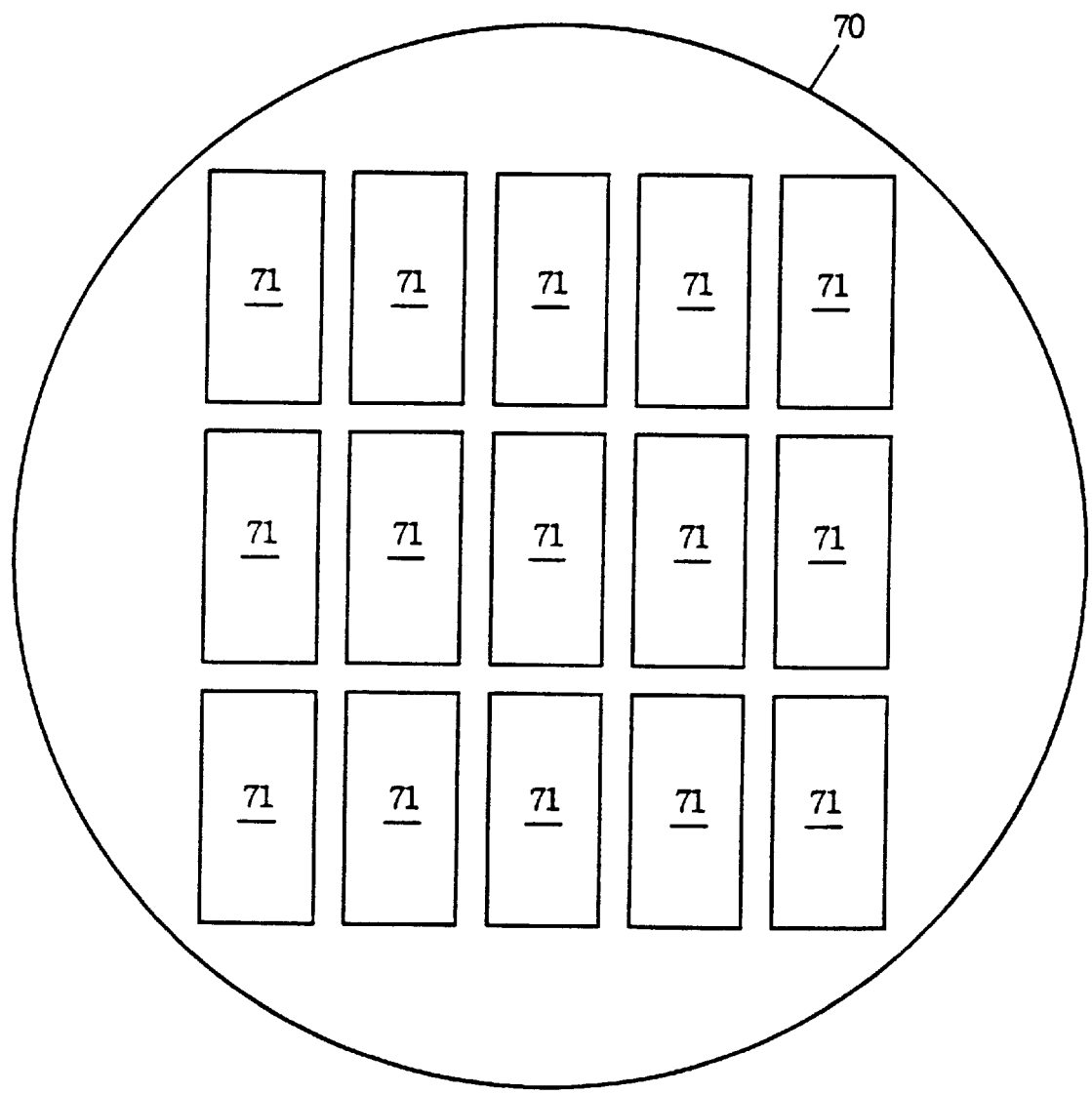
FIG. 42 is a plan view of a semi-finished product for a conventional integrated semiconductor device having a plurality of semiconductor chips formed on a semiconductor wafer.
Figure 43:
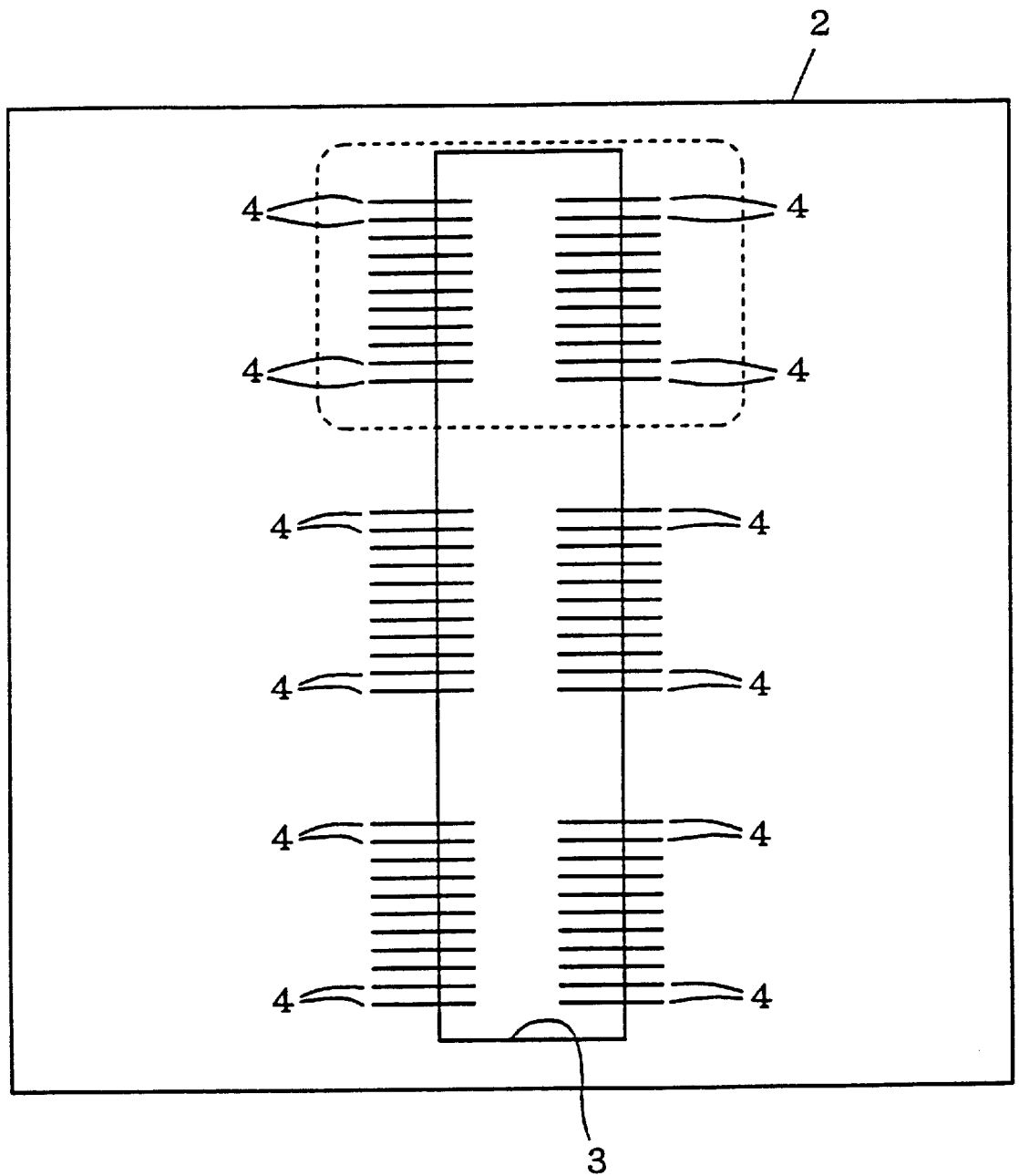
FIG. 43 is a plan view of a probe card for testing the semiconductor chips of FIG. 42 on a wafer.

It is noted that NOR gates 1221–1228 and 1251–1258 can be formed with sufficient margin in contrast to the structure shown in FIG. 41 in which a transistor is provided for multi-selection corresponding to each word line. This margin is due to the great pitch of transistors in row decoder 12 in contrast to the extremely small pitch of the word lines. The possibility of these newly added NOR gates 1221–1228, 1251–1258 being degraded or damaged is extremely small. The DRAM can be operated stably. Furthermore, since power supply potential VCC is supplied with no provision of a boosted potential such as an in the transistor 1 of FIG. 41, there is almost no possibility of these NOR gates 1221–1228, 1251–1258 being damaged.

Second Embodiment

In the structure of the previous first embodiment, it is possible to provide a multi-selection signal MLT of an H level to row decoder 12, not continuously, but intermittently, in a test mode. More specifically, the provision of a multi-selection signal alternately driven to an H and an L level at a predetermined cycle causes an AC stress to be applied on a word line. An AC stress is an acceleration test that applies a stress on a word line intermittently by alternate active/inactive states of a word line. However, the activation of all word lines at the same time is significantly time-consuming since each its word line has a parasitic capacitance of a pF order. It was therefore difficult to effectively carry out an acceleration testing of an AC stress in the structure of the first embodiment.

Figure 11:
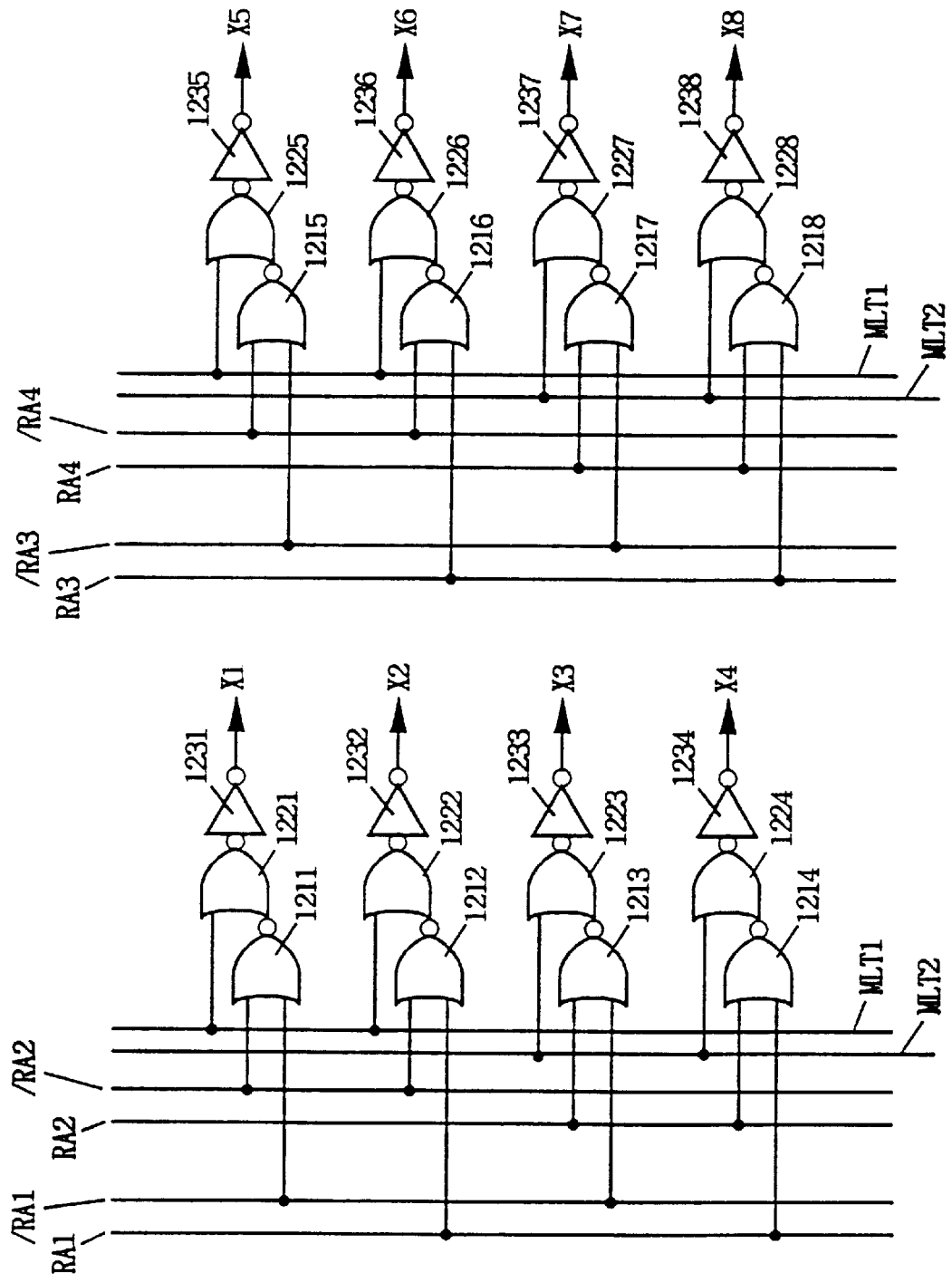
FIG. 11 is a circuit diagram showing a specific structure of a row predecoder in an DRAM according to a second embodiment of the present invention.

FIG. 11 is a circuit diagram showing a specific structure of a predecoder of an DRAM according to a second embodiment of the present invention that can solve the above problem.

Figure 26:
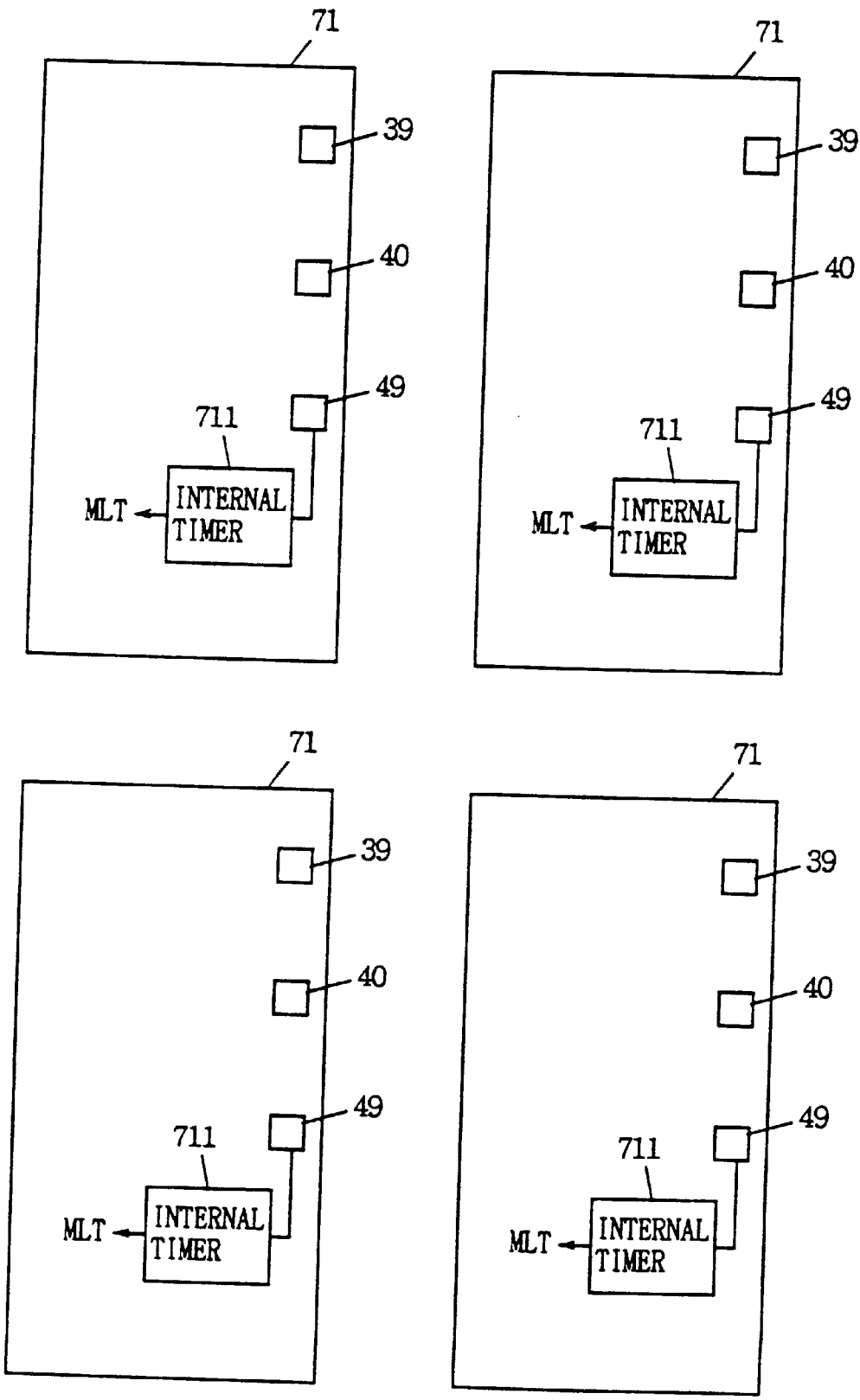
FIG. 26 is a diagram for describing the manner of testing semiconductor chips in a wafer state which do not have the boosted power supply pads of FIG. 24.
Figure 27:
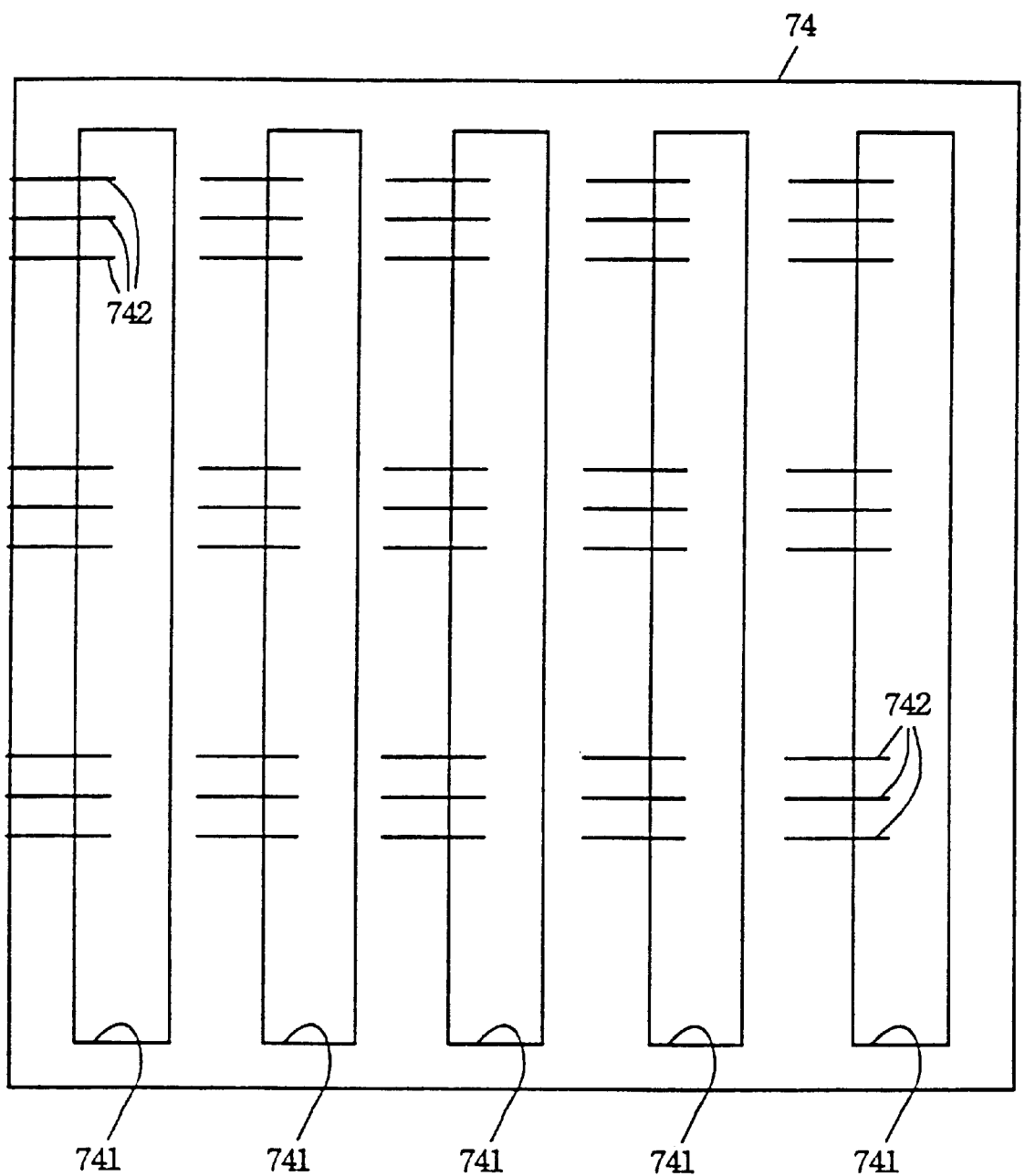
FIG. 27 is a plan view of a probe card used for testing the semiconductor chip in FIG. 26 in a wafer state.

This row predecoder 123 is used instead of row predecoder 121 shown in FIGS. 26 and 27. Referring to FIG. 11, row predecoder 123 receives two multi-selection signals MLT1 and MLT2 in contrast to row predecoder 121 shown in FIG. 8. One multi-selection signal MLT1 is applied in common to NOR gates 1221–1222, 1225, and 1226. The other multi-selection signal MLT2 is applied in common to NOR gates 1223, 1224, 1227 and 1228.

Figure 12:
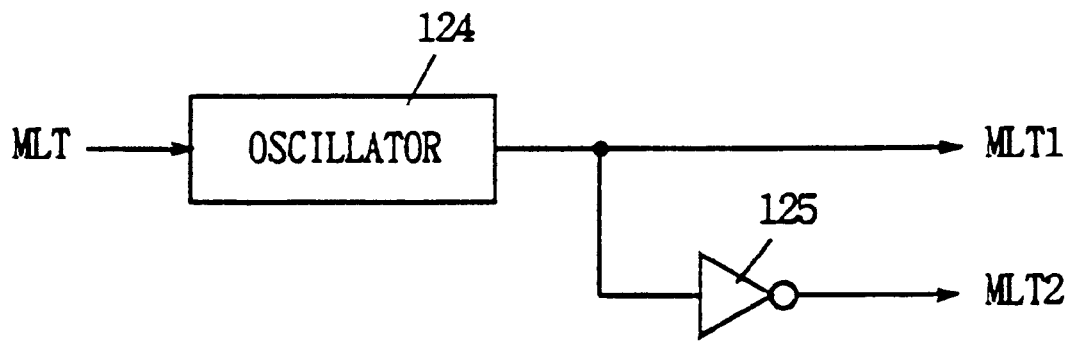
FIG. 12 is a block diagram showing a circuit for generating two multi-selection signals of FIG. 11.

FIG. 12 shows a circuit for generating multi-selection signals MLT1 and MLT2. Referring to FIG. 12, row predecoder 123 further includes an oscillator 124 responsive to multi-selection signal MLT applied from multi-selection signal generation circuit 21 to generate a multi-selection signal MLT1 alternating between an H level and an L level, and an inverter 125 for inverting a generated multi-selection signal MLT1 to provide a multi-selection signal MLT2. Therefore, when a multi-selection signal MLT of an H level is provided to oscillator 124, a multi-selection signal MLT1 of a predetermined cycle is generated together with a multi-selection signal MLT2 complementary to multi-selection signal MLT1. Therefore, multi-selection signal MLT2 attains an L level when multi-selection signal MLT1 attains an H level. Here, only predecode signals X1, X2, X5 and X6 attain an H level. In contrast, multi-selection signal MLT2 attains an H level when multi-selection signal MLT1 attains an L level. In this case, only predecode signals X3, X4, X7 and X8 attain an H level.

A half of the word lines are activated in response to predecode signals X1, X2, X5 and X6 of an H level, and the remaining half word lines are driven in response to predecode signals X3, X4, X7, and X8 of an H level. In the second embodiment, word lines WL are divided into two groups of word lines. Therefore, the number of word lines driven at the same time is reduced.

This means that the capacitance of the word lines that must be charged/discharged at the same time is reduced in comparison with the case when all the word lines are alternately activated/inactivated. An AC stress can be applied on word lines effectively.

Figure 13:
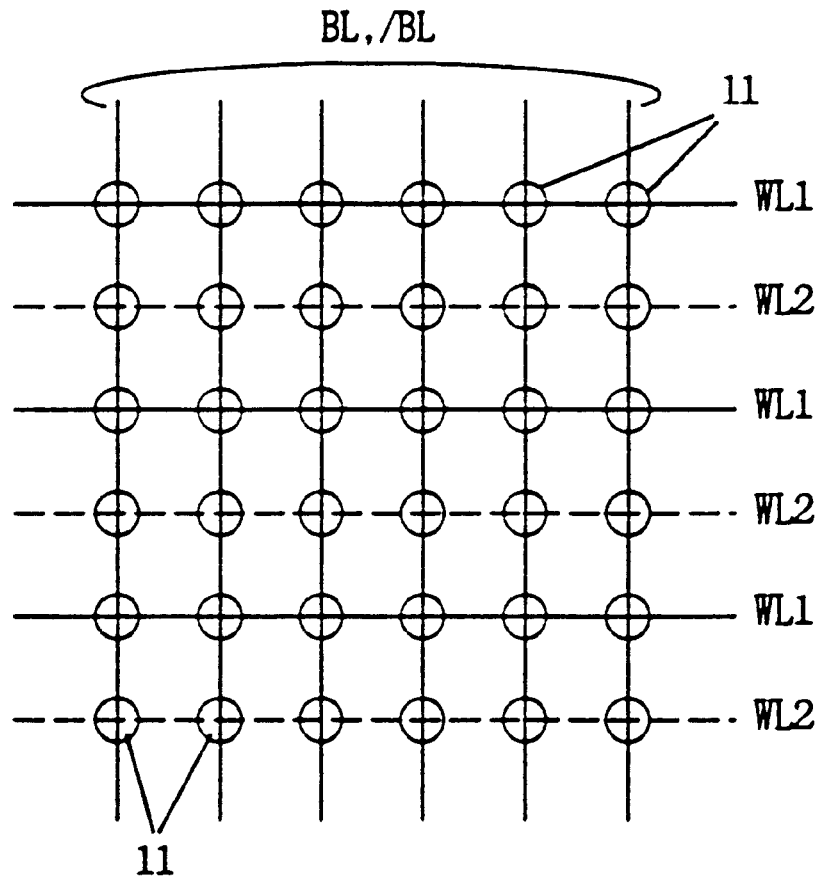
FIG. 13 is a diagram for describing the manner of word lines driven in a divisional manner for every group according to the second embodiment shown in FIGS. 11 and 12.

Word lines WL1 and WL2 driven at the same time are preferably arranged in an alternating manner as shown in FIG. 13. In FIG. 13, one half of word lines WL1 forms one group, and the other half of word lines WL2 forms the other group. For example, multi-selection signal MLT1 of an H level causes the drive of only word line WL1, and multi-selection signal MLT2 of an H level causes the drive of only word line WL2.

When acceleration testing of the data holding characteristics of dynamic memory cell 111 is carried out, desired data is written into memory cell 111 of interest. Then, a corresponding bit line is intermittently amplified in a direction opposite to that of the data of the relevant memory cell while the corresponding word line is still inactive. For example, when data of an H level is written into memory cell 111 of interest, the potential of the corresponding bit line is intermittently amplified to an L level. This induces leakage of data from memory cell 111 to allow measurement of the time that memory cell 111 eventually effects data error in an accelerated manner.

Acceleration testing can be carried out in a more severe condition. In this case, memory cell 111 of interest has a desired data written therein, and a memory cell 111 adjacent thereto has opposite data written therein. When the word line corresponding to the peripheral memory cell 111 is driven intermittently, leakage from memory cell 111 of interest to the peripheral memory cell 111 is accelerated. It is possible to accelerate leakage towards a peripheral memory cell in addition to leakage towards a bit line.

Since it is necessary to drive the word line intermittently corresponding to a peripheral memory cell in such an acceleration test, this testing will be time consuming in a structure such as that shown in the first embodiment where all word lines are driven. In the present second embodiments, two word lines adjacent to each other are driven alternately. Therefore, acceleration testing of data leakage with respect to a plurality of memory cells 111 can be carried out simultaneously under such a severe status. Thus, the time required for testing can be reduced significantly.

The present invention is not limited to the second embodiment in which multi-selection signals MLT1 and MLT2 are generated by oscillator 114, and multi-selection signals MLT1 and MLT2 may be provided from an external source instead of from oscillator 124. Since a row address signal is neglected in a test mode, a structure may be employed in which multi-selection signals MLT1 and MLT2 are selectively activated in response to a row address strobe signal /RAS.

Third Embodiment

A third embodiment of the present invention is directed to apply a stress on a dielectric film 116 of cell capacitor 113 in addition to the stress applied on gate oxide film 1123 of access transistor 122 shown in FIG. 4.

Figure 14:
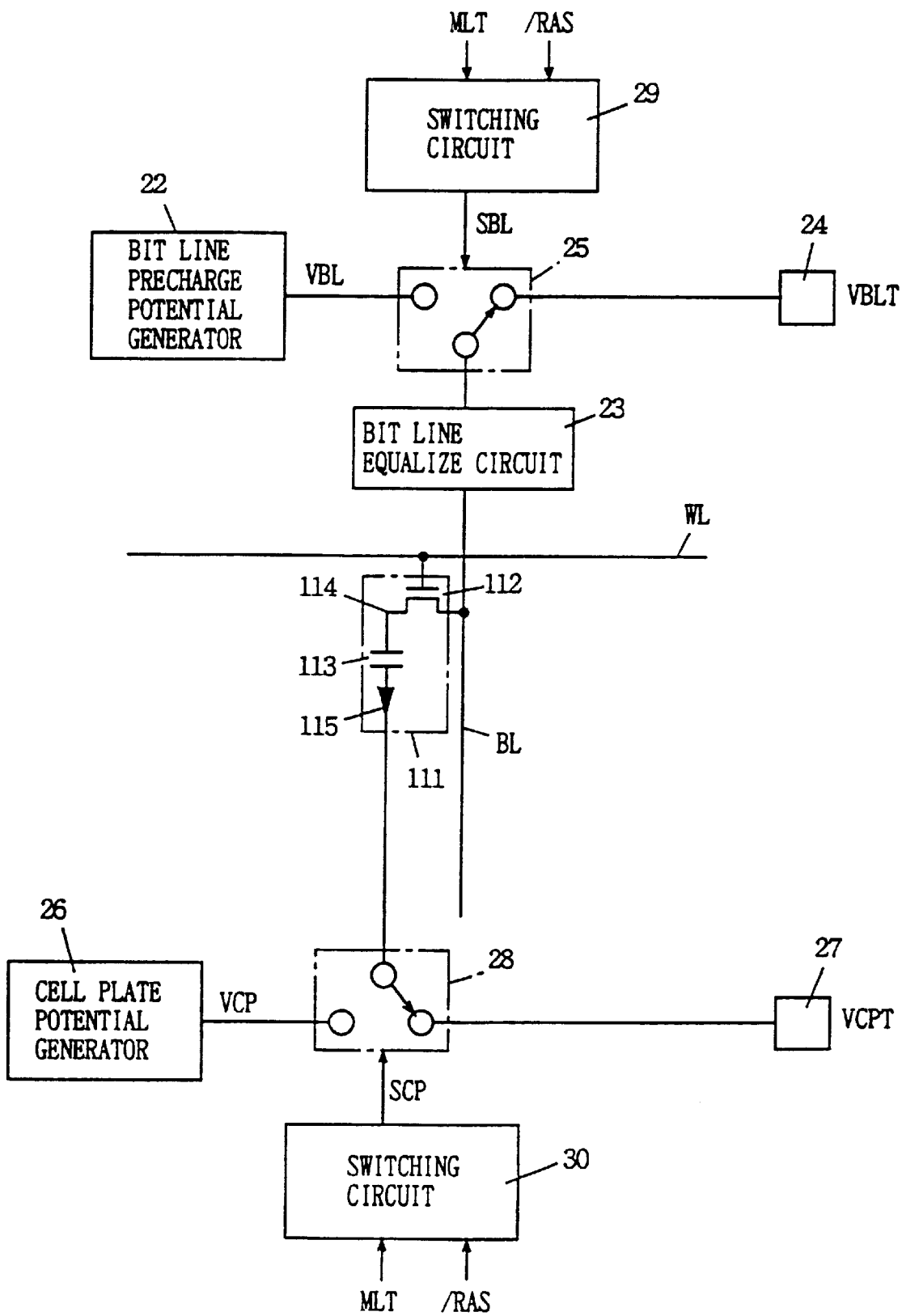
FIG. 14 is a block diagram showing a structure of the main components of an DRAM according to a third embodiment of the present invention.

FIG. 14 is a block diagram showing the main components of a DRAM according to the third embodiment. In addition to the structure of the first embodiment, the DRAM of the third embodiment further includes test pads 24 and 27, selectors 25 and 28, switching circuits 29 and 30, and a cell plate potential generator 26. A desired bit line test potential VBLT is applied to test pad 24. A desired cell plate test potential VCPT is applied to test pad 27. Selector 25 responds to bit line select signal SBL from switching circuit 29 to selectively supply bit line precharge potential VBL or bit line test potential VBLT to bit line equalize circuit 23. Switching circuit 29 responds to row address strobe signal /RAS to supply bit select signal SBL to selector 25. In response, selector 25 is switched.

Cell plate potential generator 26 generates a predetermined cell plate potential VCP (for example, intermediate potential VCC/2). Selector 28 responds to a cell plate select signal SCP from switching circuit 30 to selectively supply cell plate potential VCP or cell plate test potential VCPT to a cell plate 115 of memory cell 111. Switching circuit 30 responds to row address strobe signal /RAS to supply cell plate select signal SCP to selector 28. In response, selector 28 is switched.

In a normal mode, multi-selection signal MLT of an L level is applied to switching circuits 29 and 30. Switching circuit 29 controls selector 25 so as to select bit line precharge potential VBL independent of row address strobe signal /RAS. Therefore, bit line precharge potential VBL generated by precharge potential generator 22 is provided to storage node 114 of capacitor 113 via selector 25, bit line equalize circuit 23, bit line BL and access transistor 112. Switching circuit 30 controls selector 28 so as to select cell plate potential VCP. Therefore, cell plate potential VCP generated by cell plate potential generator 26 is provided to cell plate 115 of cell capacitor 113 via selector 28. In this case, the DRAM carries out a normal operation.

Figure 15:
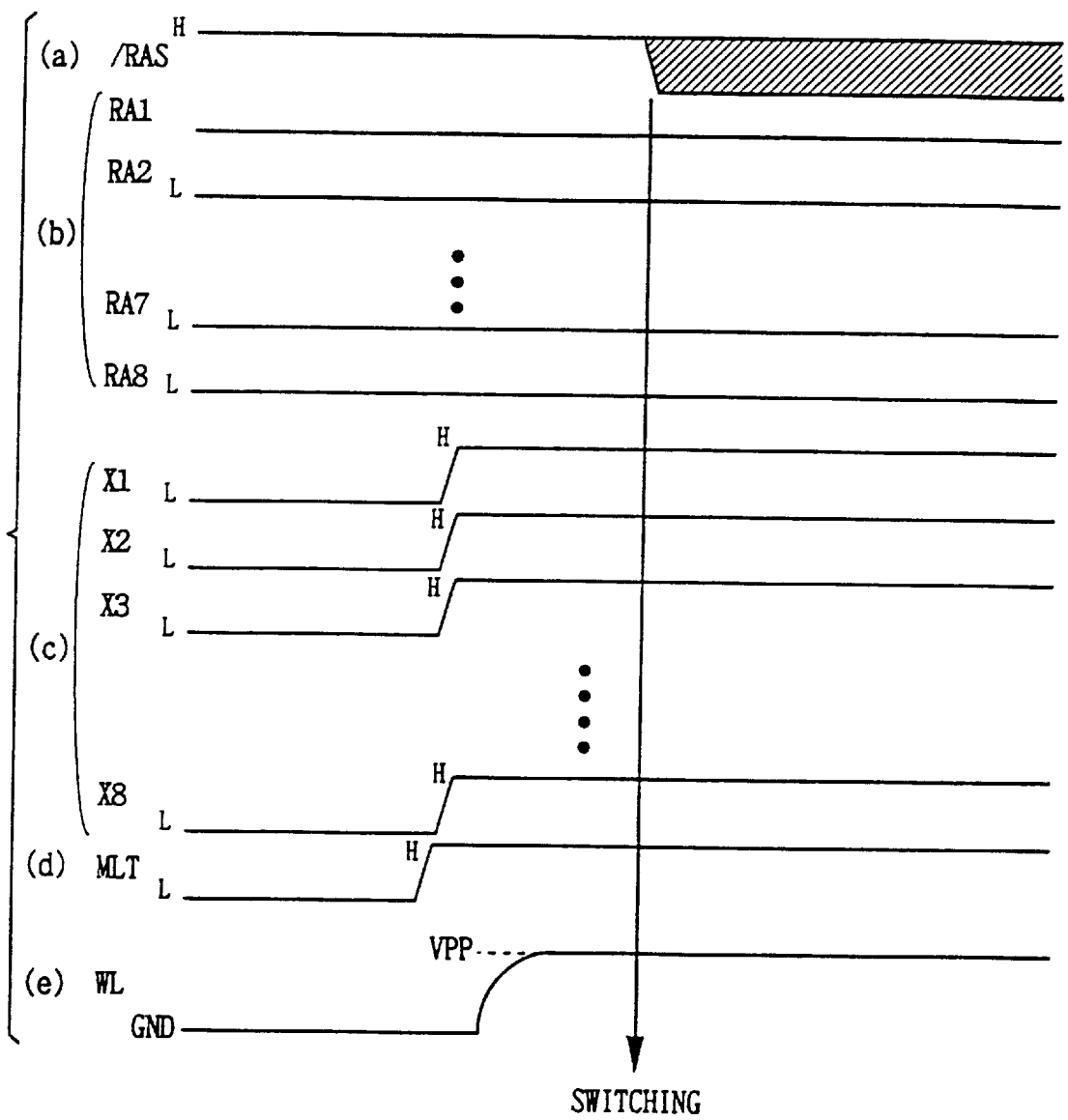
FIGS. 15 and 16 are timing charts showing examples of operations of the DRAM shown in FIG. 14.

When multi-selection signal MLT is pulled up to an H level from an L level as shown in FIG. 15(d), switching circuit 29 responds to row address strobe signal /RAS to control selector 25 so as to select bit line precharge potential VBL or bit line test potential VBLT. When row address strobe signal /RAS attains an L level, for example, bit line test potential VBLT supplied to test pad 24 is selected. As a result, bit line test potential VBLT is supplied to storage node 114 of cell capacitor 113 via selector 25, bit line equalize circuit 23, bit line BL and access transistor 112. Switching circuit 30 responds to row address strobe signal /RAS to control selector 28 so as to select cell plate potential VCP or cell plate test potential VCPT. When row address strobe signal /RAS attains an L level, for example, cell plate test potential VCPT supplied to test pad 27 is selected. As a result, cell plate test potential VCPT is supplied to cell plate 115 of capacitor 113 via selector 28.

Row address strobe signal /RAS is used to control the switching of selectors 25 and 28 since all the word lines are driven independent of the row address signal in a test mode.

The method of applying a stress voltage to cell capacitor 113 includes a method of applying a high potential to storage node 114 and a low potential to cell capacitor 115, and a method of supplying a low potential to storage node 114 and a high potential to cell plate 115.

According to the third embodiment, a desired bit line test potential VBLT and a desired cell plate test potential VCPT can be applied to test pads 24 and 27, respectively. Therefore, a desired stress voltage can be applied to cell capacitor 113. The possibility of cell capacitor 113 being damaged due to the application of a stress voltage higher than the power supply potential can be eliminated according to the third embodiment in which the lowest required stress voltage of a level that does not damage cell capacitor 113 can be applied thereto.

The present invention is not limited to the third embodiment in which row address strobe signal /RAS for activating a chip in a normal mode is used as a switching signal for test potentials VBLT and VCPT, and another control signal may be used instead of or in addition to row address strobe signal /RAS.

Figure 16:
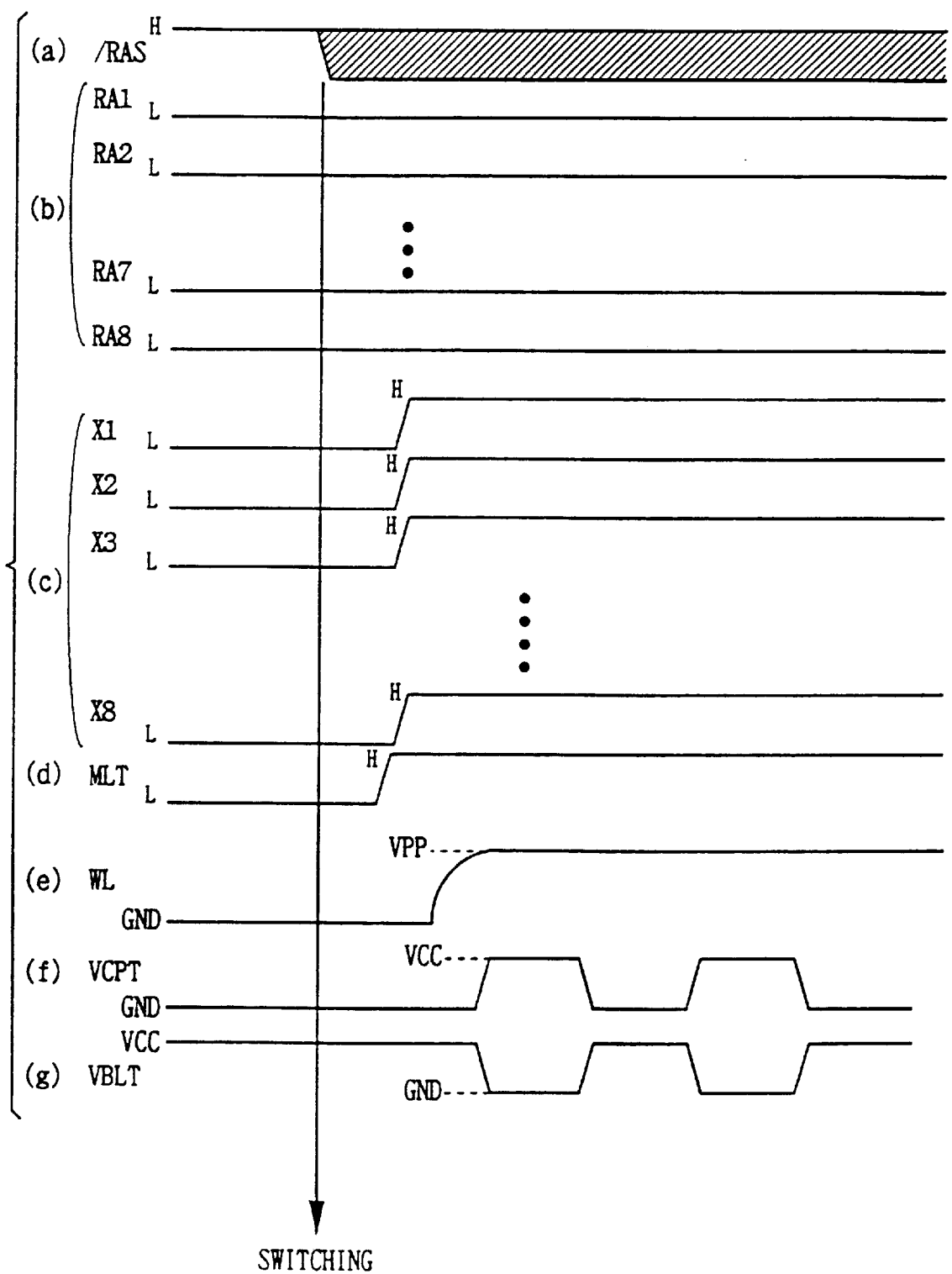

Furthermore, an AC stress can be applied to cell capacitor 113 by applying alternately cell plate test potential VCPT and bit line test potential VBLT to test pads 24 and 27 that is altered periodically between power supply potential VCC and ground GND as shown in (f) and (g) in FIG. 16. Alternate change in the polarity of the stress voltage on cell capacitor 113 causes a change in the gate-source voltage of access transistor 112. Therefore, the stress between the gate and source of access transistor 112 is further accelerated.

Fourth Embodiment

Figure 17:
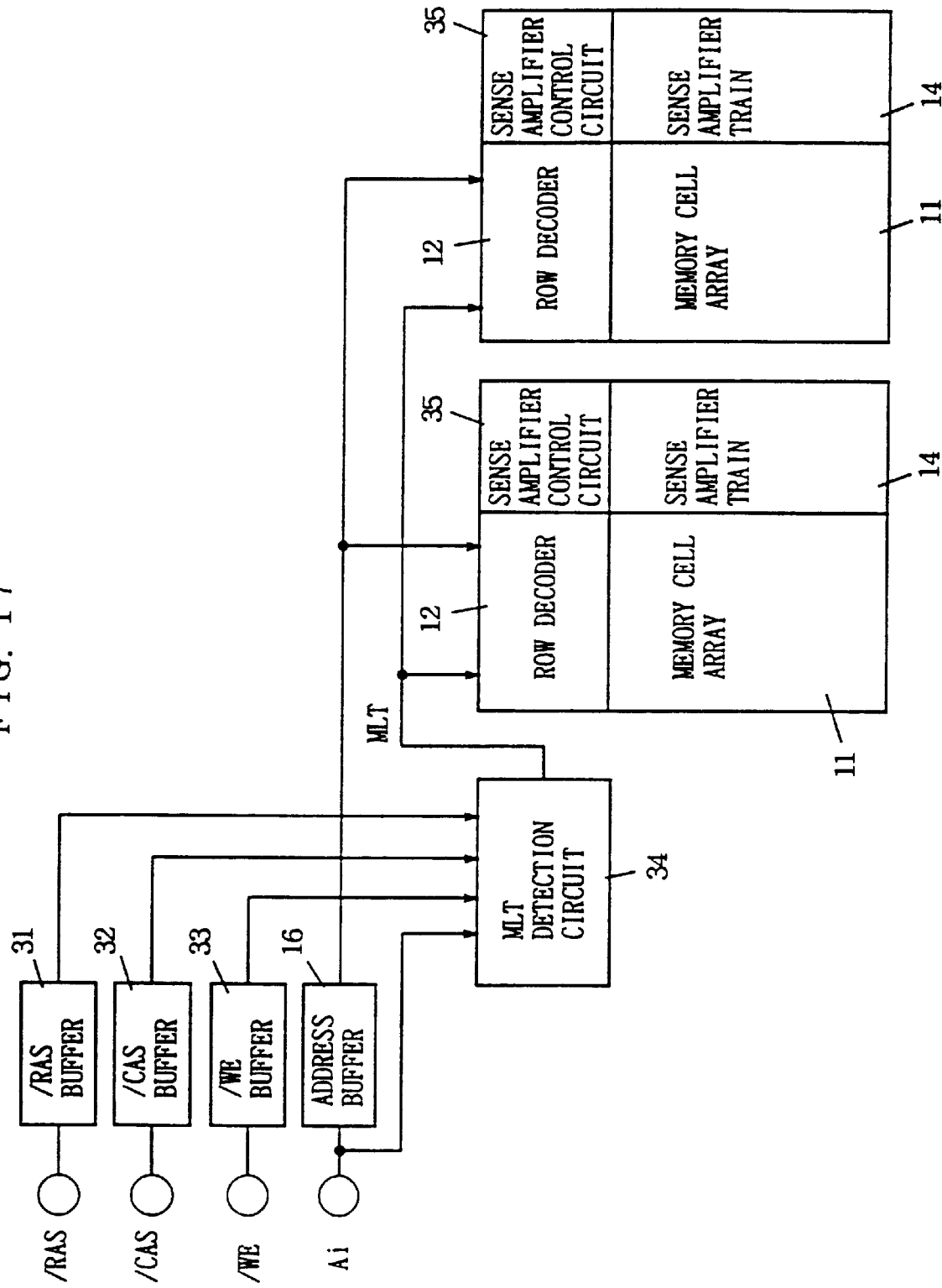
FIG. 17 is a block diagram showing a structure of the main components of a DRAM according to a fourth embodiment of the present invention.

Referring to FIG. 17, an DRAM of a fourth embodiment includes a multi-selection detection circuit 34. Multi-selection detection circuit 34 generates a multi-selection MLT of an L level in a normal mode which is provided to row decoder 12. Multi-selection detection circuit 34 generates a multi-selection signal MLT of an H level which is supplied to row decoder 12 when a super VCC higher than power supply potential VCC is applied to an address terminal thereof at the timing of a WCBR (/WE, /CAS before /RAS).

/RAS buffer 31 responds to external row address strobe signal /RAS to provide an internal row address strobe signal to multi-selection detection circuit 34. A /CAS buffer 32 responds to an external column address strobe signal /CAS to provide an internal column address strobe signal to multi-selection detection circuit 34. A /WE buffer 33 responds to an external write enable signal /WE to supply an internal write enable signal to multi-selection detection circuit 34. An address buffer 16 responds to an external address signal Ai to supply an internal row address signal to row decoder 12. A sense amplifier control circuit 35 controls a sense amplifier train 14 so as to amplify data from memory cell array 11.

Figure 18:
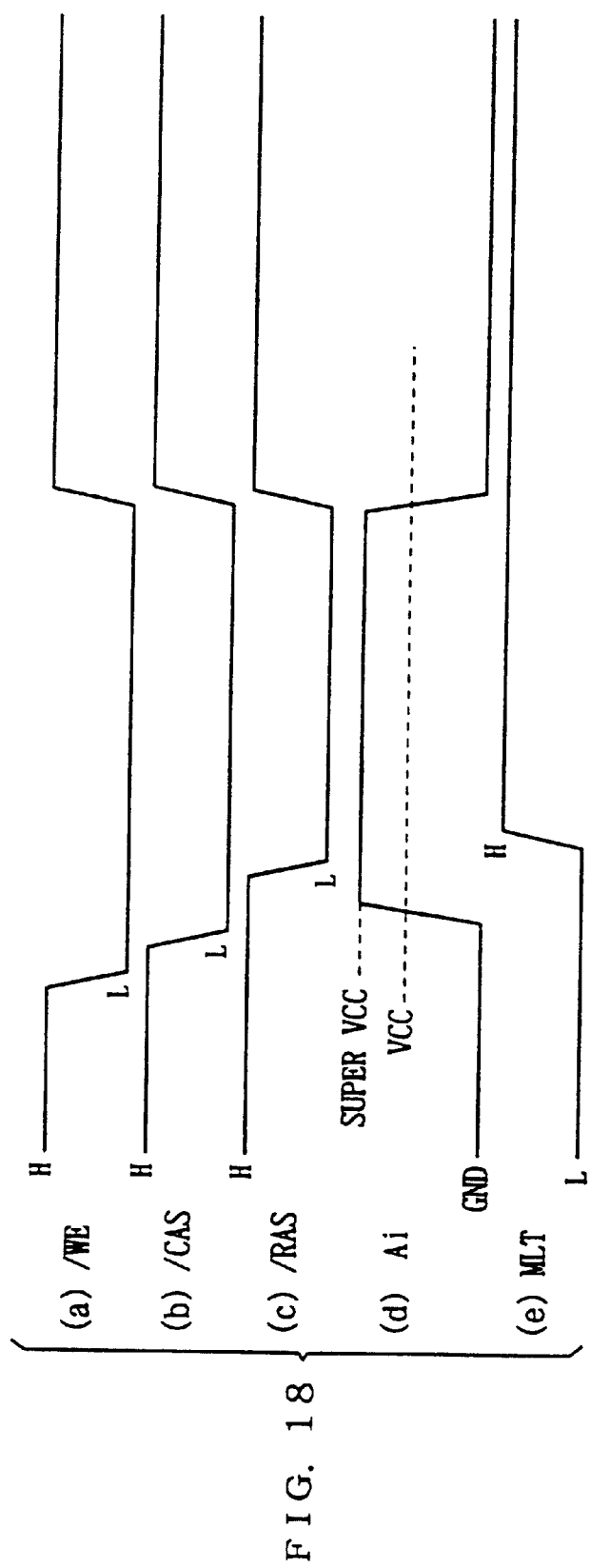
FIG. 18 is a timing chart showing an operation of the DRAM of FIG. 17.

FIG. 18 is a timing chart showing an operation of multi-selection detection circuit 34 of FIG. 17. Multi-selection detection circuit 34 attains a state that allows input of an address key when write enable signal /WE and column address strobe signal /CAS are both pulled down prior to the fall of row address strobe signal /RAS, i.e. when row address strobe signal /RAS, column address strobe signal /CAS and write enable signal /WE are applied in the timing of WCBR, as shown in (a)–(c) of FIG. 18. Then, when a super VCC higher than power supply potential VCC is supplied to the address terminal to which address signal Ai is to be applied as shown in (d), multi-selection detection circuit 34 activates multi-selection signal MLT to an H level as shown in (e). This multi-selection signal MLT of an H level is supplied to row decoder 12, whereby row decoder 12 drives all the word lines in memory cell array 11.

According to the fourth embodiment, multi-selection signal MLT is activated when an address key of super VCC is input at the timing of WCBR. Therefore, acceleration testing by such word line multi-selection can be carried out even after this DRAM is molded by resin and further packaged.

Fifth Embodiment

Figure 19:
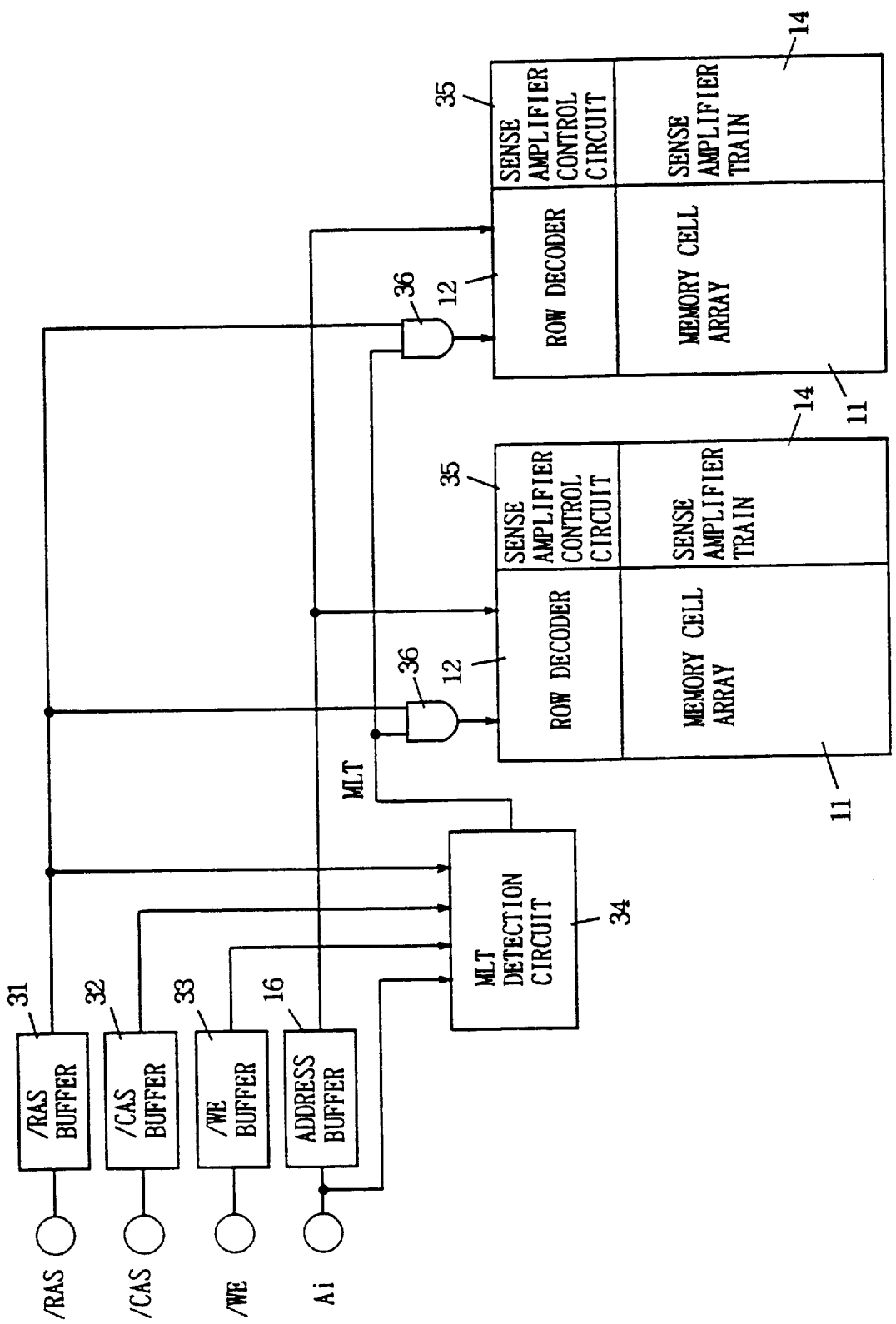
FIG. 19 is a block diagram showing a structure of the main components of a DRAM according to a fifth embodiment of the present invention.

Referring to FIG. 19, a DRAM of the fifth embodiment further comprises, in addition to the component shown in FIG. 17, AND circuits 36 provided corresponding to memory cell array 11. Each AND gate 36 responds to multi-selection signal MLT and an internal row address strobe signal to supply an output signal thereof to a corresponding row decoder 12.

Figure 20:
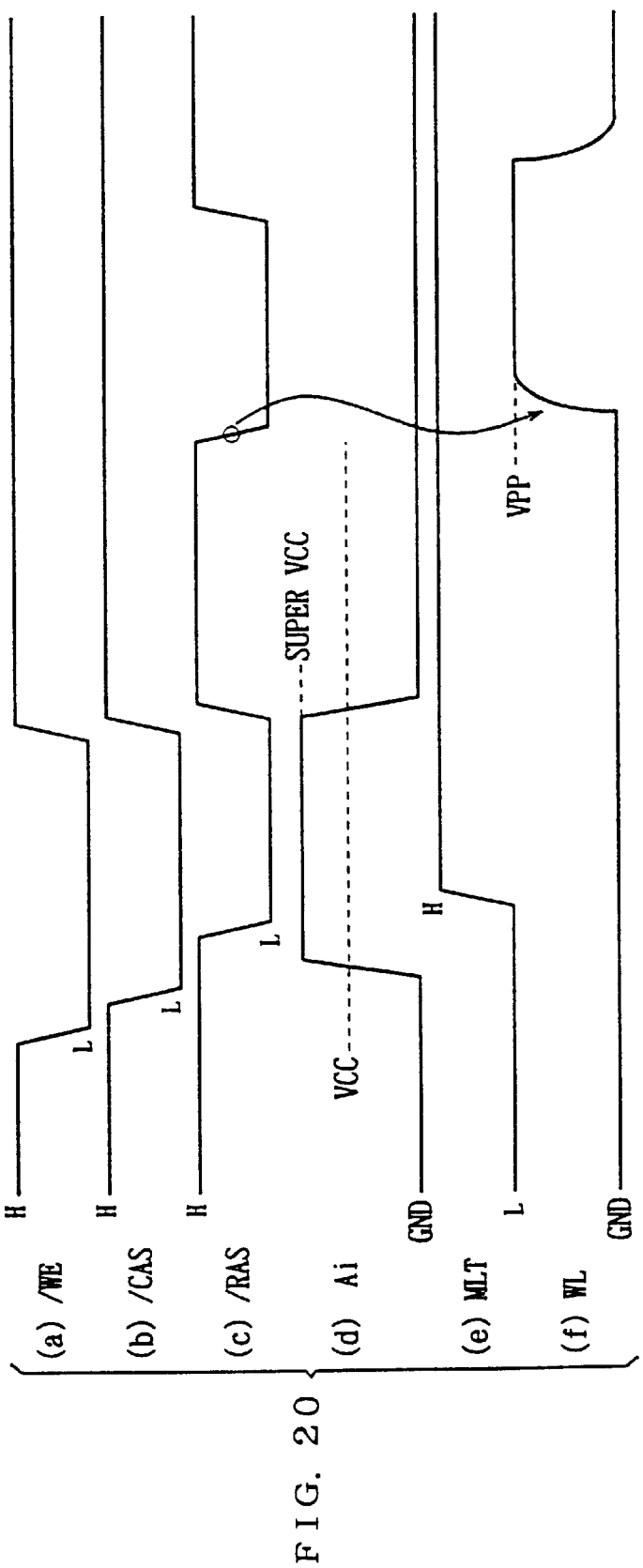
FIG. 20 is a timing chart showing an operation of the DRAM of FIG. 19.

Therefore, even when an address key of super VCC is input at a WCBR timing as shown in (a)–(d) of FIG. 20 to cause activation of multi-selection signal MLT as shown in (e), the potential of word line WL is not immediately boosted as shown in (f). When multi-selection signal MLT is activated, and row address strobe signal /RAS is pulled down as shown in (c), the potential of word line WL is boosted to the level of boosted potential VPP.

According to the fifth embodiment, all word lines WL can be driven in response to a row address strobe signal /RAS in a test mode. Therefore, acceleration testing of a memory cell can be carried out at a desired timing.

Sixth Embodiment

Figure 21:
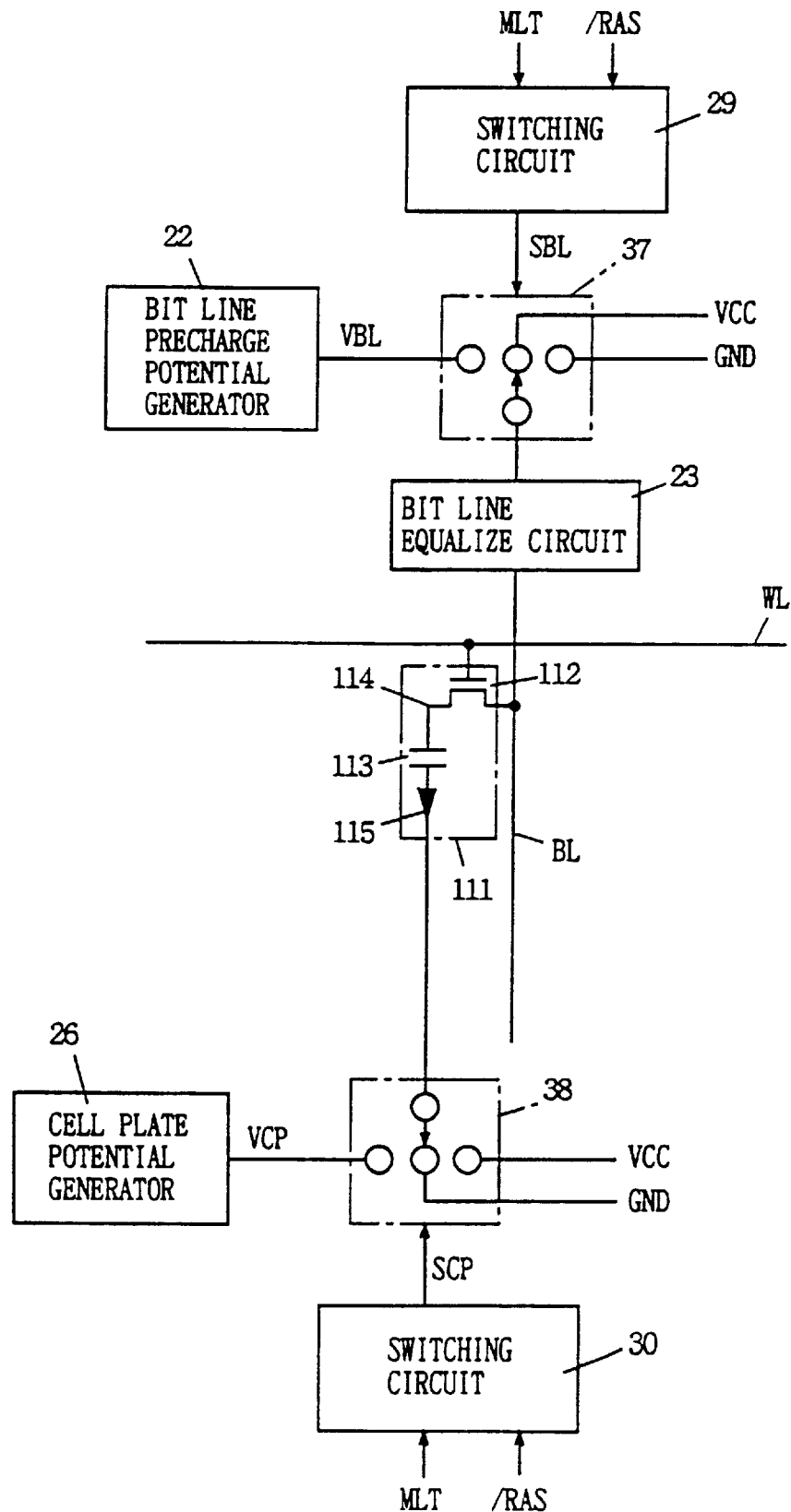
FIG. 21 is a block diagram showing a structure of the main components of a DRAM according to a sixth embodiment of the present invention.

Referring to FIG. 21, an DRAM of the sixth embodiment includes selectors 37 and 38 instead of selectors 25 and 28 shown in FIG. 14. Selector 37 is connected to, in addition to bit line precharge potential generator 22, a power supply node to which power supply potential VCC is supplied, and to a ground node to which ground potential GND is supplied. Selector 38 is connected to, in addition to cell plate potential generator 26, the power supply node and the ground node. Therefore, selector 37 responds to bit line select signal SBL from switching circuit 29 to selectively supply bit line precharge potential VBL, power supply potential VCC, and ground potential GND to bit line equalize circuit 23. Switching circuit 29 responds to multi-selection signal MLT and row address strobe signal /RAS to switch selector 37. A multi-selection signal MLT of an L level causes bit line precharge potential VBL to be supplied to bit line equalize circuit 23 independent of row address strobe signal /RAS. A multi-selection signal MLT of an H level and a row address strobe signal /RAS of an H level causes power supply potential VCC to be supplied to bit line equalize circuit 23. A multi-selection signal MLT of an H level and row address strobe signal /RAS of an L level causes ground potential GND to be supplied to bit line equalize circuit 23.

Selector 38 responds to cell plate select signal SCP from switching circuit 30 to selectively provide cell plate potential VCP, ground potential GND and power supply potential VCC to cell plate 115. When multi-selection signal MLT attains an L level, cell plate potential VCP is supplied to cell plate 115 independent of row address strobe signal /RAS. When multi-selection signal MLT and row address strobe signal /RAS both attain an H level, ground potential GND is supplied to cell plate 115. When multi-selection signal MLT attains an H level and address strobe signal /RAS attains an L level, power supply potential VCC is supplied to cell plate 115.

Figure 22:
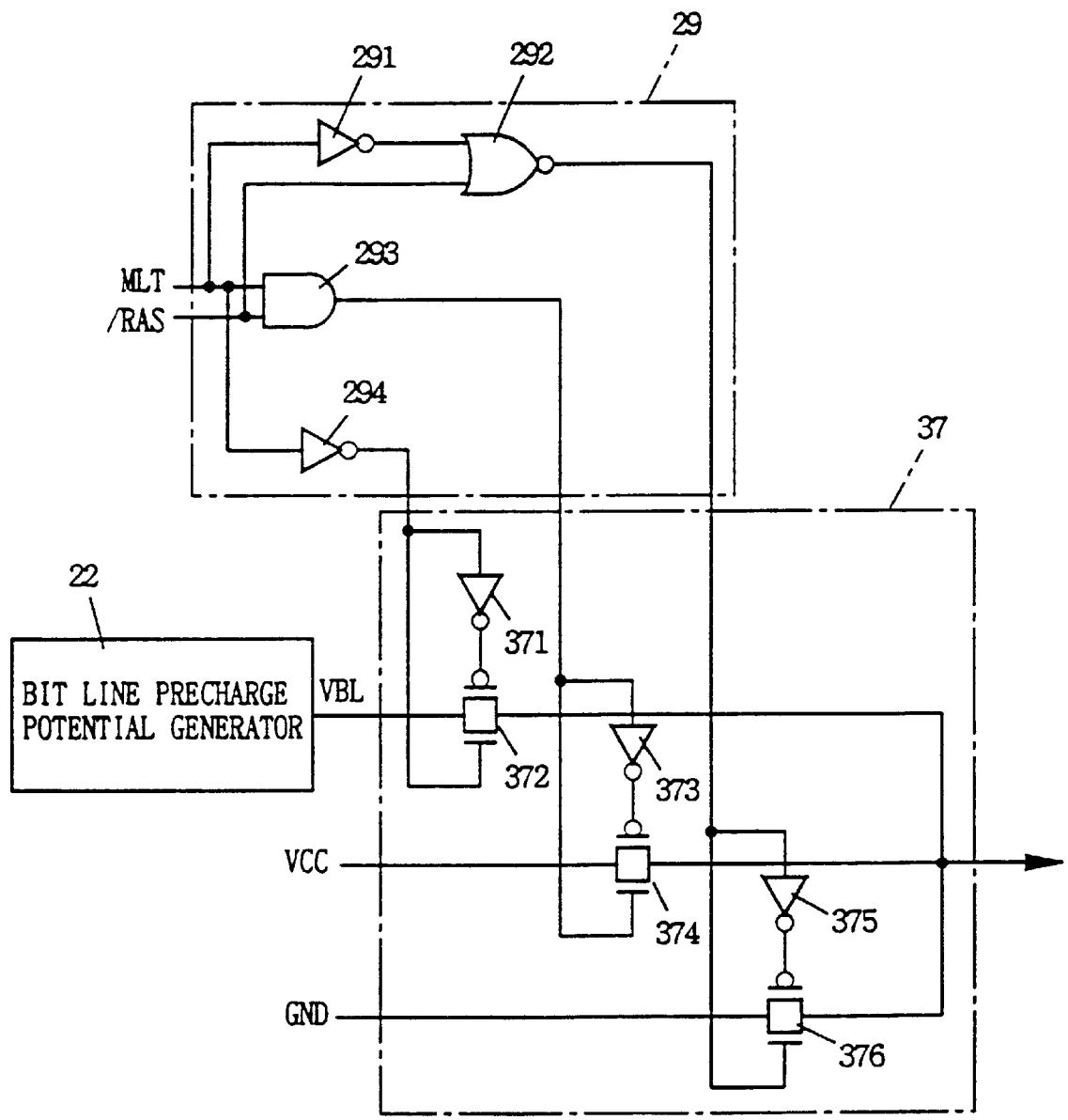
FIG. 22 is a circuit diagram showing a specific structure of a switching circuit and a selector at the bit line side of FIG. 21.

FIG. 22 shows a circuit diagram of a specific structure of switching circuits 29 and selector 37 of FIG. 21. Referring to FIG. 22, switching circuit 29 includes an inverter 291 receiving multi-selection signal MLT, an NOR gate 292 receiving an output signal of inverter 291 and row address strobe signal /RAS, an AND gate 293 receiving multi-selection signal MLT and row address strobe signal /RAS, and an inverter 294 receiving multi-selection signal MLT. Selector 37 includes inverters 371, 373, 375, and transfer gates 372, 374, and 376.

When multi-selection signal MLT attains an L level, transfer gate 372 is turned on, whereby selector 37 provides bit line precharge potential VBL. When multi-selection signal MLT and row address strobe signal /RAS attains an H level, transfer gate 374 is turned on, whereby selector 37 provided power supply potential VCC. When multi-selection signal MLT attains an H level and row address strobe signal /RAS attains an L level, transfer gate 376 is turned on, whereby selector 37 provides ground potential GND.

Figure 23:
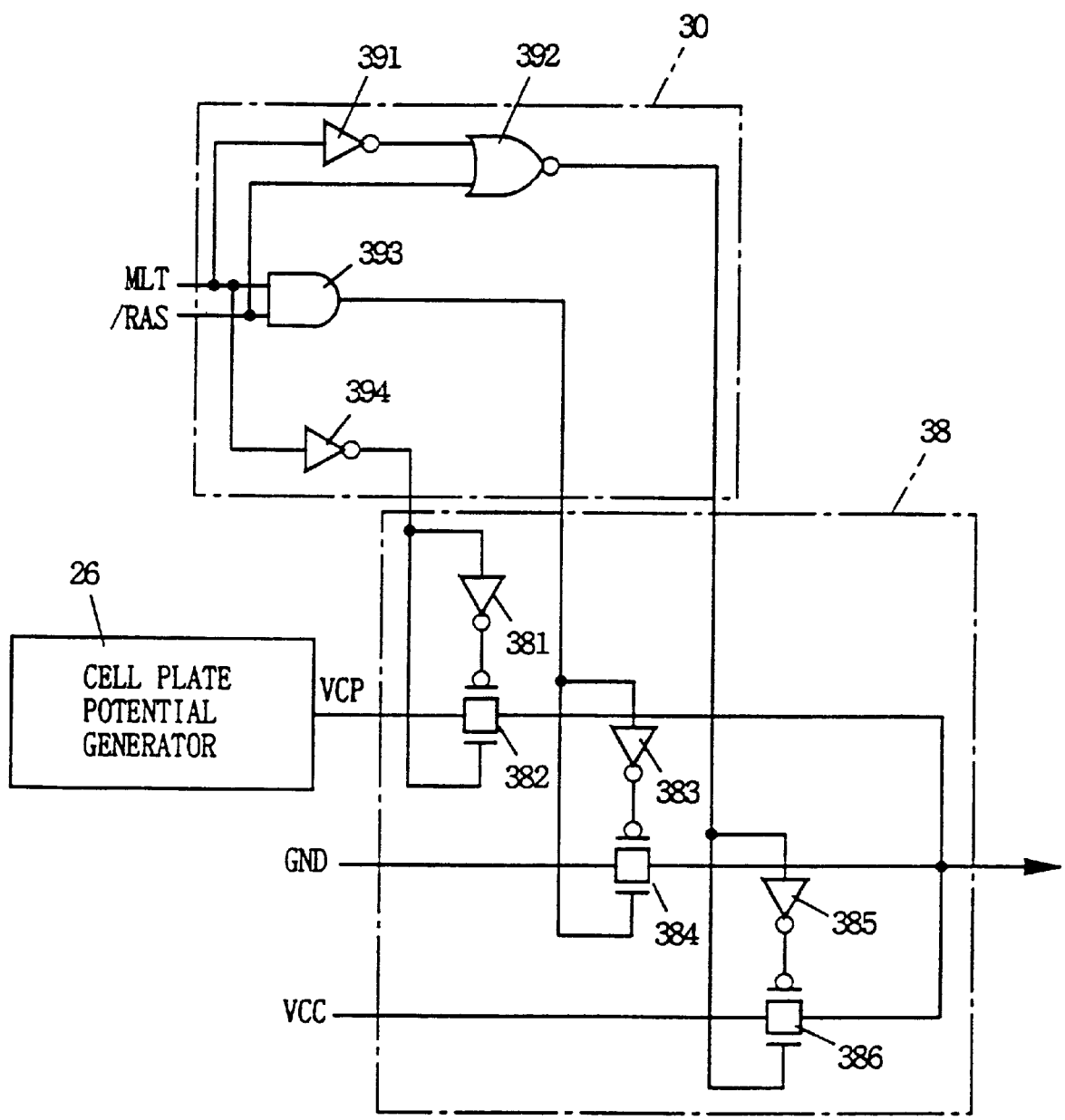
FIG. 23 is a circuit diagram showing a structure of switching circuit and a selector at the cell plate side of FIG. 21.

FIG. 23 is a circuit diagram showing a specific structure of switching circuit 30 and selector 38 of FIG. 21. Referring to FIG. 23, switching circuit 30 includes inverters 391 and 394, an NOR gate 392, and an AND gate 393, similar to switching circuit 29 shown in FIG. 22. Selector 38 includes inverters 381, 383, and 385, and transfer gates 382, 384 and 386, similar to selector 37 shown in FIG. 22.

When multi-selection signal MLT attains an L level, selector 38 provides cell plate potential VCP. When multi-selection signal MLT and row address strobe signal /RAS attains an H level, selector 38 provides ground potential GND. When multi-selection signal MLT attains an H level and row address strobe signal /RAS attains an L level, selector 38 provides power supply potential VCC.

In the sixth embodiment, the polarity of the stress voltage applied to cell capacitor 113 is switched in response to row address strobe signal /RAS. Therefore, an AC stress can be applied to cell capacitor 113.

Since selectors 37 and 38 are connected to the power supply node and the ground node in the sixth embodiment, test pads 24 or 27 shown in FIG. 14 are not required. In carrying out acceleration testing of the present DRAM, the five potentials and signals of multi-selection signal MLT, row address strobe signal /RAS, power supply potential VCC, ground potential GND, and boosted voltage VPP for driving a word line are applied from the outside world. In an acceleration testing such as burn-in, power supply potential VCC is set higher than that of a normal one. Therefore, power supply potential VCC may be directly supplied as boosted potential VPP. In this case, acceleration testing can be carried out by providing four signals and potentials from the outside world.

Recently, the tendency is to carry out stress testing in a wafer state of chips of DRAMs prior to a dicing process. A procedure called parallel testing that tests a plurality of chips at the same time on a wafer during stress testing is now often used. If the number of potentials and signals that must be provided for such testing is great, a tester having a greater number of pins is required, resulting in increase of the cost for testing. Even when testing is carried out using a probe card, the testing cost is also increased since a complex probe card is necessary having a great number of probes.

In contrast, the sixth embodiment allows stress testing by applying signals and potentials to a small number of pads such as four or five pads. Therefore, the number of chips that can be tested simultaneously is increased, whereby the cost for testing is decreased.

Seventh Embodiment

Figure 24:
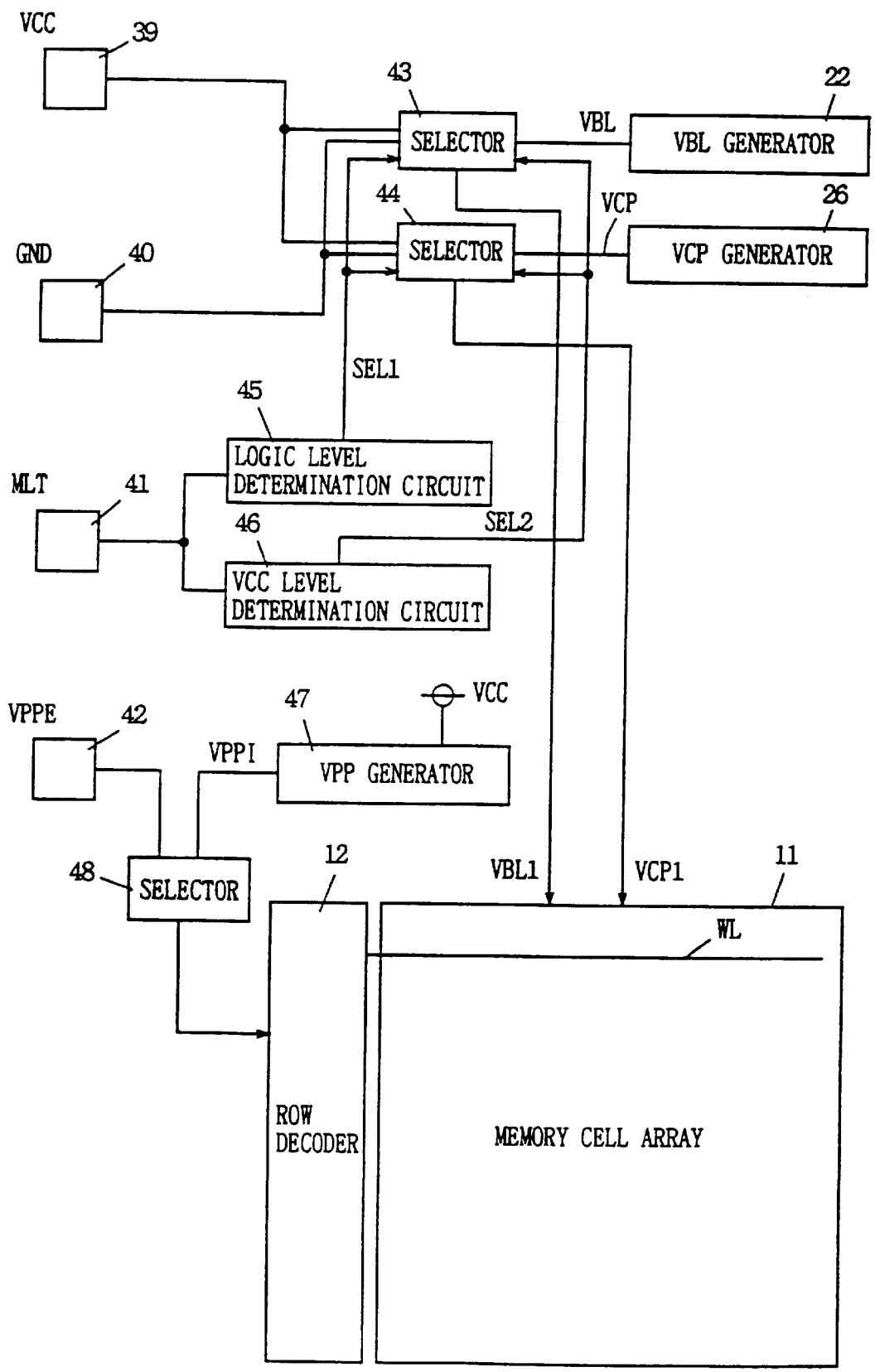
FIG. 24 is a block diagram showing a structure of the main components of a DRAM according to a seventh embodiment of the present invention.

Referring to FIG. 24, a DRAM according to a seventh embodiment of the present invention includes a power supply pad 39 receiving an externally applied power supply potential VCC, a ground pad 40 receiving an externally applied ground potential GND, a multi-selection pad 41 receiving an externally applied multi-selection signal MLT, and a boosted power supply pad 42 receiving an externally applied external boosted potential VPPE. The DRAM further includes selectors 43, 44, and 48, a logic level determination circuit 45, a VCC level determination circuit 46, and a boosted potential generator 47. Logic level determination circuit 45 makes determination of an H level or an L level of multi-selection signal MLT from multi-selection pad 41 to supply a select signal SEL1 according to a determination result thereof to selectors 43 and 44. VCC level determination circuit 46 determines whether multi-selection signal MLT from multi-selection pad 41 attains the level of power supply potential VCC or a higher super VCC level to supply a select signal SEL2 according to the determination result to selectors 43 and 44. Therefore, a multi-selection signal MLT of an H level having a level of super VCC higher than power supply potential VCC can be provided in addition to the level of power supply potential VCC. VCC level determination circuit 46 includes 2 to 3 diode-connected transistors (not shown) connected in series, and can detect a super VCC higher than power supply potential VCC by the threshold voltage of these two to three transistors.

Selector 43 responds to select signals SEL1 and SEL2 to select bit line precharge potential VBL from bit line precharge potential generator 22, power supply potential VCC from power supply pad 39, or ground potential GND from ground pad 40 to supply the selected potential to the bit line equalize circuit in memory cell array 11 as bit line potential VBL1. Selector 44 responds to select signals SEL1 and SEL2 to select cell plate potential VCP from cell plate potential generator 26, ground potential VCC from power supply pad 39, or ground potential GND from ground pad 40 to supply the selected potential to the cell plate in a memory cell in memory cell array 11 as cell plate potential VCP1.

Boosted potential generator 47 generates an internal boosted potential VPPI higher than power supply potential VCC according to power supply potential VCC. Selector 48 selects an internal boosted potential VPPI or external boosted potential VPPE from boosted power supply pad 42 to supply the selected potential to the word driver in row decoder 12.

In a normal mode, bit line precharge potential VBL is provided from bit line precharge potential generator 22 to a bit line via selector 43. Furthermore, cell plate potential VCP from cell plate potential generator 26 is supplied to the cell plate via selector 44.

Figure 25:
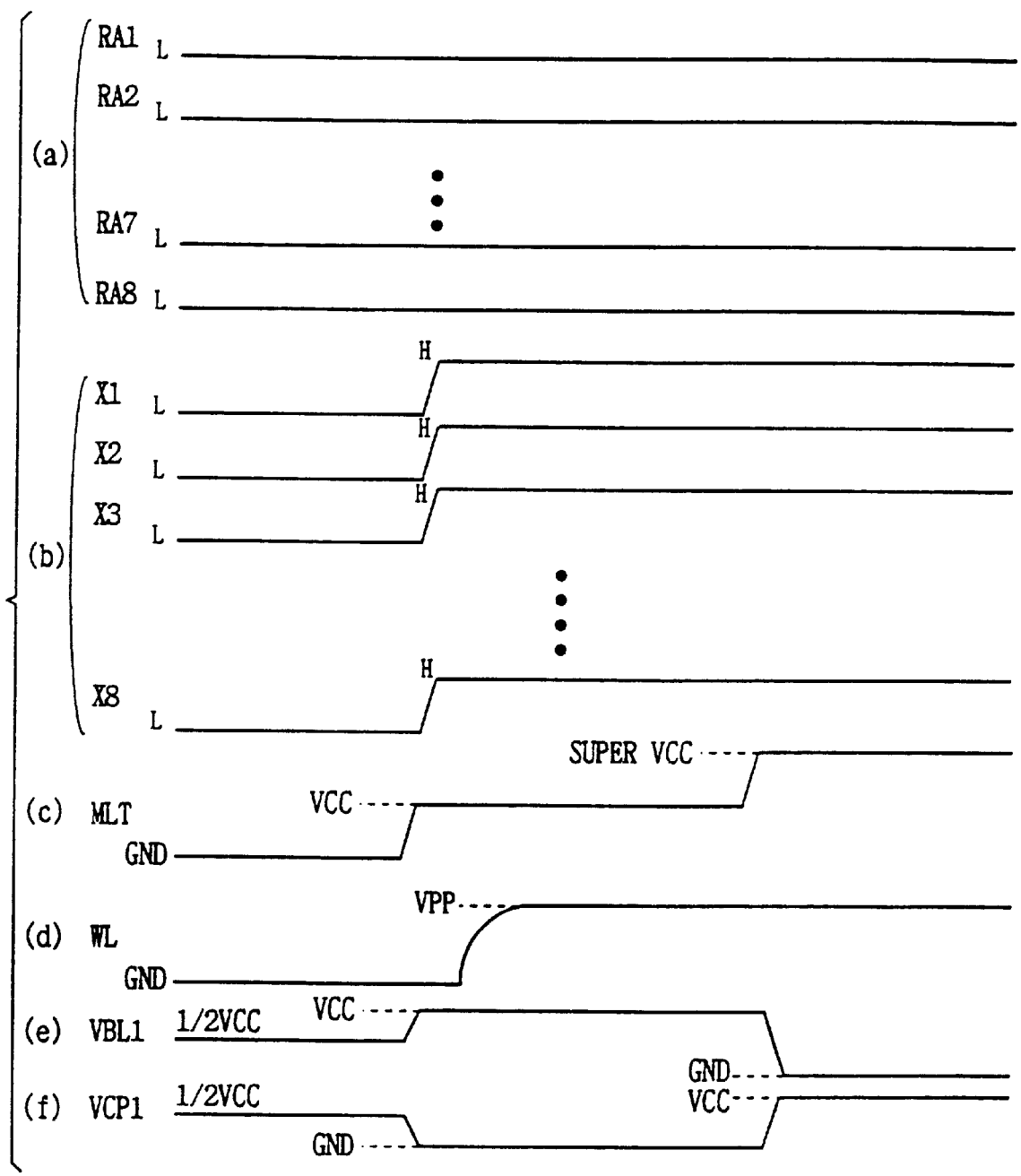
FIG. 25 is a timing chart showing an operation of the DRAM shown in FIG. 24.

In a test mode, power supply potential VCC or super VCC is supplied to multi-selection pad 41 as multi-selection signal MLT of an H level as shown in FIG. 25(c). Activation of multi-selection signal MLT to an H level causes all predecode signals X1–X8 to be activated to an H level as shown in FIG. 25(b), whereby the potential of all the word lines WL in memory cell array 11 is boosted to the level of boosted potential VPP as shown in FIG. 25(d).

When determination is made that multi-selection signal MLT attains an H level by logic level determination circuit 45 and that the H level multi-selection signal MLT attains the level of power supply potential VCC by VCC level determination circuit 46, selector 43 selects power supply potential VCC, whereby the selected power supply potential VCC is supplied to a bit line as bit line potential VBL1 as shown in FIG. 25(e). In this case, selector 44 selects ground potential GND, which is supplied to the cell plate as cell plate potential VCP1 as shown in FIG. 25(f).

When determination is made that multi-selection signal MLT attains an H level by logic level determination 45 and that the H level multi-selection signal MLT attains the level of super VCC level by VCC level determination circuit 46, selector 43 selects ground potential GND which is supplied to a bit line as bit line potential VBL1 as shown in FIG. 25(e). In this case, selector 44 selects power supply potential VCC, which is supplied to the cell plate as cell plate potential VCP1 as shown in FIG. 25(f).

In contrast to internal boosted potential VPP1 generated by boosted potential generator 47 supplied to row decoder 12 via selector 48 in a normal mode, the externally applied external boosted potential VPPE at boosted power supply pad 42 is supplied to row decoder 12 via selector 48 in a test mode. According to the seventh embodiment, the plurality of word lines WL driven in a test mode can be driven in a sufficient manner since external boosted potential VPPE is supplied.

According to the seventh embodiment, multi-selection signal MLT can be applied in three types of levels. Therefore, row address strobe signal /RAS to switch between power supply potential VCC and ground potential GND as in FIG. 21 is not required. Switching between power supply potential VCC and ground potential GND is possible according to two types of H levels of a multi-selection signal.

A stress can be applied to the DRAM of the seventh embodiment by providing four potentials and signal of power potential VCC, ground potential GND, multi-selection signal MLT, and external boosted potential VPPE. In testing such an DRAM under a wafer state prior to a dicing process, a signal and potential required for applying a stress can be easily provided from the outside world. Therefore, the cost required for testing can be reduced.

The present invention is not limited to the seventh embodiment in which boosted potential VPPE for driving a word line is supplied from boosting power supply pad 42, and power supply potential VCC supplied to power supply pad 39 may be supplied to row decoder 12. This is because a power supply potential VCC higher than a conventional one is supplied from the outside world in a stress test such as burn-in. In this case, a potential or signal for testing is supplied to three pads 39–41.

FIG. 26 shows the arrangement of a semiconductor chip including such three pads in a wafer state. FIG. 26 shows a plurality of semiconductor chips 71 formed on a semiconductor wafer. Each semiconductor chip 71 includes three pads 39, 40, and 49, and an internal timer 711. Multi-selection pad 49 of semiconductor chip 71 differs from the multi-selection pad shown in FIG. 24 in that a burn-in signal is provided thereto. Internal timer 711 responds to a burn-in signal from multi-selection pad 49 to generate a multi-selection signal MLT of a predetermined cycle. Since internal timer 711 is provided in each semiconductor chip 71, each semiconductor chip 71 can be tested individually in response to a multi-selection signal MLT internally generated.

FIG. 27 is a plan view of a probe card for testing a plurality of semiconductor chips 71 of FIG. 26 in a wafer state. As shown in FIG. 27, this probe card 74 includes a plurality of openings 741, and a plurality of probes 742 protruding into respective openings 741. Each opening 741 is provided so as to expose underlying semiconductor chips 71. Three probes 742 are arranged at the periphery of opening 741 corresponding to one semiconductor chip 71.

These probes 742 form contact with pads 39, 40 and 46 to supply power potential VCC, ground potential GND, and a burn-in signal for testing to each semiconductor chip 71. Since a plurality of openings 741 are formed in probe card 74, not only three semiconductor chips 71 arranged in one vertical row, but fifteen semiconductor chips 71 arranged in a matrix can be tested at the same time.

Reduction in the number of applied potentials and signals required for testing provides the advantage of allowing testing of a plurality of semiconductor chips in a wafer state simultaneously using probe card 74 of a simple structure as such shown in FIG. 27.

Eighth Embodiment

Figure 28:
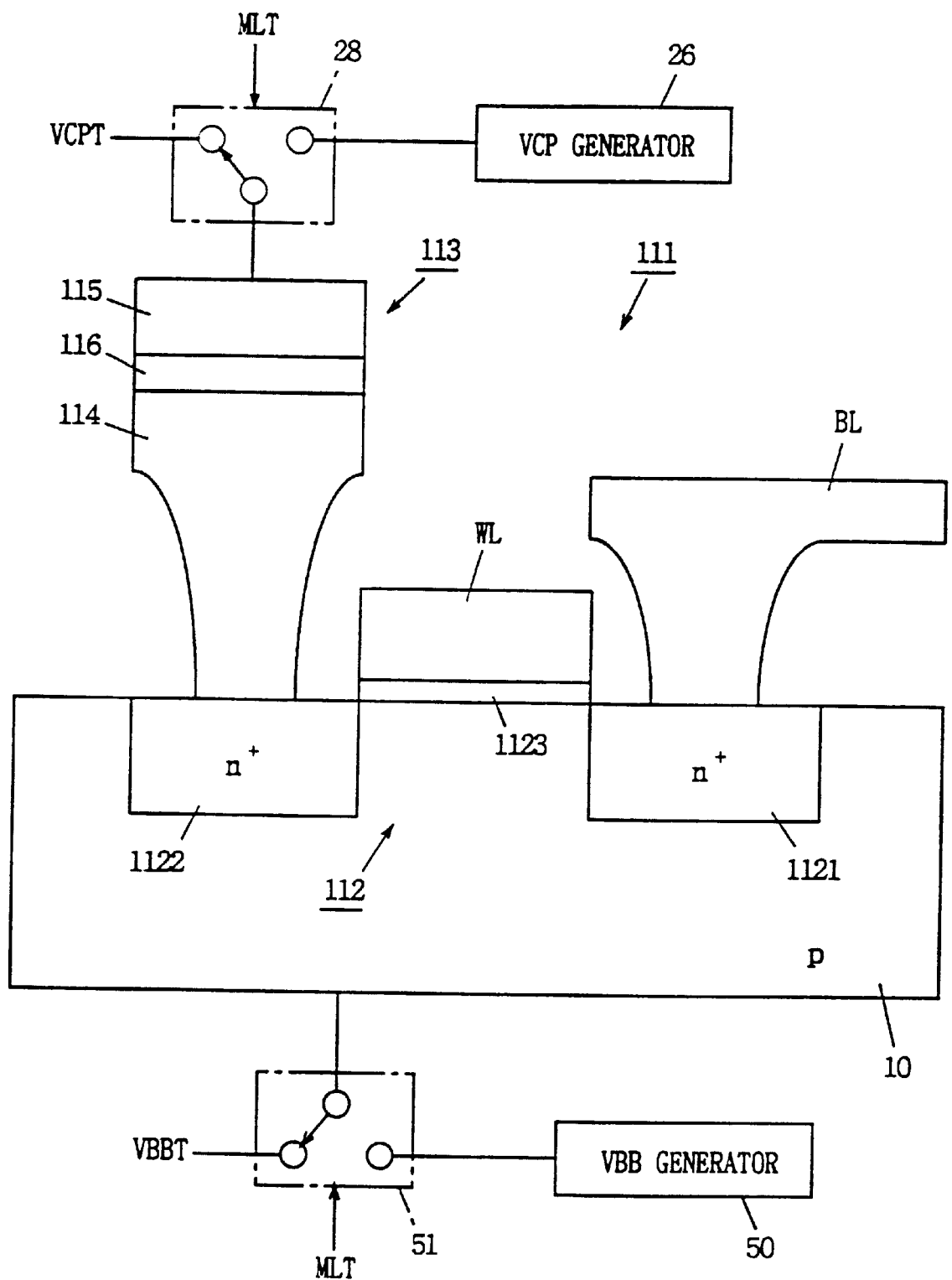
FIG. 28 is a diagram for describing a structure of the main components of a DRAM according to an eighth embodiment of the present invention.

Referring to FIG. 28, a DRAM of an eighth embodiment includes a substrate potential generator 50 for generating a predetermined substrate potential VBB, and a selector 51 responsive to multi-selection signal MLT for selecting substrate potential VBB or externally applied substrate test potential VBBT to supply the selected potential to semiconductor substrate 10.

In contrast to the third embodiment shown in FIG. 14 in which bit line test potential VBLT is supplied to storage node 114 via bit line BL, the present eight embodiment 8 has substrate test potential VBBT supplied to storage node 114 via semiconductor substrate 10 and source/drain region 1122 of access transistor 112. In the eighth embodiment, substrate test potential VBBT must be set higher than cell plate potential VCPT since semiconductor substrate 10 is of a P type conductivity and source/drain region 112 is of an $n^+$ type conductivity. In a test mode, cell plate test potential VCPT is supplied to cell plate 115, and substrate test potential VBBT is supplied to storage node 114. Therefore, a stress voltage can be applied to dielectric film 116 of cell capacitor 113.

In the eighth embodiment, a substrate test potential can be supplied to storage node 114 of all cell capacitors 113 just by supplying the substrate test potential to one semiconductor substrate 10 in a test mode. Therefore, the structure of the eight embodiment is more simple than that of the third embodiment shown in FIG. 14.

It is appreciated that the polarities of cell plate test potential VCPT and substrate test potential VBBT are set opposite when a $p^+$ source/drain region is formed in an n type semiconductor substrate.

Ninth Embodiment

Figure 29:
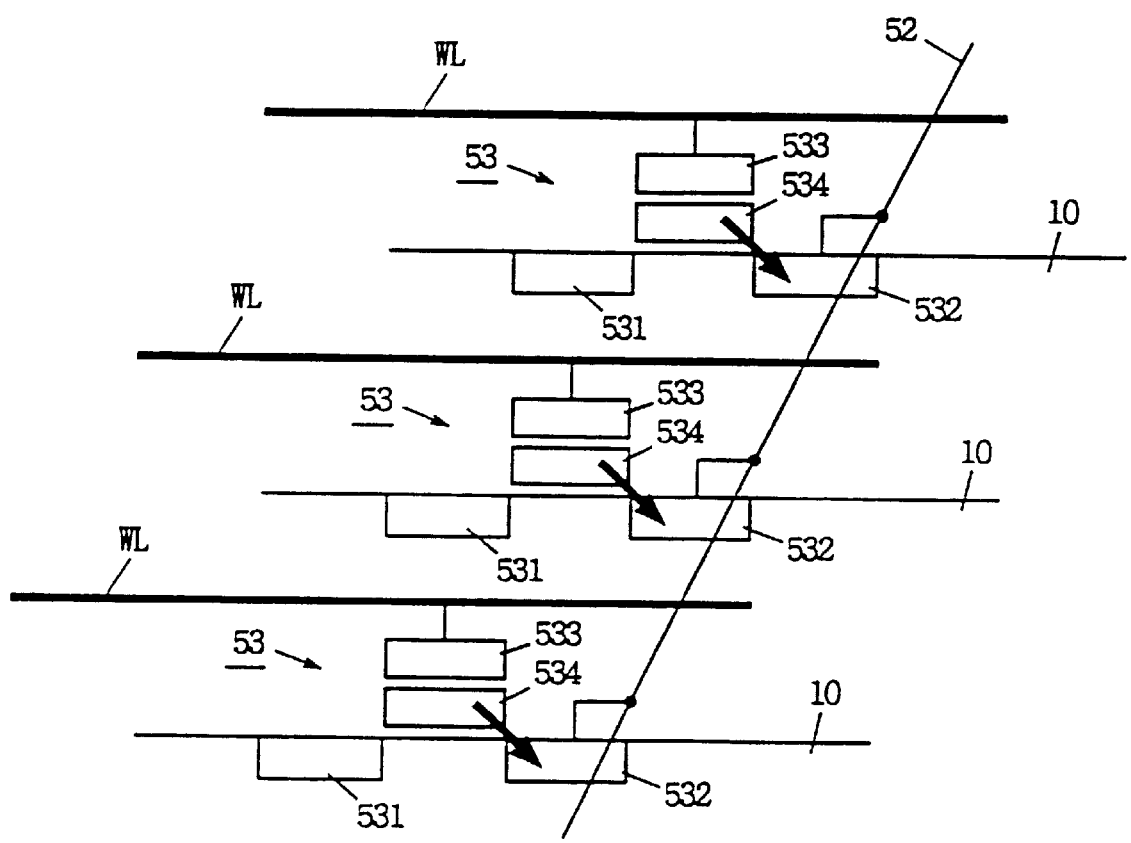
FIG. 29 is a diagram for describing a structure of the main components of a flash memory device according to a ninth embodiment of the present invention.

FIG. 29 shows a structure of a flash memory device according to a ninth embodiment of the present invention. Referring to FIG. 29, a memory cell line of the flash memory device includes a plurality of word lines WL, a plurality of source lines 52 crossing word lines WL, and a plurality of floating gate type memory cells 53 provided corresponding to respective crossings of a word line and a source line. Each floating gate type memory cell 53 includes a drain region 531 and a source region 532 formed in a semiconductor substrate 10, a gate electrode 533 connected to a corresponding word line WL, and a floating gate 534 formed beneath gate electrode 533. Data is stored in memory cell 53 by the accumulation of charge in floating gate 534. Since floating gate 534 attains an electrically floating state, the data therein will not be lost even when the power is turned off.

In a normal access operation, one word line WL is driven, whereby the data in memory cell 53 is read out on source line 52.

In a test mode, a plurality of word lines WL are driven in response to one multi-selection signal, similar to the above-described embodiment. A high potential is supplied to gate electrode 533 connected to the driven word line WL. Therefore, a high potential is applied in a direction from gate electrode 533 towards source region 532, whereby the charge in floating gate 534 is drawn out into source region 532. As a result, data in memory cell 53 is erased.

According to the ninth embodiment, a plurality of word lines WL are driven in response to a multi-selection signal, so that data in all memory cells within a desired area can be erased simultaneously. Thus, the time required for erasing can be reduced.

Tenth Embodiment

Figure 30:
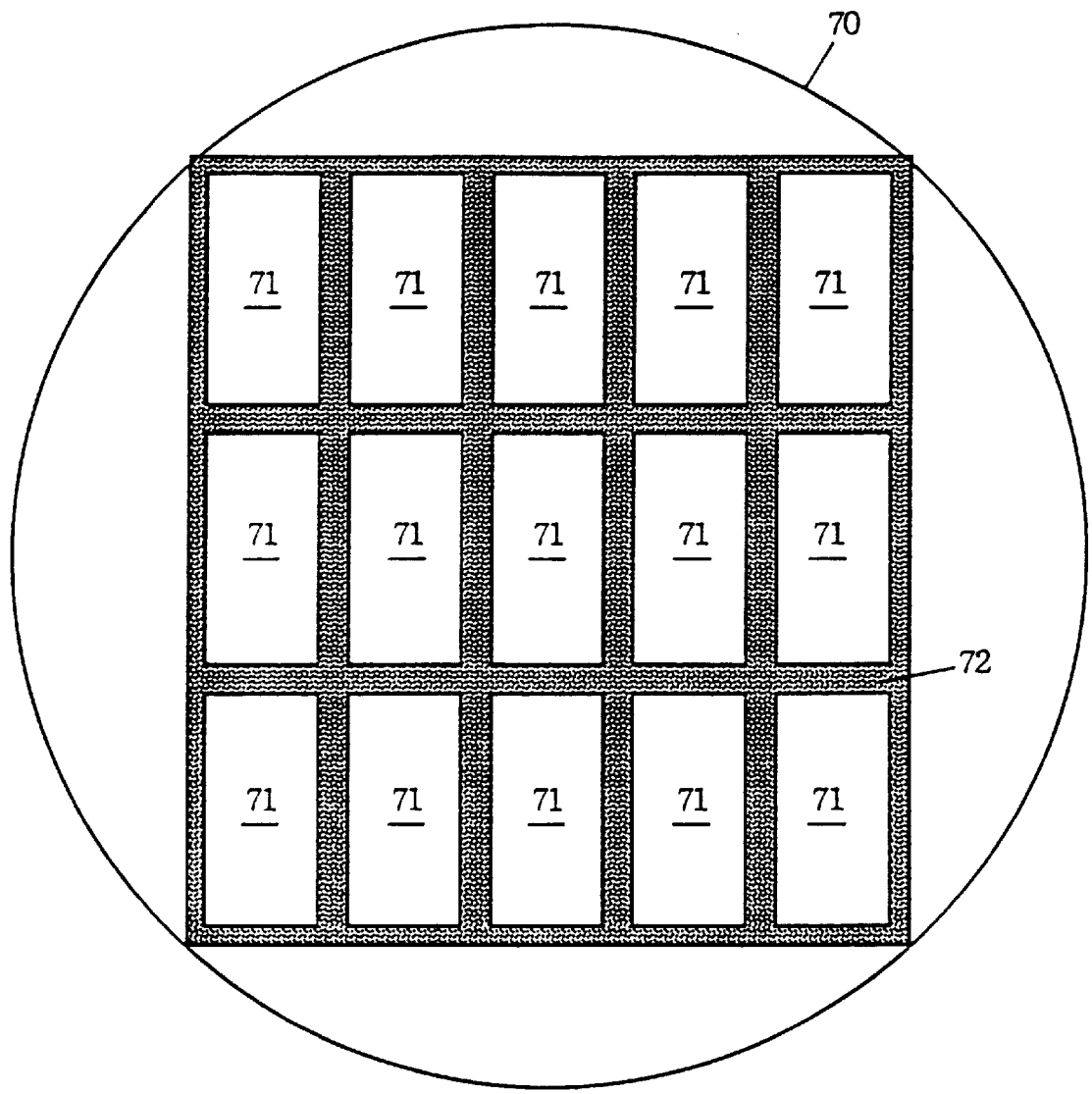
FIG. 30 is a plan view of a semi-finished product for an integrated semiconductor device according to a tenth embodiment of the present invention.

FIG. 30 is a plan view showing a structure of a semi-finished product or an integrated semiconductor device according to a tenth embodiment of the present invention. As shown in FIG. 30, a plurality of semiconductor chips 71 are formed on a semiconductor wafer 70. These semiconductor chips 71 are arranged in a matrix. Each semiconductor chip 71 is disposed with a predetermined distance from an adjacent semiconductor chip 71. Therefore, a dicing region 72 is provided between these semiconductor chips 71. Semiconductor wafer 70 is divided into plurality of semi-conductor chips 71 by dicing region 72. In general, the width of dicing region 72 is set to approximately 50–200 μm.

Figure 31:
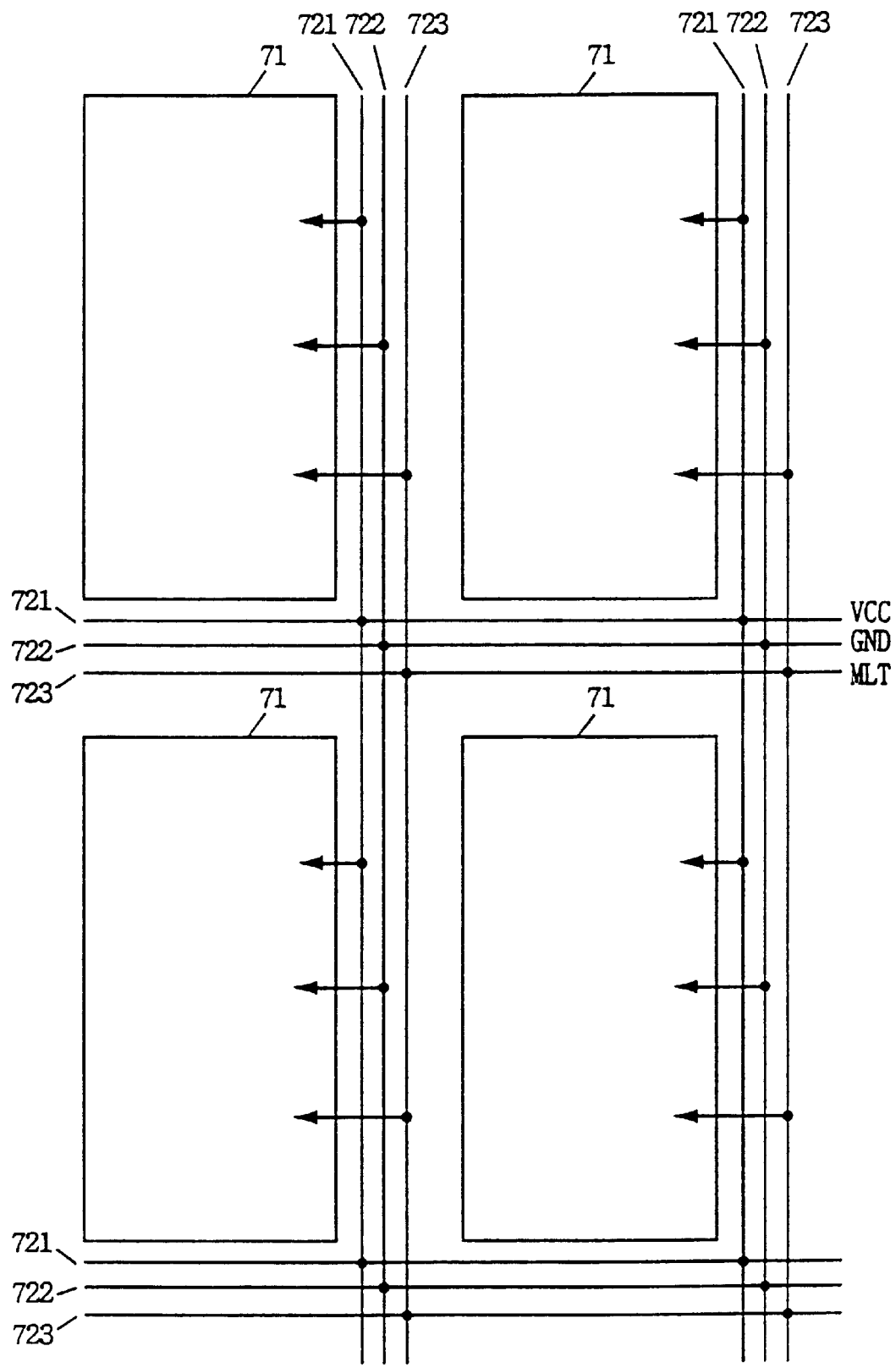
FIG. 31 is a diagram for showing in detail a semiconductor chip and a dicing region of FIG. 30.

In the tenth embodiment, test interconnections 721–723 shown in FIG. 31 are formed horizontally and vertically in such a dicing region 72. Test interconnections 721 formed vertically and horizontally are connected to each other and receive power supply potential VCC. The vertically and horizontally formed test interconnections 722 are connected to each other, and receive ground potential GND. Vertically and horizontally formed test interconnections 723 are connected to each other, and receive a multi-selection signal MLT.

By supplying power supply potential VCC, ground potential GND, and multi-selection signal MLT to respective one of test interconnections 721–723, the potentials and signal can be supplied to all semiconductor chips 71 on semiconductor wafer 70. This means that an acceleration test on all semiconductor chips 71 on semiconductor wafer 70 can be carried out using a general probe card that supplies a potential and signal for testing only to one semiconductor chip 71. It is needless to say that the probe card as shown in FIG. 27 may also be used.

Eleventh Embodiment

When a plurality of semiconductor chips 71 are connected in common by test interconnections 721–723 as shown in FIG. 31, the number of semiconductor chips 71 connected to one probe of the probe card is increased. As a result, the load capacitance becomes greater. This means that the rising time period and falling time period of the potential and signal applied to semiconductor chip 71 via the test interconnection becomes longer. It is therefore difficult to carry out acceleration testing while operating semiconductor chip 71 at high frequency.

Figure 32:
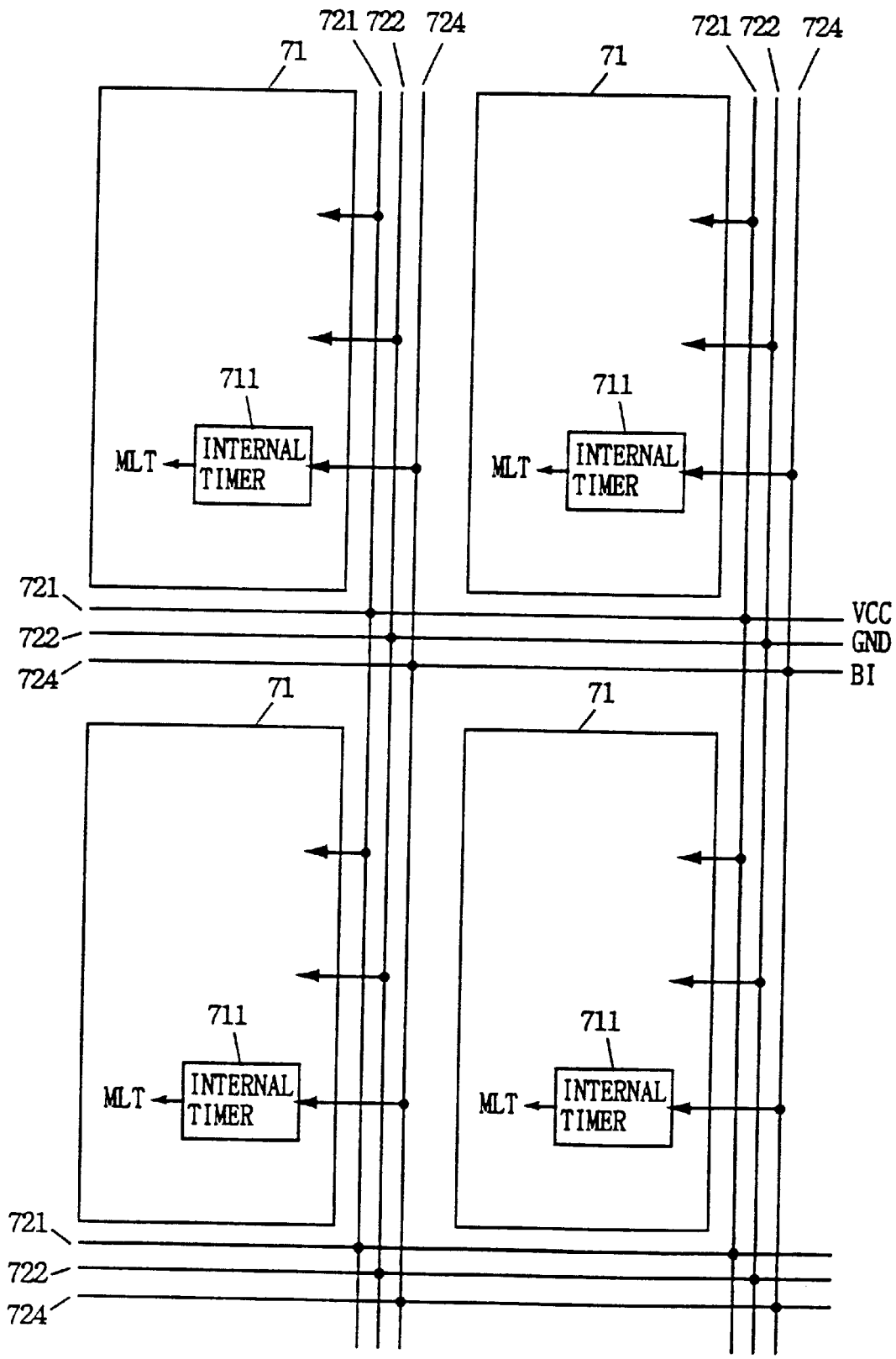
FIG. 32 is a diagram for describing the main component of a semi-finished product for an integrated semiconductor device according to an eleventh embodiment of the present invention.

According to the eleventh embodiment 11 shown in FIG. 32, each semiconductor chip 71 includes an internal timer 711. The vertically and horizontally formed test interconnections 724 are connected to each other, and receive a burned-in signal BI. Burn-in signal BI is applied to internal timer 711 of all semiconductor chips 71 on semiconductor wafer 70 via test interconnection 724.

Figure 33:
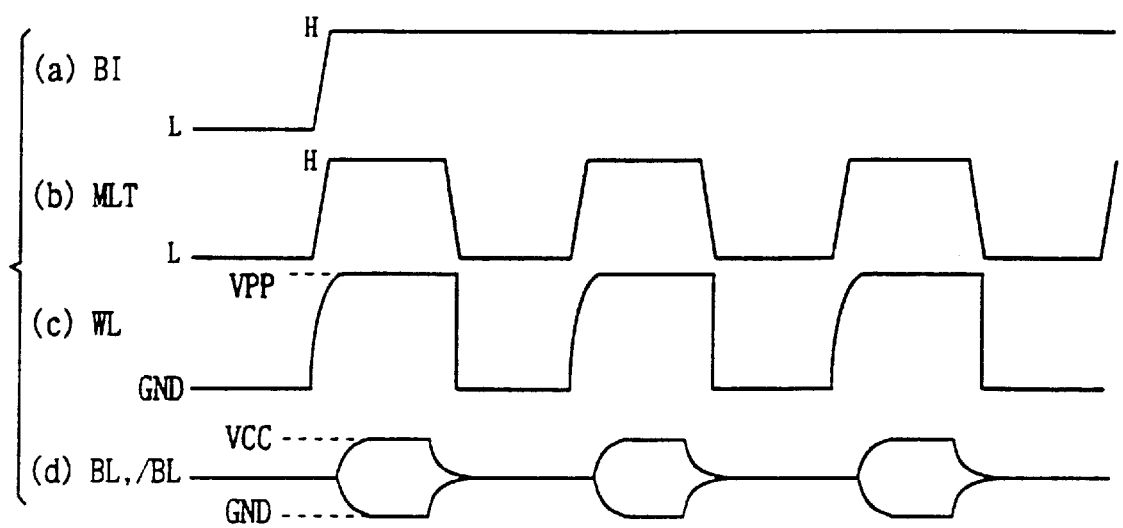
FIG. 33 is a timing chart for describing a testing operation of the semi-finished product for an integrated semiconductor device shown in FIG. 32.

Internal timer 711 operates automatically at the rise of burn-in signal BI as shown in FIG. 33(a), whereby a multi-selection signal MLT is generated periodically as shown in FIG. 33(b). This multi-selection signal MLT is applied to a row decoder, whereby a plurality of word lines are activated. As shown in FIG. 33(c), the potential of word line WL responds to multi-selection signal MLT to be pulled up and down alternately. Therefore, the potential of bit lines BL and /BL are amplified between the level of ground potential GND and power supply potential VCC.

Since multi-selection signal MLT is generated by internal timer 711 provided in each semiconductor chip 71 in the present eleventh embodiment, and an AC stress test can be carried out in an accelerated manner while operating each semiconductor chip 71 at high frequency.

Twelfth Embodiment

In the eleventh embodiment shown in FIG. 32, the variation in the oscillation frequency of internal timer 711 will cause a different acceleration ratio of testing for each semiconductor chip since a multi-selection signal MLT of a predetermined frequency is generated by each semiconductor chip 71.

Figure 34:
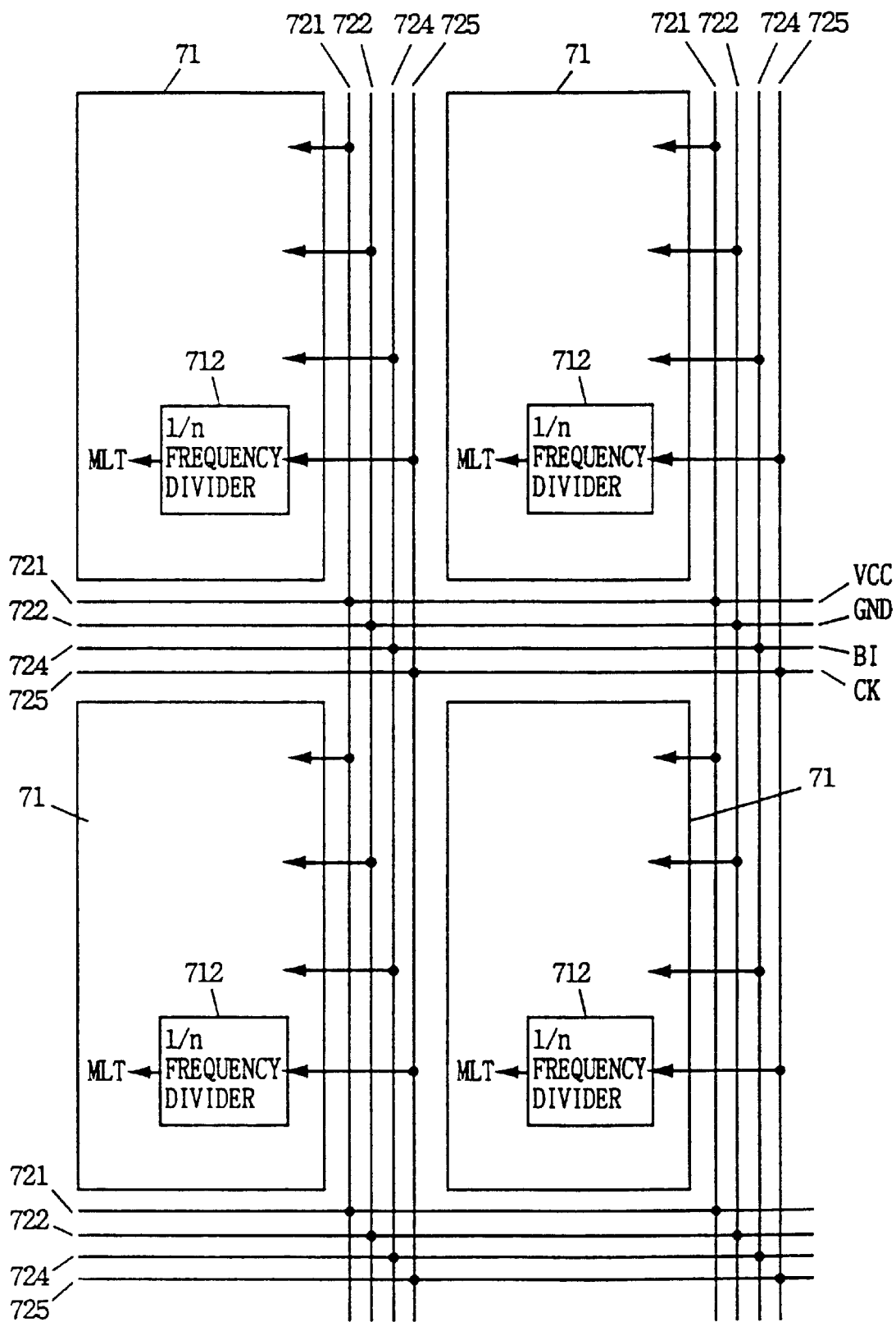
FIG. 34 is a diagram for describing the main components of a semi-finished product for an integrated semiconductor device according to a twelfth embodiment of the present invention.
Figure 35:
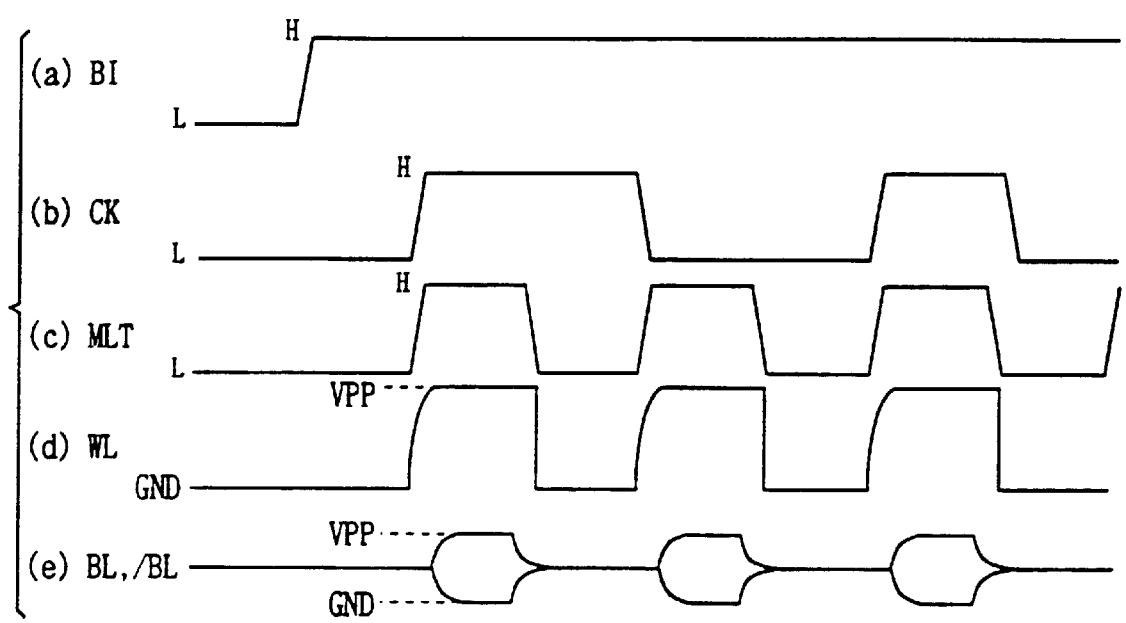
FIG. 35 is a timing chart for describing a testing operation of the semi-finished product for an integrated semiconductor device of FIG. 34.

In the present twelfth embodiment shown in FIG. 34, each semiconductor chip 71 includes a 1/n frequency divider 712. Vertically and horizontally formed test interconnections 725 are connected to each other, and receive an external clock signal CK. External clock signal CK is applied to frequency divider 712 of all semiconductor chips 71 on the semiconductor wafer via test interconnection 725. Each frequency divider 712 divides an applied external clock signal CK to generate a multi-selection signal MLT having a period of 1/n that of external clock signal CK. For example, when n=2, the period of multi-selection signal MLT shown in FIG. 35(c) is half that of external clock signal CK shown in FIG. 35(b).

Therefore, the rising and falling time period of multi-selection signal MLT is 1/n that of external clock signal CK even if the rising and falling time period of the supplied external clock signal CK is great. For example, when n=16, the period of multi-selection signal MLT is 100 ns when the period of external clock signal CK is 1600 ns. Therefore, the rising and falling time period of multi-selection signal MLT is not more than 5 ns even if the rising and falling time period of multi-selection signal MLT is approximately 50 ns. Since the rising and falling time period can be reduced, an acceleration test can be carried out while operating semiconductor chip 71 at a high frequency. Furthermore, the acceleration ratio in an acceleration test can be set substantially equal in each semiconductor chip 71 since frequency divider 712 generates multi-selection signal MLT with external clock signal CK as a trigger.

Thirteenth Embodiment

In the eleventh embodiment shown in FIG. 32, internal timer 711 for testing is provided. When this semiconductor chip is a DRAM, the refresh timer used for self refresh can be used as the internal timer in a test mode. A circuit for this purpose is shown in FIG. 36.

Figure 36:
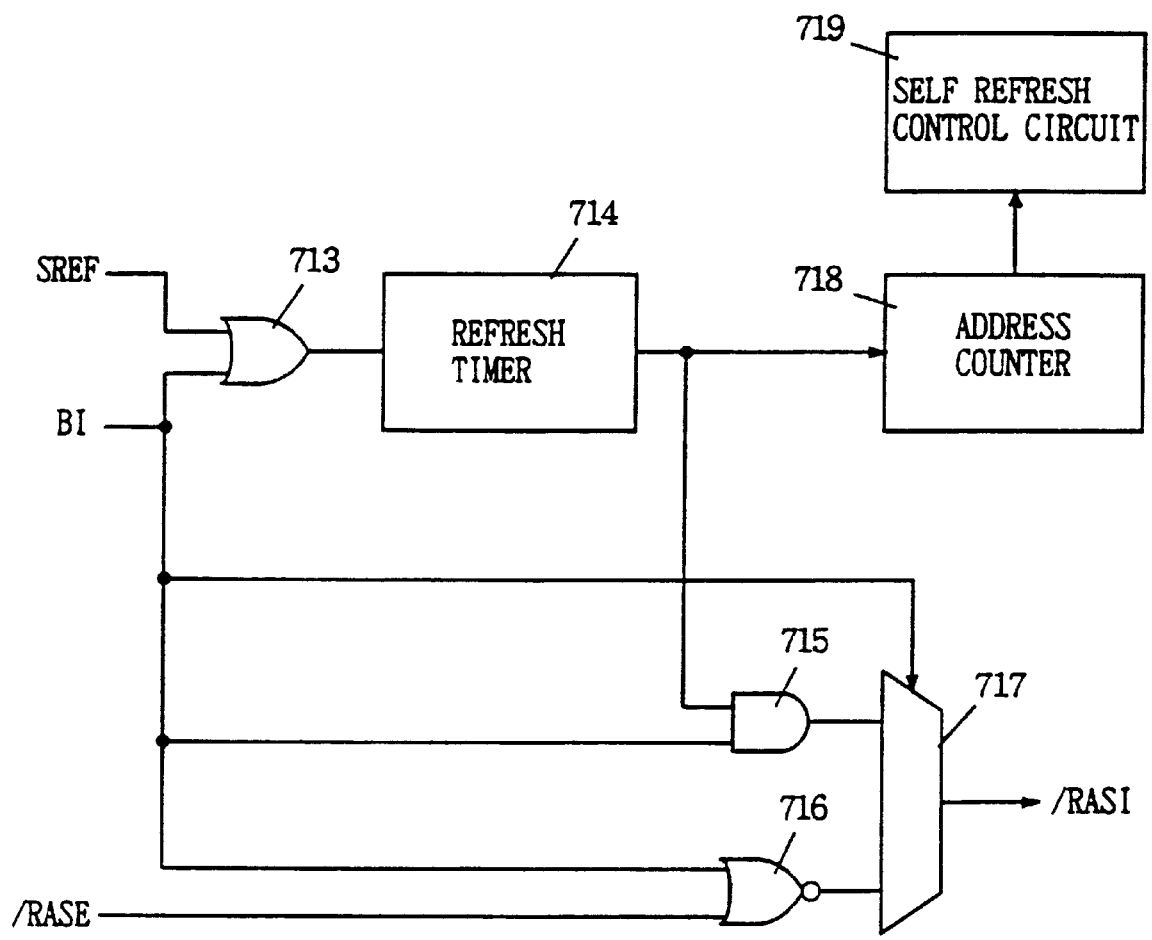
FIG. 36 is a block diagram showing a structure of the main components of one semiconductor chip in a semi-finished product for an integrated semiconductor device according to a thirteenth embodiment of the present invention.

According to the thirteenth embodiment shown in FIG. 36, an output signal of an OR gate 713 receiving self refresh signal SREF and burn-in signal BI is applied to a refresh timer 714. An output signal of refresh timer 714 and burn-in signal BI are applied to AND gate 715. Burn-in BI and external row address strobe signal /RASE are applied to an NOR gate 716. A multiplexer 717 responds to a burn-in BI to select an output signal of AND gate 715 or NOR gate 716 to provide a selected signal at internal row strobe signal /RASI.

In a self refresh mode, a burn-in signal BI of an L level is applied to activate refresh timer 714. In response to an output signal of refresh timer 714, an address counter 718 generates an internal address for a self refresh operation. A self refresh control circuit 719 responds to the generated internal address to control a row decoder, a sense amplifier, and the like that sequentially refreshes the memory cell.

Furthermore, multiplexer 714 responds to burn-in signal BI of an L level to select an output signal of NOR gate 716, whereby external row address strobe signal /RASE is output as internal row address strobe signal /RASI.

In a test node, burn-in signal BI of an H level is applied, so that multiplexer 717 selects an output signal of AND gate 715. Therefore, an output signal of refresh timer 714 is provided as internal row address strobe signal /RASI. In a test mode, a plurality of word lines are activated periodically in response to this internal row address strobe signal /RASI. Therefore, an AC stress test of a memory cell can be carried out.

Since refresh timer 714 is used as an internal timer required in each semiconductor chip in the thirteenth embodiment, the region occupied by the circuitry exclusively for acceleration testing can be reduced.

Fourteenth Embodiment

In the above-described embodiment, all word lines WE in a memory cell array are activated in response to multi-selection signal MLT. Therefore, a great amount of power is consumed simultaneously when the word lines are charged/discharged. The present fourteenth embodiment shows a structure in which a plurality of word lines specified by an address can be sequentially activated.

Figure 37:
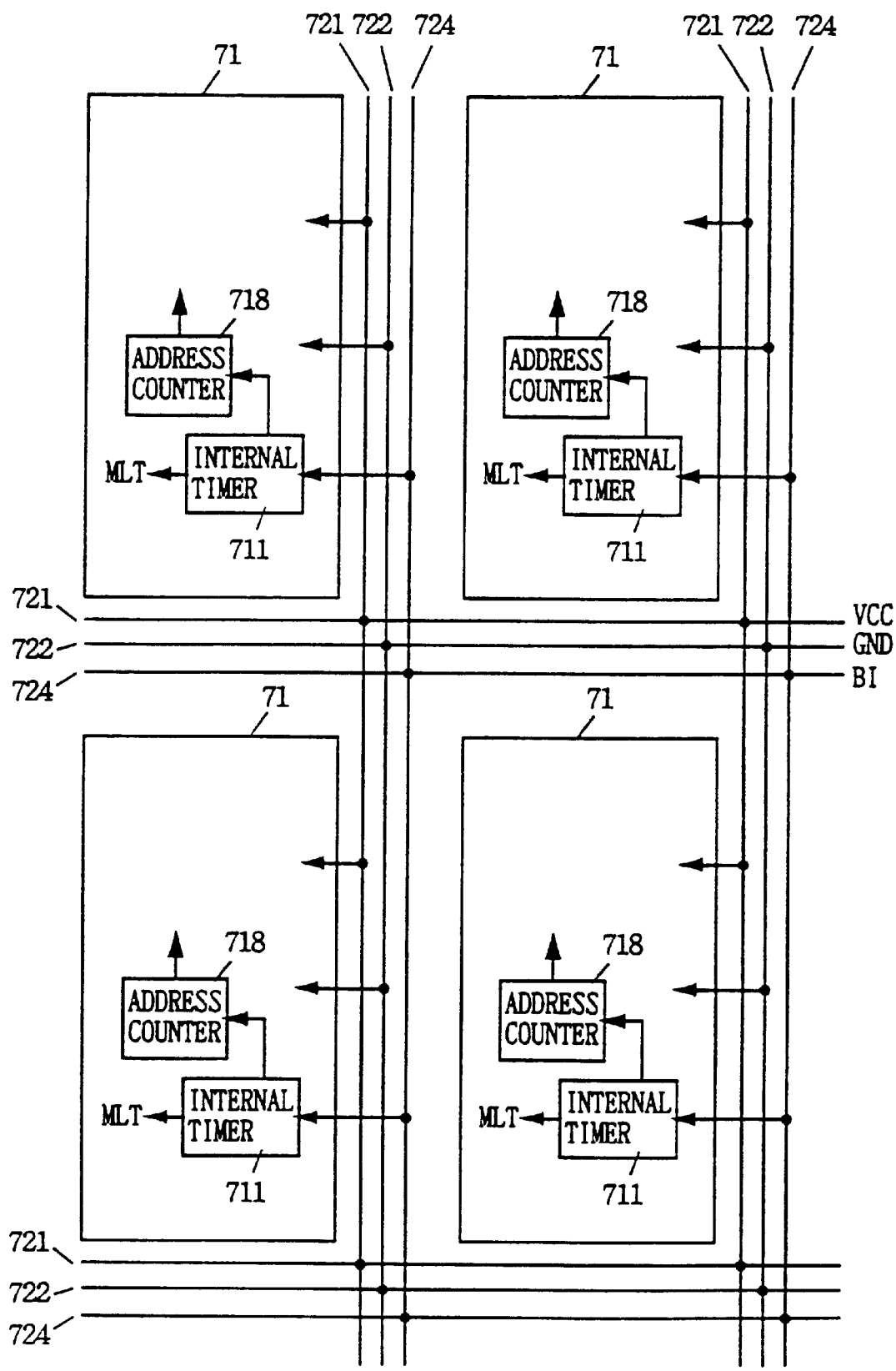
FIG. 37 is a diagram for describing the main components of a semi-finished product for an integrated semiconductor device according to a fourteenth embodiment of the present invention.
Figure 38:
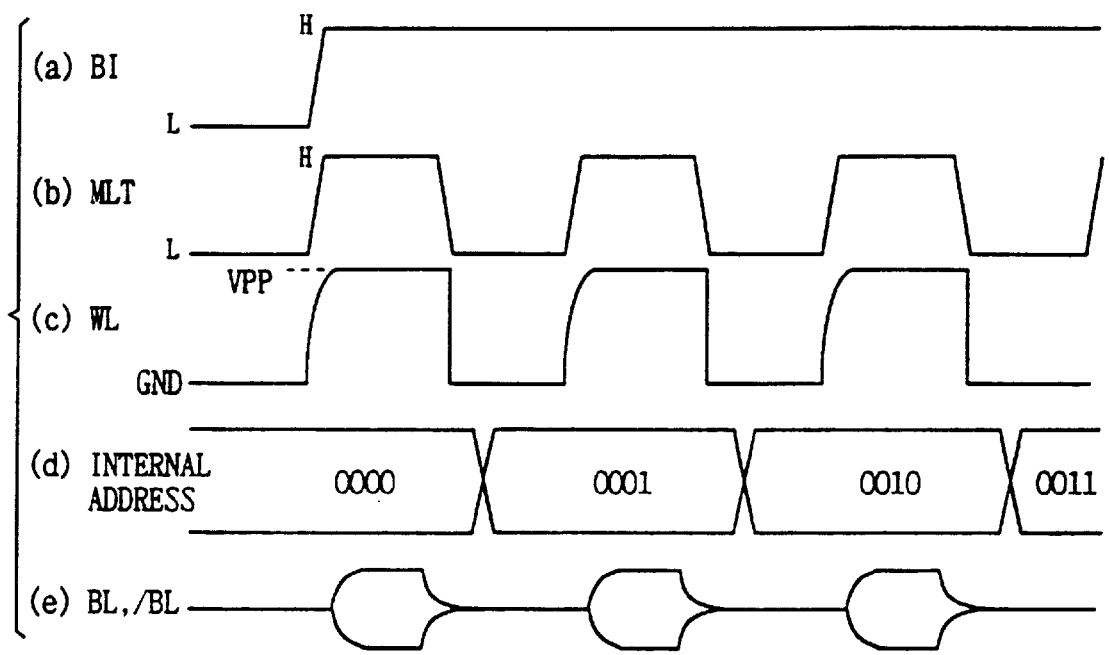
FIG. 38 is a timing chart for describing a testing operation of the semi-finished product for an integrated semiconductor device of FIG. 37.

Referring to FIG. 37 of a fourteenth embodiment, an address counter 718 sequentially generates an internal address in response to an output of internal timer 711. Upon activation of multi-selection signal MLT as shown in FIG. 38(b), the potential of a plurality of word lines WL are raised to the level of boosted potential VPP as shown in FIG. 38(b) according to an internal address of address counter 718 as shown in FIG. 38(d). At the next activation of multi-selection signal MLT, a plurality of word lines WL are driven according to the next internal address.

Here, it is desirable to use the refresh timer of the self refresh operation for internal timer 711 and the address counter of the self refresh operation for address counter 718. This is to reduce the area occupied by the circuitry required for acceleration testing.

According to the fourteenth embodiment, only a part of the word lines in a memory cell array are driven according to an internal address from address counter 718. Therefore, the power consumed simultaneously for charging/discharging word-lines is reduced. Furthermore, since an address for specifying a word line to be driven is internally generated by address counter 718, such an address does not have to be provided from an external source. Therefore, the number of externally applied potentials and signals for testing can be reduced. Acceleration test can be carried out easily under a wafer state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells;
   a plurality of word lines connected to said plurality of memory cells;
   a bit line connected to said plurality of memory cells;
   a word line selector enabling a first number of said word lines in a normal mode and enabling a second number of said word lines in a test mode, the second number being larger than the first number and smaller than a number of said plurality of word lines; and
   a bit line potential provider forcing a potential of said bit line to a bit line test potential in the test mode, said bit line potential provider receiving in parallel a power supply potential and a ground potential to select one of the power supply and ground potentials and provide the selected one of the power supply and ground potentials as the bit line test potential in the test mode.

2. The semiconductor memory device according to claim 1, wherein
   said plurality of memory cells and said plurality of word lines are included in a memory block, and
   said word line selector enables one of said plurality of word lines in the normal mode and enables at least two of said plurality of word lines in the test mode.

3. The semiconductor memory device according to claim 1, wherein
   the bit line test potential is different from a bit line precharge potential provided to said bit line in the normal mode.

4. The semiconductor memory device according to claim 3, wherein
   said bit line potential provider selectively provides one of a power supply potential and a ground potential as the bit line test potential in the test mode.

5. The semiconductor memory device according to claim 1, wherein
   said word line selector includes a driver circuit applying an externally supplied word line potential to word lines enabled in the test mode.

6. The semiconductor memory device according to claim 1, wherein
   said bit line potential provider includes a bit line precharge potential generator for generating a bit line precharge potential, a switch selectively providing one of the bit line precharge potential and the bit line test potential, and a bit line equalize circuit for applying the potential provided by the switch to said bit line.

7. The semiconductor memory device according to claim 1, wherein
   each of said plurality of memory cells includes an access transistor and a capacitor having a first electrode coupled to the bit line via the access transistor and having a second electrode coupled to a cell plate, and
   said semiconductor memory device further comprises a cell plate potential provider forcing a potential of the cell plate to a cell plate test potential in the test mode.

8. A semiconductor memory device comprising:
   a plurality of memory cells;
   a plurality of word lines connected to said plurality of memory cells;
   a bit line connected to said plurality of memory cells;
   a word line selector enabling a first number of said word lines in a normal mode and enabling a second number of said word lines in a test mode, the second number being larger than the first number; and
   a bit line potential provider forcing a potential of said bit line to a bit line test potential in the test mode, said bit line potential provider receiving in parallel a power supply potential and a ground potential to select one of the power supply and ground potentials and provide the selected one of the power supply and ground potentials as the bit line test potential in the test mode.

9. A semiconductor memory device comprising:
   a plurality of memory cells;
   a plurality of word lines connected to said plurality of memory cells;

a bit line connected to said plurality of memory cells;

a word line selector enabling a first number of said word lines in a normal mode and enabling a second number of said word lines in a test mode, the second number being larger than the first number; and a bit line potential provider forcing a potential of said bit line to a bit line test potential in the test mode, wherein each of said plurality of memory cells includes an access transistor and a capacitor having a first electrode coupled to the bit line via the access transistor and having a second electrode coupled to a cell plate, and said semiconductor memory device further comprises a cell plate potential provider forcing a potential of the cell plate test potential in the test mode.

10. The semiconductor memory device according to claim 9, wherein said bit line potential provider changes the bit line test potential between a first level and a second level lower than the first level, and said cell plant potential provider changes the bit line test potential between a third level and a fourth level lower than the third level.

11. A semiconductor memory device comprising:

a plurality of memory cells;

a plurality of word lines connected to said plurality of memory cells;

a bit line connected to said plurality of memory cells;

a word line selector enabling a first number of said word lines in a normal mode and enabling a second number of said word lines in a test mode, the second number being larger than the first number;

a bit line precharge potential generator for generating a bit line precharge potential; and a selector for selecting the bit line precharge potential from said bit line precharge potential generator in the normal mode and selecting one of potentials from at least two potential sources in the test mode to provide the selected potential to said bit line.

12. The semiconductor memory device according to claim 11, wherein said word line selector includes a driver circuit applying an externally supplied word line potential to word lines enabled in the test mode.

13. The semiconductor device according to claim 11, further comprising:

a bit line equalize circuit for applying the potential provided by said selector to said bit line.

14. The semiconductor memory device according to claim 11, wherein each of said plurality of memory cells includes an access transistor and a capacitor having a first electrode coupled to the bit line via the access transistor and having a second electrode coupled to a cell plate, and said semiconductor memory device further comprises a cell plate potential provider forcing a potential of the cell plate to a cell plate test potential in the test mode.

15. A semiconductor memory device receiving an input signal for access in a normal mode, said device comprising:

a plurality of memory cells;

a plurality of word lines connected to said plurality of memory cells;

a bit line connected to said plurality of memory cells;

a word line selector enabling a first number of said word lines in the normal mode and enabling a second number of said word lines in a test mode, the second number being larger than the first number; and a bit line potential provider forcing a potential of said bit line to a bit line test potential in the test mode, said bit line potential provider selecting one of power supply and grounds potentials in response to the input signal in the test mode.

* * * * *